US010873174B2

(12) United States Patent
Sato et al.

(10) Patent No.: US 10,873,174 B2
(45) Date of Patent: Dec. 22, 2020

(54) LIGHT-EMITTING ELEMENT AND METHOD OF MANUFACTURING THE SAME

(71) Applicant: Sony Corporation, Tokyo (JP)

(72) Inventors: Susumu Sato, Kanagawa (JP); Tatsushi Hamaguchi, Kanagawa (JP); Shoichiro Izumi, Kanagawa (JP); Noriyuki Futagawa, Kanagawa (JP); Masamichi Ito, Miyagi (JP); Jugo Mitomo, Kanagawa (JP); Hiroshi Nakajima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/345,803

(22) PCT Filed: Sep. 1, 2017

(86) PCT No.: PCT/JP2017/031649
§ 371 (c)(1),
(2) Date: Apr. 29, 2019

(87) PCT Pub. No.: WO2018/083877
PCT Pub. Date: May 11, 2018

(65) Prior Publication Data
US 2019/0267774 A1    Aug. 29, 2019

(30) Foreign Application Priority Data

Nov. 2, 2016 (JP) .................... 2016-214754

(51) Int. Cl.
*H01S 5/00* (2006.01)
*H01S 5/183* (2006.01)
(Continued)

(52) U.S. Cl.
CPC .......... *H01S 5/18388* (2013.01); *H01S 5/183* (2013.01); *H01S 5/18327* (2013.01);
(Continued)

(58) Field of Classification Search
CPC .. H01S 5/18361; H01S 5/183; H01S 5/34333; H01S 5/18388; H01S 5/18369;
(Continued)

(56) References Cited

U.S. PATENT DOCUMENTS 6,026,111 A    2/2000  Jiang et al.
6,611,003 B1   8/2003  Hatakoshi et al.
(Continued)

FOREIGN PATENT DOCUMENTS

CN         1369940 A      9/2002
JP      H05-075207 A      3/1993
(Continued)

OTHER PUBLICATIONS

H. Kogelnik and T. Li, "Laser Beams and Resonators," Applied Optics, Oct. 1996, vol. 5, No. 10, p. 1550-1557.
(Continued)

*Primary Examiner* — Kinam Park
(74) *Attorney, Agent, or Firm* — K&L Gates LLP

(57) ABSTRACT

A light-emitting element includes: a laminated structure body 20 which is formed from a GaN-based compound semiconductor and in which a first compound semiconductor layer 21 including a first surface 21*a* and a second surface 21*b* that is opposed to the first surface 21*a*, an active layer 23 that faces the second surface 21*b* of the first compound semiconductor layer 21, and a second compound semiconductor layer 22 including a first surface 22*a* that faces the active layer 23 and a second surface 22*b* that is opposed to the first surface 22*a* are laminated; a first light reflection layer 41 that is provided on the first surface 21*a* side of the first compound semiconductor layer 21; and a second light reflection layer 42 that is provided on the second surface 22*b* side of the second compound semiconductor layer 22. The first light reflection layer 41 includes a (Continued)

concave mirror portion 43, and the second light reflection layer 42 has a flat shape.

18 Claims, 30 Drawing Sheets

(51) Int. Cl.
    *H01S 5/343*      (2006.01)
    *H01S 5/042*      (2006.01)

(52) U.S. Cl.
    CPC ...... *H01S 5/18361* (2013.01); *H01S 5/18369* (2013.01); *H01S 5/18375* (2013.01); *H01S 5/18377* (2013.01); *H01S 5/34333* (2013.01); *H01S 5/0425* (2013.01); *H01S 5/04253* (2019.08); *H01S 2304/02* (2013.01); *H01S 2304/04* (2013.01)

(58) Field of Classification Search
    CPC ............. H01S 5/18375; H01S 5/18377; H01S 5/18327; H01S 5/04253; H01S 5/0425; H01S 2304/02; H01S 2304/04
    See application file for complete search history.

(56) References Cited

U.S. PATENT DOCUMENTS

| | | | |
|---|---|---|---|
| 2002/0105988 A1* | 8/2002 | Park | B82Y 20/00 372/45.01 |
| 2002/0181536 A1 | 12/2002 | Jeon | |
| 2002/0186737 A1 | 12/2002 | Marion | |
| 2003/0209722 A1* | 11/2003 | Hatakoshi | H01L 33/46 257/98 |
| 2004/0113166 A1* | 6/2004 | Tadatomo | H01L 33/22 257/98 |
| 2009/0267048 A1* | 10/2009 | Nakahara | H01L 33/20 |
| 2010/0226399 A1* | 9/2010 | Nishinaka | H05B 45/40 |
| 2015/0043606 A1* | 2/2015 | Hamaguchi | H01S 5/18391 372/50.11 |
| 2015/0380903 A1 | 12/2015 | Nagatomo | |
| 2017/0346258 A1* | 11/2017 | Kuramoto | H01S 5/04254 |
| 2017/0373468 A1* | 12/2017 | Izumi | H01L 21/0243 |
| 2018/0366906 A1* | 12/2018 | Hamaguchi | H01S 5/0421 |

FOREIGN PATENT DOCUMENTS

| | | |
|---|---|---|
| JP | 2000-022277 A | 1/2000 |
| JP | 2002-237653 A | 8/2002 |
| JP | 2002-368333 A | 12/2002 |
| JP | 2002-374045 A | 12/2002 |
| JP | 2005-322660 A | 11/2005 |
| JP | 2007-178597 A | 7/2007 |
| JP | 2016-027648 A | 2/2016 |
| WO | 2017/018017 A1 | 2/2017 |

OTHER PUBLICATIONS

International Search Report and Written Opinion issued in connection with International Patent Application No. PCT/JP2017/031649, dated Nov. 14, 2017. (12 pages).

* cited by examiner

[First light reflection layer]

[First light reflection layer]

LIGHT-EMITTING ELEMENT AND METHOD OF MANUFACTURING THE SAME

CROSS-REFERENCE TO RELATED APPLICATIONS

The present application claims the benefit of International Application No. PCT/JP2017/031649, filed Sep. 1, 2017, which claims priority to Japanese Application No. 2016-214754, filed Nov. 2, 2016, the disclosures of which are incorporated herein by reference.

BACKGROUND

The present disclosure relates to a light-emitting element and a method of manufacturing the same.

In a light-emitting element constituted by a surface light-emitting laser element (VCSEL), typically, when laser light is allowed to resonate between two light reflection layer (distributed Bragg reflector layer (DBR layer)), laser oscillation occurs. In addition, in a surface light-emitting laser element including a laminated structure body in which an n-type compound semiconductor layer, an active layer (light-emitting layer) formed from a compound semiconductor, and a p-type compound semiconductor layer are laminated, typically, a second electrode formed from a transparent conductive material is formed on the p-type compound semiconductor layer, and a second light reflection layer having a laminated structure of an insulating material is formed on the second electrode. In addition, a first electrode and a first light reflection layer having a laminated structure of an insulating material are formed on the n-type compound semiconductor layer (on an exposed surface of a substrate in a case where the n-type compound semiconductor layer is formed on a conductive substrate). Note that, for convenience, an axial line that passes through the center of a resonator that is formed by the two light reflection layers is set as a Z-axis, and a virtual plane orthogonal to the Z-axis is referred to as an XY plane.

However, in a case where the laminated structure body is constituted by a GaAs-based compound semiconductor, a resonator length $L_{OR}$ is approximately 1 µm. On the other hand, in a case where the laminated structure body is constituted by a GaN-based compound semiconductor, typically, the resonator length $L_{OR}$ is as long as several times a wavelength of laser light that is emitted from the surface light-emitting laser element. That is, the resonator length $L_{OR}$ is significantly longer than 1 µm.

SUMMARY

Technical Problem

As described above, when the resonator length $L_{OR}$ is lengthened, a diffraction loss increases differently from the GaAs-based surface light-emitting laser element that employs the resonator length $L_{OR}$ of approximately 1 µm in the related art, and thus laser oscillation is less likely to occur. That is, there is a concern that the surface light-emitting laser element may function as an LED instead of the surface light-emitting laser element. Here, the "diffraction loss" represents a phenomenon in which light is typically broadened due to a diffraction effect, and thus laser light that reciprocates in a resonator is gradually dispersed to the outside of the resonator. In addition, in a case where the laminated structure body is constituted by the GaN-based compound semiconductor, a problem of heat saturation may occur. Here, the "heat saturation" represents a phenomenon in which an optical output is saturated due to self-heat-generation in operation of the surface light-emitting laser element. A material capable of being used in the light reflection layer (for example, a material such as $SiO_2$ and $Ta_2O_5$) has heat conductivity lower than that of the GaN-based compound semiconductor. Accordingly, an increase in the thickness of the GaN-based compound semiconductor layer leads to suppression of the heat saturation. However, when the thickness of the GaN-based compound semiconductor layer increases, the length of the resonator length $L_{OR}$ increases, and thus the above-described problem occurs. A technology of applying a concave mirror function to the light reflection layer is known, for example, in JP-A-2006-114753 or JP-A-2000-022277. However, the Japanese Unexamined Patent Application Publications do not state with respect to a problem to be solved by the light-emitting element of the present disclosure such as a problem of an increase in the diffraction loss due to the increase in the resonator length $L_{OR}$ and a problem of the heat saturation.

Accordingly, an object of the present disclosure is to provide a light-emitting element having a configuration and a structure which are capable of solving a problem of an increase in a diffraction loss due to an increase in a resonator length $L_{OR}$, and a problem of heat saturation, and a method of manufacturing the light-emitting element.

Solution to Problem

To accomplish the above-described object, according to the present disclosure, there is provided a light-emitting element including: a laminated structure body which is formed from a GaN-based compound semiconductor and in which a first compound semiconductor layer including a first surface and a second surface that is opposed to the first surface, an active layer that faces the second surface of the first compound semiconductor layer, and a second compound semiconductor layer including a first surface that faces the active layer and a second surface that is opposed to the first surface are laminated; a first light reflection layer that is provided on the first surface side of the first compound semiconductor layer; and a second light reflection layer that is provided on the second surface side of the second compound semiconductor layer. The first light reflection layer includes a concave mirror portion, and the second light reflection layer has a flat shape.

To accomplish the above-described object, according to the present disclosure, there is provided a method of manufacturing a light-emitting element. The method includes the successive steps of: forming a laminated structure body which is formed from a GaN-based compound semiconductor and in which a first compound semiconductor layer including a first surface and a second surface that is opposed to the first surface, an active layer that faces the second surface of the first compound semiconductor layer, and a second compound semiconductor layer including a first surface that faces the active layer and a second surface that is opposed to the first surface are laminated on a compound semiconductor substrate; forming a second electrode and a second light reflection layer on the second compound semiconductor layer; fixing the second light reflection layer to a support substrate; thinning the compound semiconductor substrate; forming a base portion that is a protruding portion in an exposed surface of the compound semiconductor substrate, or forming the base portion that is the protruding portion on the exposed surface of the compound semiconductor substrate; and forming a first light reflection layer on at least a part of the base portion (specifically, for example, on the exposed surface of the compound semiconductor substrate which includes an upper side of the base portion), and forming a first electrode that is electrically connected to the first compound semiconductor layer. The base portion constitutes a concave mirror portion, and the second light reflection layer has a flat shape.

Advantageous Effects of Invention

In the light-emitting element of the present disclosure, the first light reflection layer includes a concave mirror portion, and thus it is possible to reliably reflect light that is diffracted and broadens with the active layer set as a base point, and is incident to the first light reflection layer toward the active layer, and it is possible to condense the light to the active layer. Accordingly, it is possible to avoid an increase of a diffraction loss, it is possible to reliably perform laser oscillation, and it is possible to avoid a problem of heat saturation due to a long resonator. Note that, effects described in this specification are illustrative only, and additional effects may be exhibited without limitation.

Figure 16:
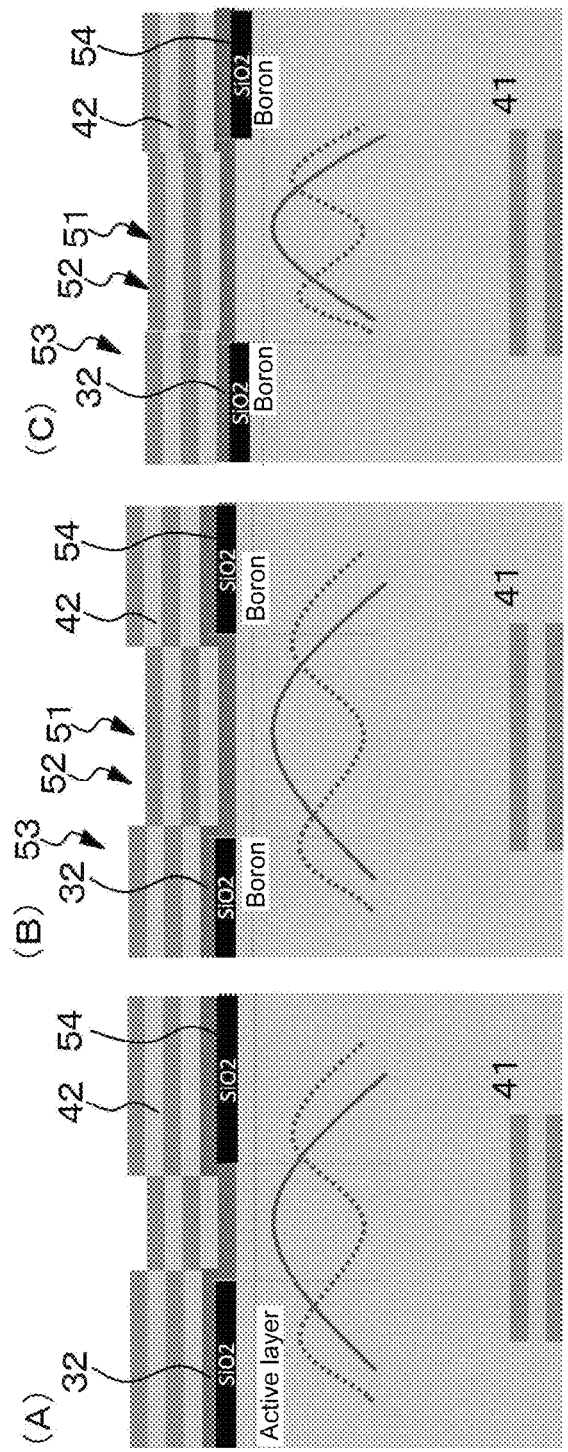

(A), (B), and (C) of FIG. 16 are concept diagrams illustrating light field intensities in a light-emitting element of the related art, the light-emitting element of Example 6, and a light-emitting element of Example 9.

Figure 17:
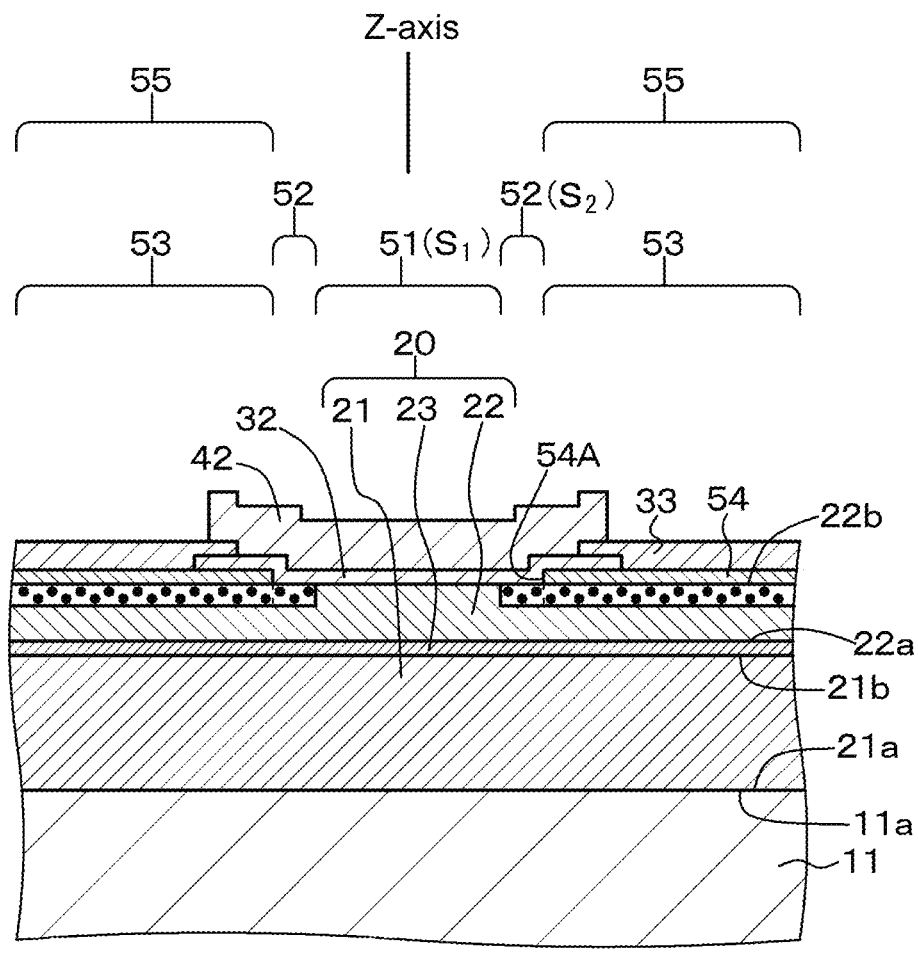

FIG. 17 is a schematic partial end view of a light-emitting element of Example 7.

Figure 18:
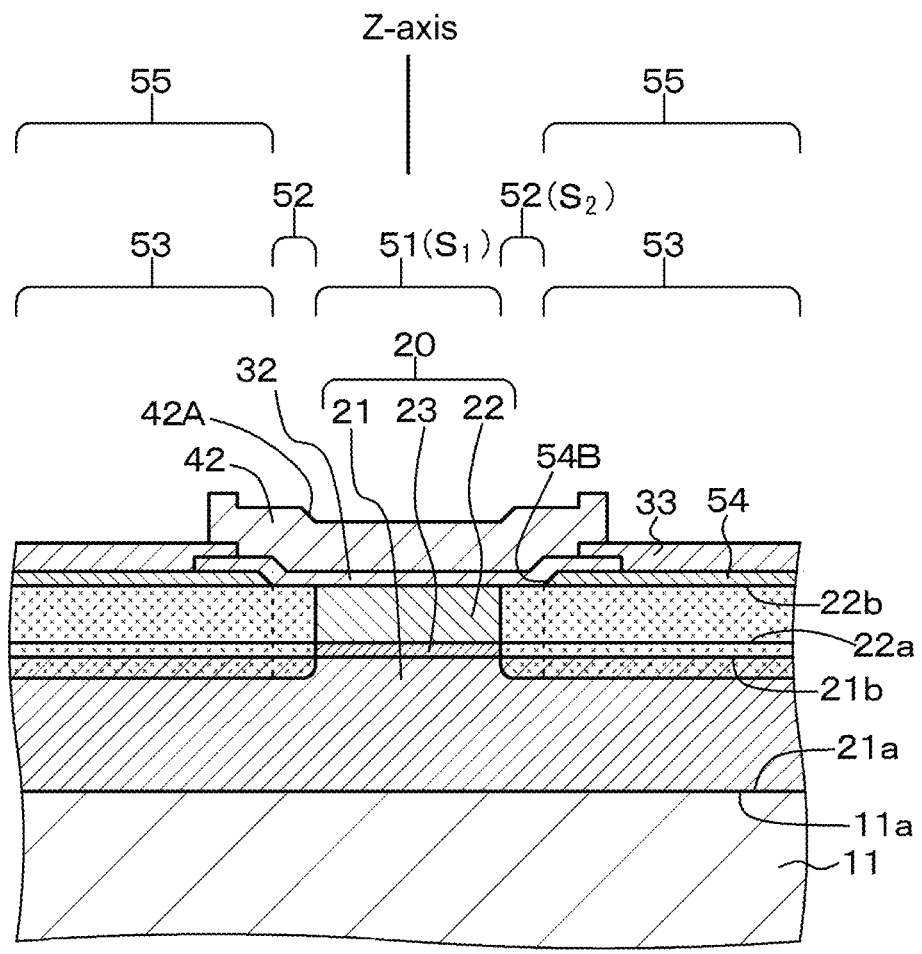

FIG. 18 is a schematic partial end view of a light-emitting element of Example 8.

Figure 19:
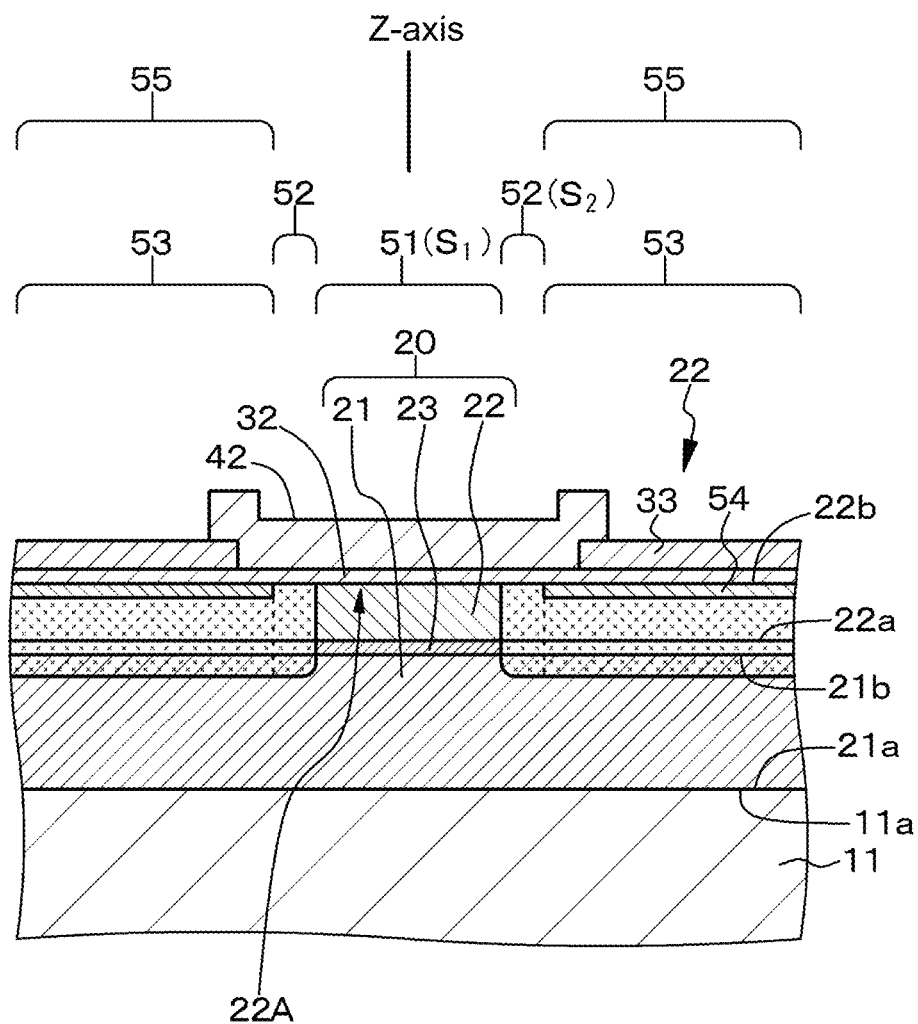

FIG. 19 is a schematic partial end view of the light-emitting element of Example 9.

Figure 20:
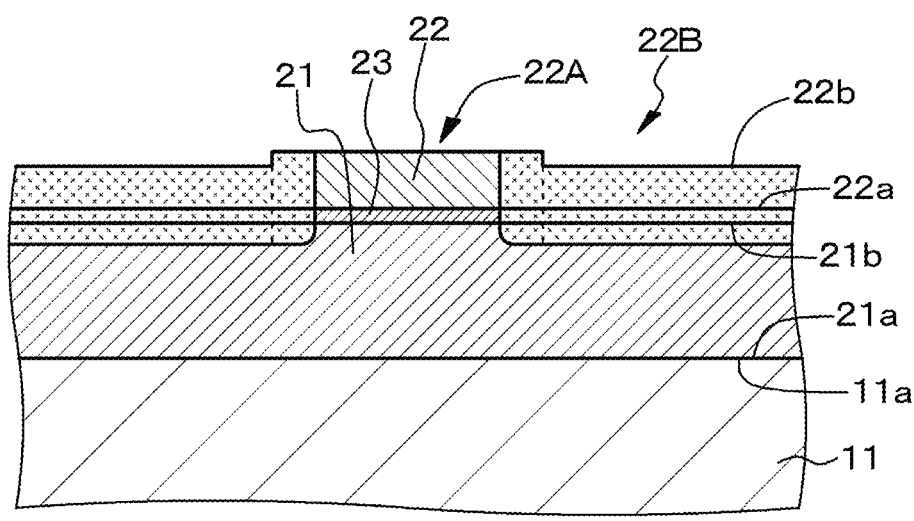

FIG. 20 is a cut-out schematic partial cross-sectional view of a main section of the light-emitting element of Example 9 illustrated in FIG. 19.

Figure 21:
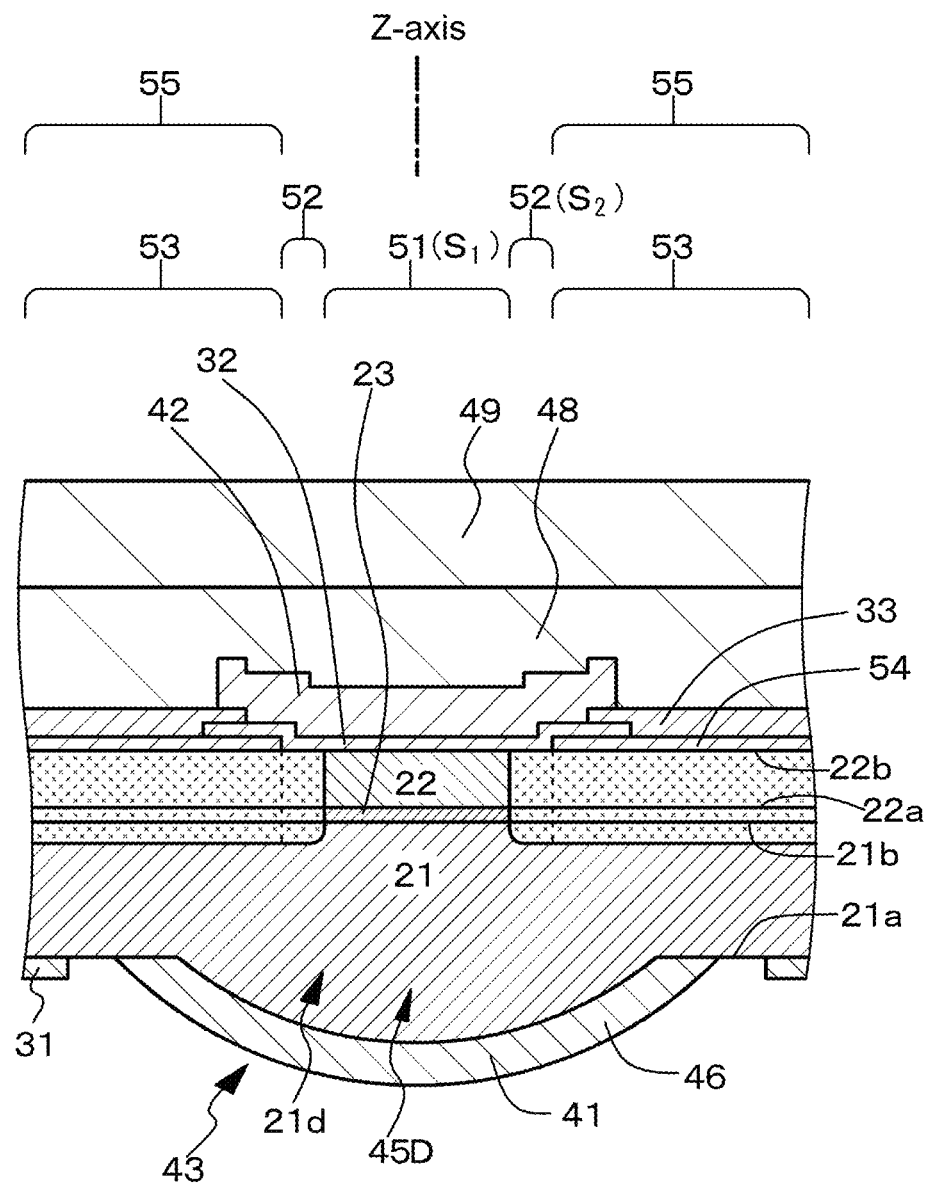

FIG. 21 is a schematic partial end view of a light-emitting element of Example 10.

Figure 22:
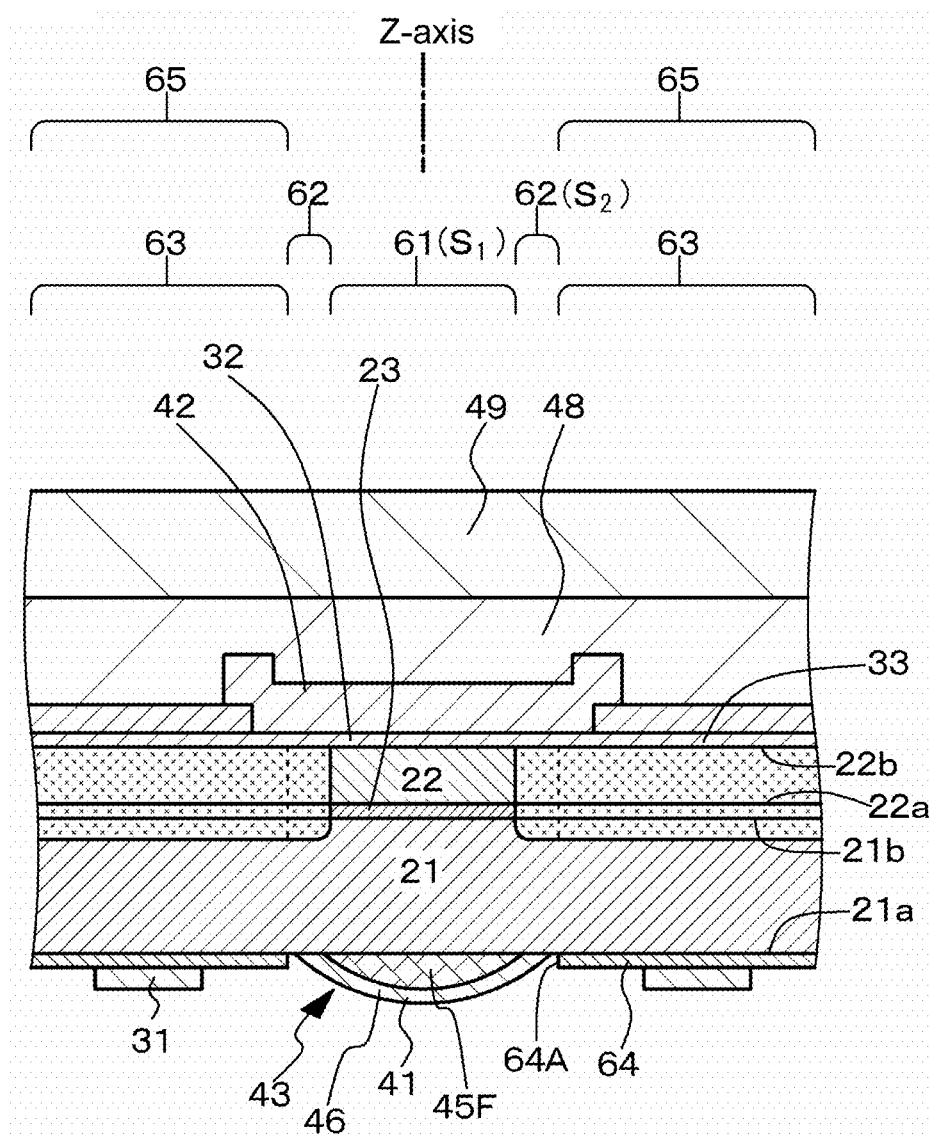

FIG. 22 is a schematic partial end view of a light-emitting element of Example 11.

Figure 23:
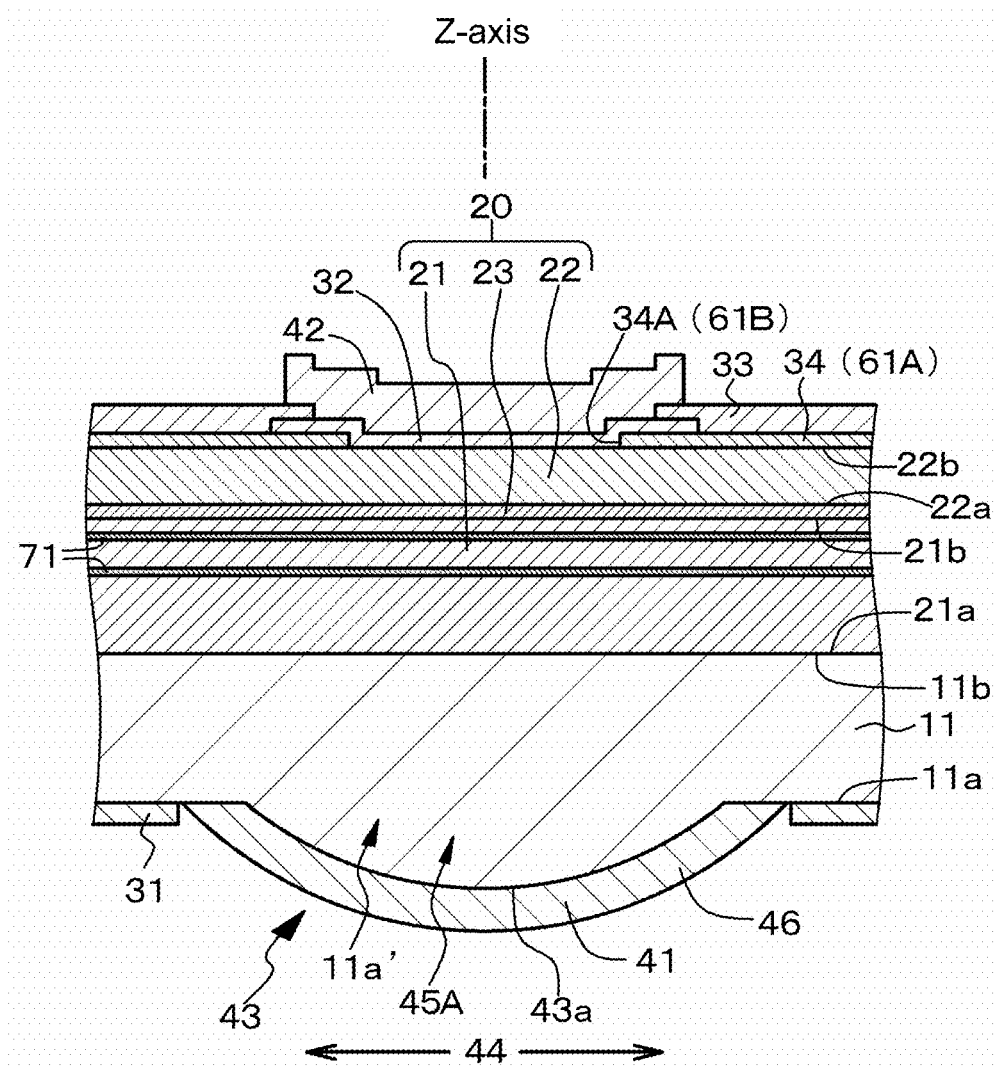

FIG. 23 is a schematic partial cross-sectional view of a light-emitting element of Example 12.

Figure 24:
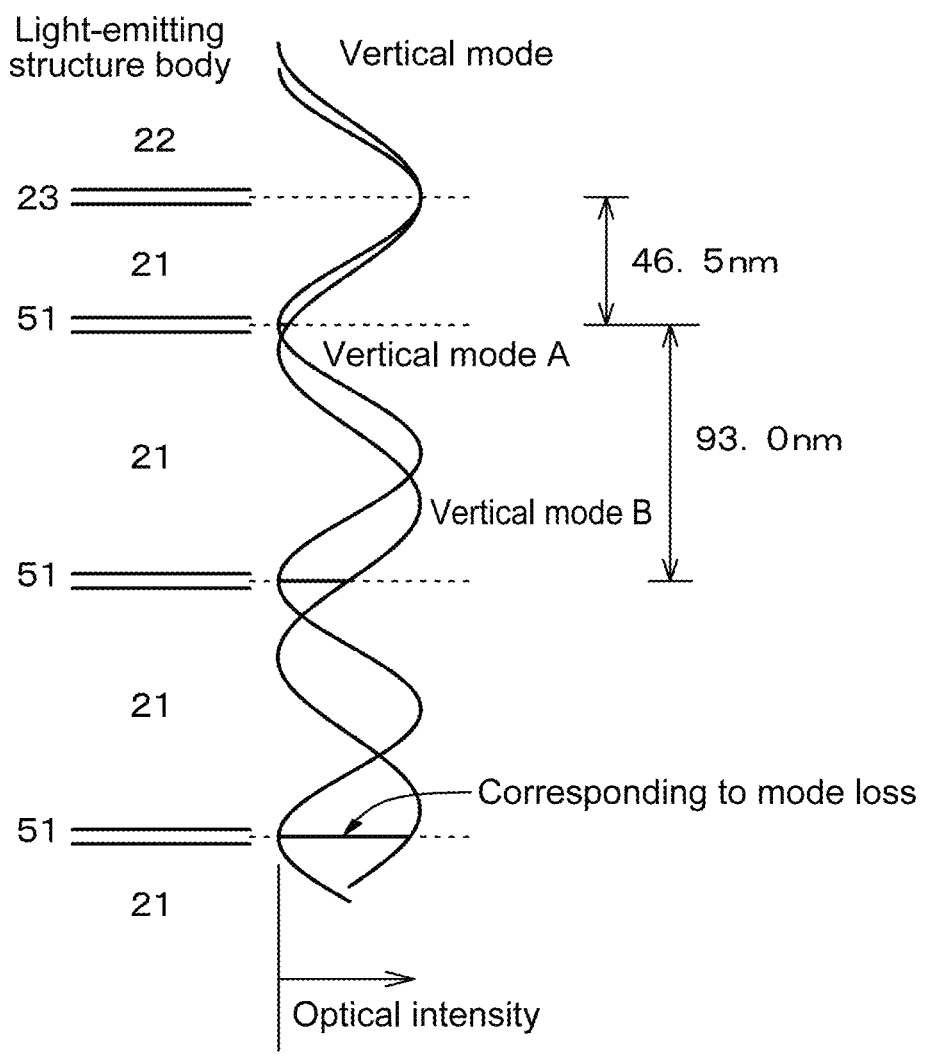

FIG. 24 is a view in which the schematic partial cross-sectional view of the light-emitting element of Example 12, and two vertical modes including a vertical mode A and a vertical mode B overlap each other.

Figure 25:
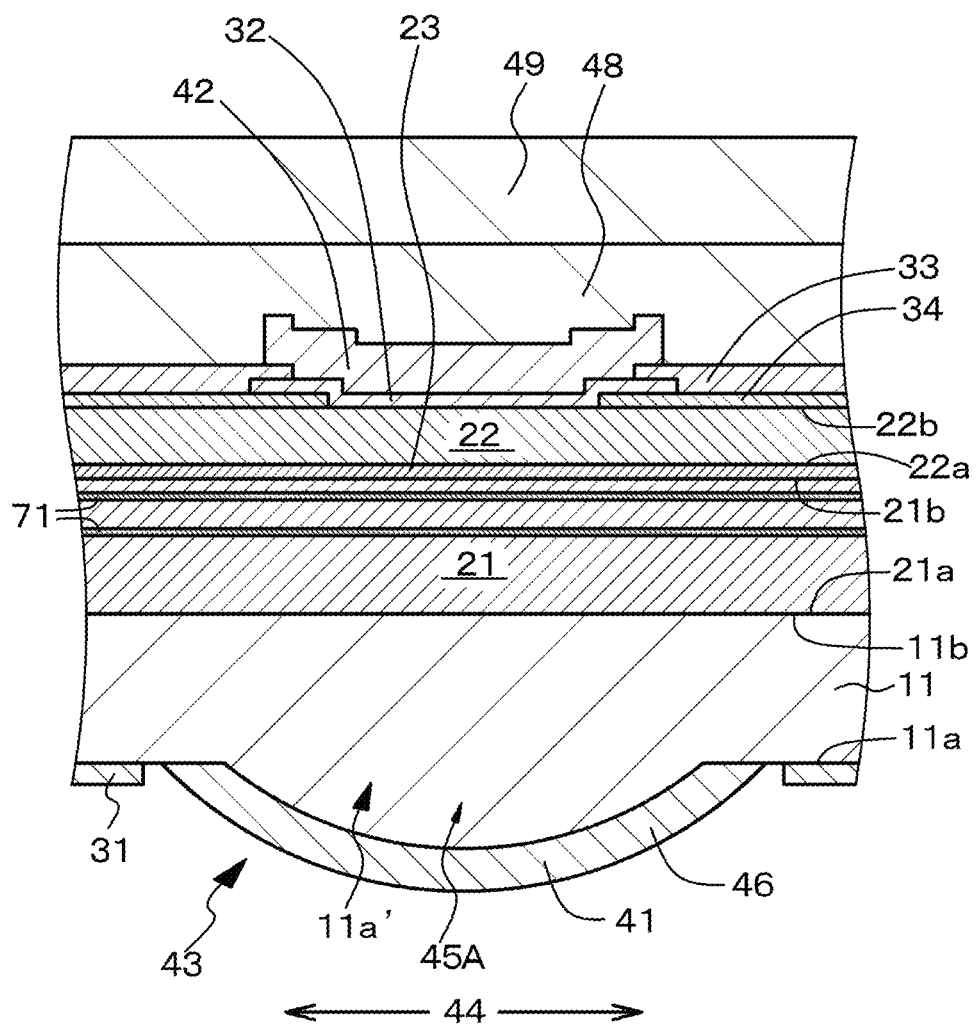

FIG. 25 is a schematic partial cross-sectional view of a light-emitting element of Example 15.

Figure 26:
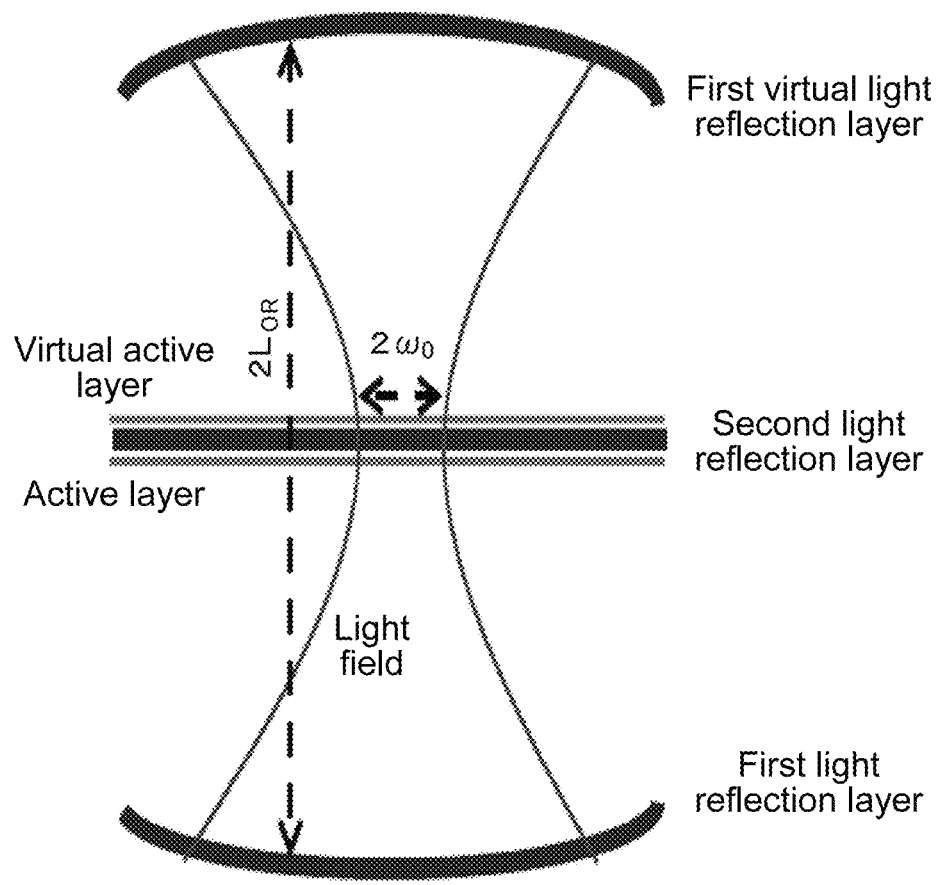

FIG. 26 is a concept diagram when assuming a Fabry-Perot type oscillator is interposed between two concave mirror portions having the same radius of curvature in a light-emitting element of Example 5.

Figure 27:
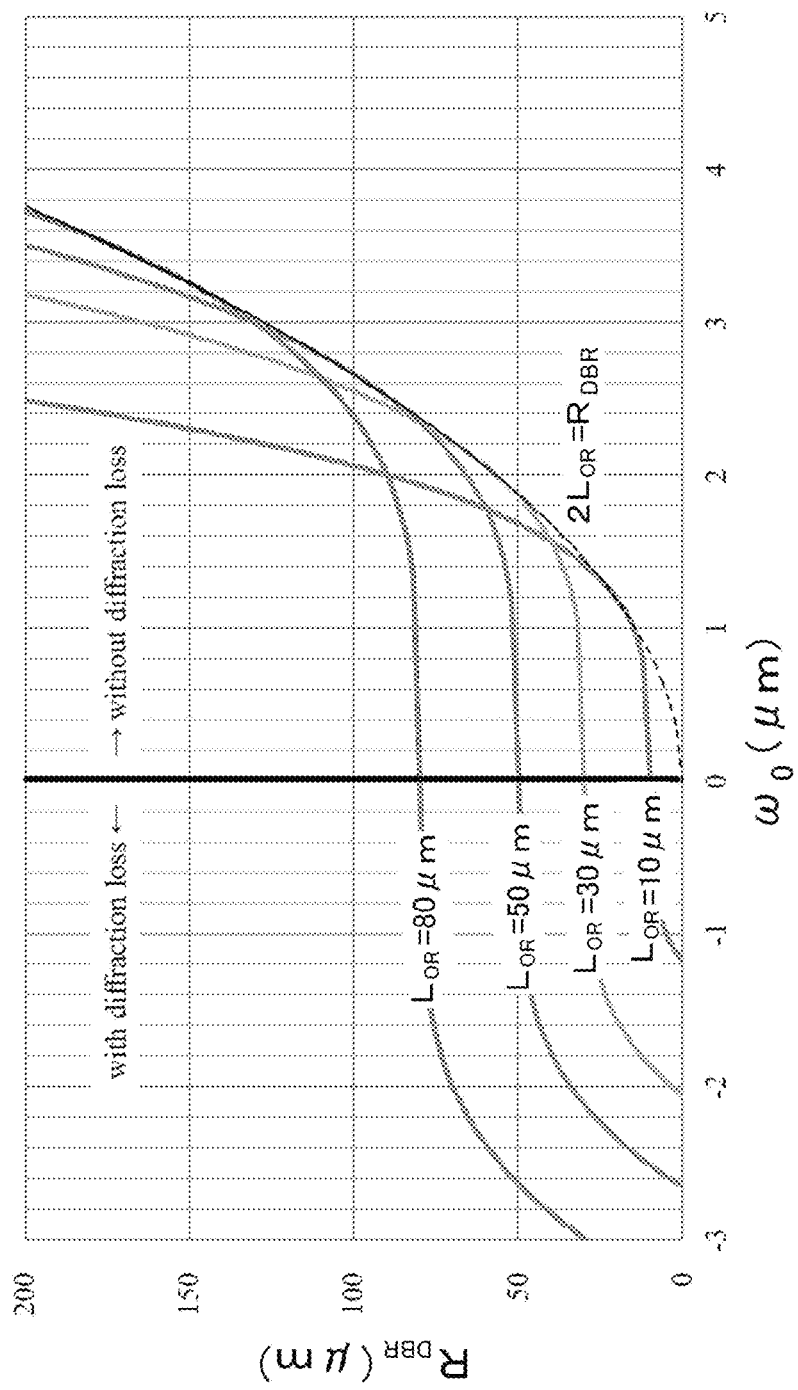

FIG. 27 is a graph showing a relationship between a value of $\omega_0$, a value of a resonator length $L_{OR}$, and a value of a radius of curvature $R_{DBR}$ of a concave mirror portion of a first light reflection layer.

Figure 28:
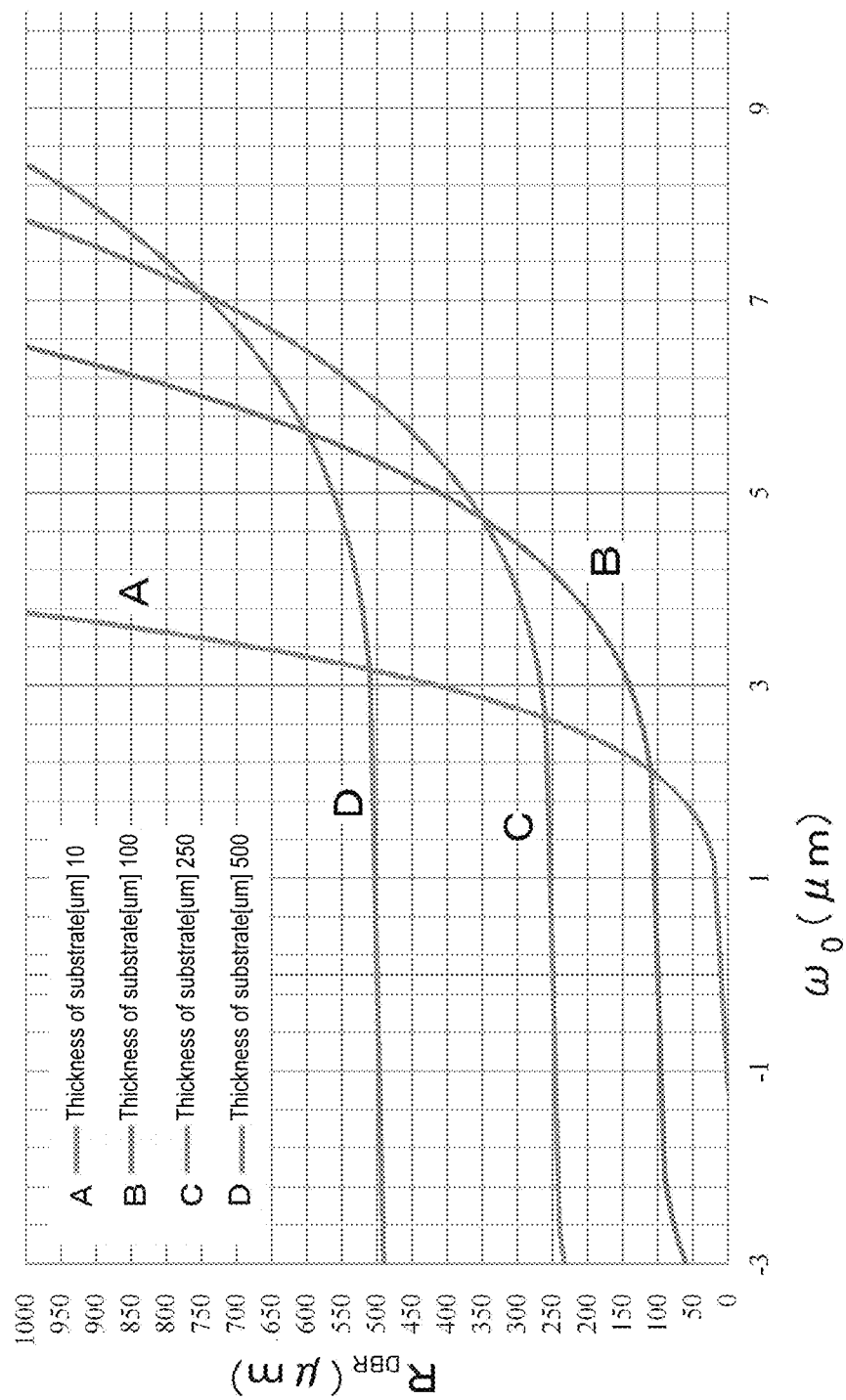

FIG. 28 is a graph showing a relationship between the value of $\omega_0$, the value of the resonator length $L_{OR}$, and the value of the radius of curvature $R_{DBR}$ of the concave mirror portion of the first light reflection layer.

Figure 29A:
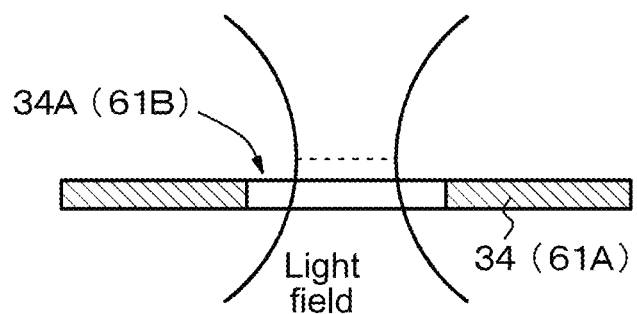
Figure 29B:
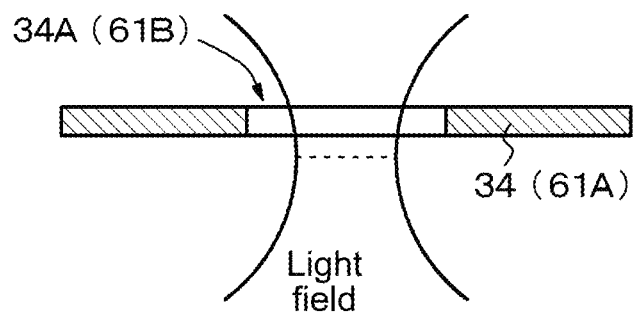

FIG. 29A and FIG. 29B are views schematically illustrating a condensed state of laser light when the value of $\omega_0$ is "positive" and a condensed state of laser light when the value of $\omega_0$ is "negative".

Figure 30A:
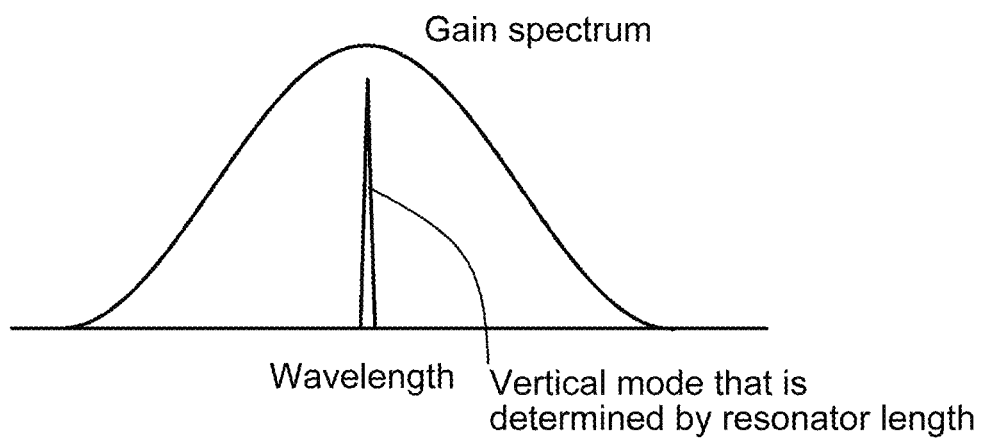
Figure 30B:
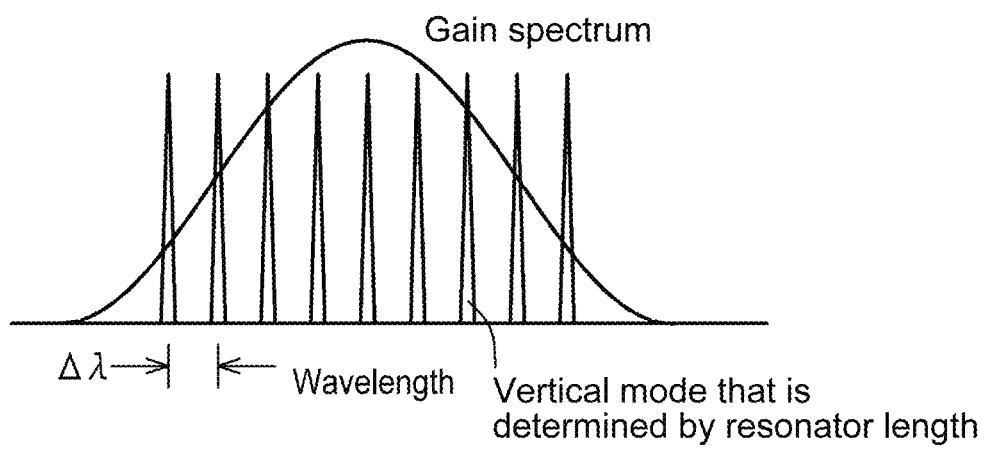

FIG. 30A and FIG. 30B are concept views schematically illustrating a vertical mode that exists in a gain spectrum that is determined by an active layer.

DETAILED DESCRIPTION

Hereinafter, the present disclosure will be described on the basis of Examples with reference to the accompanying drawings, but the present disclosure is not limited by Examples, and various numerical values or materials in Examples are illustrative only. Note that, description will be made in the following order.

1. Description related to an overall configuration of a light-emitting element of the present disclosure and a method of manufacturing the same 2. Example 1 (a light-emitting element of the present disclosure and a method of manufacturing the same, a light-emitting element of Configuration 5-A)

3. Example 2 (a modification of Example 1, a light-emitting element of Configuration 5-B)

4. Example 3 (a modification of Example 1 and Example 2, a light-emitting element of Configuration 6)

5. Example 4 (a modification of Example 3)

6. Example 5 (a modification of Example 1 to Example 4, a light-emitting element of Configuration 1)

7. Example 6 (a modification of Example 1 to Example 5, a light-emitting element of Configuration 2-A)

8. Example 7 (a modification of Example 6, a light-emitting element of Configuration 2-B)

9. Example 8 (a modification of Example 6 and Example 7, a light-emitting element of Configuration 2-C)

10. Example 9 (a modification of Example 6 to Example 8, a light-emitting element of Configuration 2-D)

11. Example 10 (a modification of Example 6 to Example 9)

12. Example 11 (a modification of Example 1 to Example 5, a light-emitting element of Configuration 3-A, a light-emitting element of Configuration 3-B, a light-emitting element of Configuration 3-C, and a light-emitting element of Configuration 3-D)

13. Example 12 (a modification of Example 1 to Example 11, a light-emitting element of Configuration 4)

14. Example 13 (a modification of Example 12)

15. Example 14 (another modification of Example 12)

16. Example 15 (a modification of Example 12 to Example 14)

17. Others

<Description Related to an Overall Configuration of a Light-Emitting Element of the Present Disclosure, and a Method of Manufacturing the Same>

A light-emitting element of the present disclosure, and a light-emitting element that is manufactured by a method of manufacturing the light-emitting element of the present disclosure (hereinafter, the light-emitting elements are collectively referred to as "light-emitting element of the present disclosure and the like"), when a resonator length is set as $L_{OR}$, it is desirable to satisfy a relationship of $1 \times 10^{-5}$ m $L_{OR}$.

In the light-emitting element of the present disclosure and the like which include the desirable aspect, when the first light reflection layer is cut out on a virtual plane including a lamination direction of the laminated structure body, a figure that is drawn by an interface, which faces the laminated structure body, of a part of the concave mirror portion of the first light reflection layer may be a part of a circle or a part of a parabola. Strictly speaking, the figure may not be a part of a circle, or may not be a part of a parabola. That is, a case where the figure is approximately a part of a circle and a case where the figure is approximately a part of a parabola are also included in a case where "the figure is a part of a circle or a part of a parabola". A portion (region) of the first light reflection layer which is a part of a circle or a part of a parabola may be referred to as an "effective region in the concave mirror portion of the first light reflection layer". Note that, the figure that is drawn by the interface, which faces the laminated structure body, of the part of the concave mirror portion may be obtained by measuring a shape of the interface with a measuring device, and by analyzing obtained data on the basis of a least square method.

In the light-emitting element of the present disclosure and the like which include the desirable aspect, a current injection region and a current non-injection region that surrounds the current injection region may be provided in the second compound semiconductor layer, and a shortest distance Do from an area central point of the current injection region to a boundary between the current injection region and the current non-injection region may satisfy the following Expression. Here, the light-emitting element of the configuration is referred to as "light-emitting element of Configuration 1" for convenience. Note that, derivation of the following Expression may be performed with reference to, for example, H. Kogelnik and T. Li, "Laser Beams and Resonators", Applied Optics/Vol. 5, No. 10/October 1966. In addition $\omega_0$ is referred to as a beam waist radius.

$$D_{CI} \geq \omega_0/2 \quad (1\text{-}1)$$

Provided that, $$\omega_0^2 \equiv (\lambda_0/\pi)\{L_{OR}(R_{DBR} - L_{OR})\}^{1/2} \quad (1\text{-}2)$$

where $\lambda_0$: a desired wavelength (oscillation wavelength) of light that is mainly emitted from the light-emitting element $L_{OR}$: a resonator length $R_{DBR}$: a radius of curvature of the concave mirror portion of the first light reflection layer Here, the light-emitting element of the present disclosure and the like include the concave mirror portion only in the first light reflection layer. However, when considering symmetry properties of the second light reflection layer with respect to a flat mirror, a resonator may be extended to a Fabry-Perot type resonator that is interposed between two concave mirror portions having the same radius of curvature (refer to a schematic view of FIG. 26). At this time, a resonator length of a virtual Fabry-Perot type resonator becomes two times a resonator length $L_{OR}$. A graph showing a relationship between a value of $\omega_0$, a value of the resonator length $L_{OR}$, and a value of the radius of curvature $R_{DBR}$ of the concave mirror portion of the first light reflection layer is shown in FIG. 27 and FIG. 28. Note that, a situation in which the value of $\omega_0$ is positive represents that laser light is schematically in a state of FIG. 29A, and a situation in which the value of $\omega_0$ is negative represents that laser light is schematically in a state of FIG. 29B. The state of the laser light may be the state illustrated in FIG. 29A, or may be the state illustrated in FIG. 29B. Note that, when the radius of curvature $R_{DBR}$ becomes smaller than the resonator length $L_{OR}$, the virtual Fabry-Perot type resonator including two concave mirror portions enters a state illustrated in FIG. 29B, and trapping excessively occurs, and thus a diffraction loss occurs. Accordingly, it is desirable to be the state illustrated in FIG. 29A in which the radius of curvature $R_{DBR}$ is greater than the resonator length $L_{OR}$. Note that, when the active layer is disposed to be closer to a flat light reflection layer between the two light reflection layers, specifically, the second light reflection layer, a light field further condenses in the active layer. That is, light field trapping in the active layer is strengthened, and laser oscillation is facilitated. A position of the active layer, that is, a distance from a surface of the second light reflection layer which faces the second compound semiconductor layer to the active layer is not limited, and $\lambda_0/2$ to $10\lambda_0$ can be exemplified.

However, a region in which light reflected by the first light reflection layer condenses is not included in a current injection region that corresponds to a region in which the active layer has an advantage due to current injection, induced emission of light from a carrier is inhibited, and thus there is a concern that laser oscillation is inhibited. When Expressions (1-1) and (1-2) are satisfied, it is possible to guarantee that a region in which light reflected by the first light reflection layer condenses is included in the current injection region, and thus it is possible to reliably accomplish laser oscillation.

In addition, the light-emitting element of Configuration 1 may further include: a mode loss operation portion that is provided on the second surface of the second compound semiconductor layer and constitutes a mode loss operation region that operates on an increase and a decrease of an oscillation mode loss; a second electrode that is formed on the second surface of the second compound semiconductor layer and on the mode loss operation portion; and a first electrode that is electrically connected to the first compound semiconductor layer. The second light reflection layer may be formed on the second electrode, a current injection region, a current non-injection/inner region that surrounds the current injection region, and a current non-injection/outer region that surrounds the current non-injection/inner region may be formed in the laminated structure body, and an orthogonal projection image of the mode loss operation region and an orthogonal projection image of the current non-injection/outer region may overlap each other.

In addition, in the light-emitting element of Configuration 1 including the desirable configuration, a radius $r'_{DBR}$ of an effective region in the concave mirror portion of the first light reflection layer may satisfy a relationship of $\omega_0$ $r'_{DBR} \leq 20 \cdot \omega_0$, and desirably a relationship of $\omega_0 \leq r'_{DBR} \leq 10 \cdot \omega_0$. Alternatively, as the value of $r'_{DBR}$, $r'_{DBR} \leq 1 \times 10^{-4}$ m, and desirably $r'_{DBR}$ $5 \times 10^{-5}$ m can be exemplified. In addition, as a height $h_{DBR}$ of the base portion, $h_{DBR}$ $5 \times 10^{-5}$ m can be exemplified. In addition, in the light-emitting element of Configuration 1 including the desirable configuration, it is possible to employ a configuration satisfying a relationship of $D_{CI} \geq \omega_0$. In addition, in the light-emitting element of Configuration 1 including the desirable configuration, it is possible to employ a configuration satisfying a relationship of $R_{DBR}$ $1 \times 10^{-3}$ m, desirably a relationship of $1 \times 10^{-5}$ m $R_{DBR}$ $1 \times 10^{-3}$ m, and more desirably a relationship of $1 \times 10^{-5}$ m $\leq R_{DBR} \leq 1 \times 10^{-4}$ m.

In addition, the light-emitting element of the present disclosure and the like which include the desirable aspect may further include: a mode loss operation portion that is provided on the second surface of the second compound semiconductor layer and constitutes a mode loss operation region that operates on an increase and a decrease of an oscillation mode loss; a second electrode that is formed on the second surface of the second compound semiconductor layer and on the mode loss operation portion; and a first electrode that is electrically connected to the first compound semiconductor layer. The second light reflection layer may be formed on the second electrode, a current injection region, a current non-injection/inner region that surrounds the current injection region, and a current non-injection/outer region that surrounds the current non-injection/inner region may be formed in the laminated structure body, and an orthogonal projection image of the mode loss operation region and an orthogonal projection image of the current non-injection/outer region may overlap each other. Here, a light-emitting element of this configuration is referred to as "light-emitting element of Configuration 2" for convenience.

In addition, the light-emitting element of the present disclosure and the like which include the desirable aspect may further include: a second electrode that is formed on the second surface of the second compound semiconductor layer; a second light reflection layer that is formed on the second electrode; a mode loss operation portion that is provided on the first surface of the first compound semiconductor layer and constitutes a mode loss operation region that operates on an increase and a decrease of an oscillation mode loss; and a first electrode that is electrically connected to the first compound semiconductor layer. The first light reflection layer may be formed on the first surface of the first compound semiconductor layer and on the mode loss operation portion, a current injection region, a current non-injection/inner region that surrounds the current injection region, and a current non-injection/outer region that surrounds the current non-injection/inner region may be formed in the laminated structure body, and an orthogonal projection image of the mode loss operation region and an orthogonal projection image of the current non-injection/outer region may overlap each other. Here, a light-emitting element of this configuration is referred to as "light-emitting element of Configuration 3" for convenience. Note that, definition of the light-emitting element of Configuration 3 is applicable to the light-emitting element of Configuration 1.

In the light-emitting element of Configuration 2 or the light-emitting element of Configuration 3, the current non-injection region (a general term of the current non-injection/inner region and the current non-injection/outer region) is formed in the laminated structure body. However, specifically, the current non-injection region may be formed in a region of the second compound semiconductor layer on the second electrode side in a thickness direction, may be formed at the entirety of the second compound semiconductor layer, may be formed in the second compound semiconductor layer and the active layer, or may be formed from the second compound semiconductor layer to a part of the first compound semiconductor layer.

The orthogonal projection image of the mode loss operation region and the orthogonal projection image of the current non-injection/outer region overlap each other. However, in a region that is sufficiently spaced away from the current injection region, the orthogonal projection image of the mode loss operation region and the orthogonal projection image of the current non-injection/outer region may not overlap each other.

In the light-emitting element of Configuration 2, the current non-injection/outer region may be located on a downward side of the mode loss operation region.

In the light-emitting element of Configuration 2 including the desirable configuration, when an area of the orthogonal projection image of the current injection region is set as $S_1$, and an area of the orthogonal projection image of the current non-injection/inner region is set as $S_2$, a relationship of $0.01 \leq S_1/(S_1+S_2) \leq 0.7$ may be satisfied. In addition, in the light-emitting element of Configuration 3, when an area of the orthogonal projection image of the current injection region is set as $S_1'$, and an area of the orthogonal projection image of the current non-injection/inner region is set as $S_2'$, a relationship of $0.01 \leq S_1'/(S_1'+S_2') \leq 0.7$ may be satisfied. However, a range of $S_1/(S_1'+S_2)$ and a range of $S_1'/(S_1'+S_1)$ are not limited to the above-described ranges.

In the light-emitting element of Configuration 2 or the light-emitting element of Configuration 3 which includes the desirable configuration, the current non-injection/inner region and the current non-injection/outer region may be formed by ion implantation into the laminated structure body. A light-emitting element of this configuration is referred to as "light-emitting element of Configuration 2-A", or "light-emitting element of Configuration 3-A" for convenience. In addition, in this case, ion species may include at least one kind of ion selected from the group consisting of boron, proton, phosphorus, arsenic, carbon, nitrogen, fluorine, oxygen, germanium, and silicon (that is, one kind of ion, or two or more kinds of ions).

In addition, in the light-emitting element of Configuration 2 or the light-emitting element of Configuration 3 which includes the desirable configuration, the current non-injection/inner region and the current non-injection/outer region may be formed by plasma irradiation with respect to the second surface of the second compound semiconductor layer, an ashing treatment with respect to the second surface of the second compound semiconductor layer, or a reactive ion etching treatment with respect to the second surface of the second compound semiconductor layer. A light-emitting element of this configuration is referred to as "light-emitting element of Configuration 2-B" or "light-emitting element of Configuration 3-B" for convenience. In the treatment, the current non-injection/inner region and the current non-injection/outer region are exposed to plasma particles, and thus conductivity of the second compound semiconductor layer deteriorates, and the current non-injection/inner region and the current non-injection/outer region enter a high resistance state. That is, it is possible to employ a configuration in which the current non-injection/inner region and the current non-injection/outer region are formed by exposure of the second surface of the second compound semiconductor layer to the plasma particles. Specific examples of the plasma particles include argon, oxygen, nitrogen, and the like.

In addition, in the light-emitting element of Configuration 2 or the light-emitting element of Configuration 3 which includes the desirable configuration, the second light reflection layer may include a region that reflects or scatters light from the first light reflection layer toward an outer side of a resonator structure including the first light reflection layer and the second light reflection layer. A light-emitting element of this configuration is referred to as "light-emitting element of Configuration 2-C" or "light-emitting element of Configuration 3-C" for convenience. Specifically, a region of the second light reflection layer which is located on an upward side of a lateral wall of the mode loss operation portion (lateral wall of an opening that is provided in the mode loss operation portion) has a forward taper-shaped inclination, or includes a region that is curved in a convex shape toward the first light reflection layer. In addition, in the light-emitting element of Configuration 2 or the light-emitting element of Configuration 3 which includes the desirable aspect, the first light reflection layer may include a region that reflects or scatters light from the second light reflection layer toward an outer side of a resonator structure including the first light reflection layer and the second light reflection layer. Specifically, in a partial region of the first light reflection layer, a forward taper-shaped inclination may be formed or a curved portion having a convex shape toward the second light reflection layer. In addition, a region of the first light reflection layer which is located on an upward side of the lateral wall of the mode loss operation portion (lateral wall of the opening that is provided in the mode loss operation portion) may have a forward taper-shaped inclination, or may include a region that is curved in a convex shape toward the second light reflection layer. In addition, it is possible to employ a configuration in which light is scattered at a boundary (lateral wall edge portion) between a top surface of the mode loss operation portion and the lateral wall of the opening provided in the mode loss operation portion to scatter light toward an outer side of the resonator structure including the first light reflection layer and the second light reflection layer.

In the light-emitting element of Configuration 2-A, the light-emitting element of Configuration 2-B, or the light-emitting element of Configuration 2-C, when an optical distance from an active layer in the current injection region to the second surface of the second compound semiconductor layer is set as $L_2$, and an optical distance from an active layer in the mode loss operation region to a top surface of the mode loss operation portion is set as $L_0$, a relationship of $L_0 > L_2$ may be satisfied. In addition, in the light-emitting element of Configuration 3-A, the light-emitting element of Configuration 3-B, or the light-emitting element of Configuration 3-C, when an optical distance from an active layer in the current injection region to the first surface of the first compound semiconductor layer is set as $L_1'$, and an optical distance from an active layer in the mode loss operation region to a top surface of the mode loss operation portion is set as $L_0'$, a relationship of $L_0' > L_1'$ may be satisfied. In addition, in the light-emitting element of Configuration 2-A, the light-emitting element of Configuration 3-A, the light-emitting element of Configuration 2-B, the light-emitting element of Configuration 3-B, the light-emitting element of Configuration 2-C, or the light-emitting element of Configuration 3-C which includes the configuration, light having a higher-order mode that is generated may be made to be dispersed toward the outer side of the resonator structure including the first light reflection layer and the second light reflection layer due to the mode loss operation region, and an oscillation mode loss may increase. That is, light field intensities of a basic mode and a higher-order mode which occur decrease in an orthogonal projection image of the mode loss operation region due to existence of the mode loss operation region that operates on an increase and a decrease of the oscillation mode loss, as it is spaced away from the Z-axis. However, a mode loss of the higher-order mode is greater than the decrease of the light field intensity in the basic mode, and thus it is possible to further stabilize the basic mode, and it is possible to further suppress the mode loss in comparison to a case where the current non-injection/inner region is not present. Accordingly, it is possible to realize a decrease of a threshold current.

In addition, in the light-emitting element of Configuration 2-A, the light-emitting element of Configuration 3-A, the light-emitting element of Configuration 2-B, the light-emitting element of Configuration 3-B, the light-emitting element of Configuration 2-C, or the light-emitting element of Configuration 3-C, the mode loss operation portion may be formed from a dielectric material, a metal material, or an alloy material. Examples of the dielectric material include $SiO_X$, $SiN_X$, $AlN_X$, $AlO_X$, $TaO_X$, and $ZrO_X$, and examples of the metal material or the alloy material include titanium, gold, platinum, or alloys thereof, but there is no limitation to the materials. Light is absorbed by the mode loss operation portion formed from the materials, and thus it is possible to increase a mode loss. Alternatively, although light is not directly absorbed, a phase is disturbed, and thus it is possible to control the mode loss. In this case, the mode loss operation portion may be formed from the dielectric material, and the optical thickness to of the mode loss operation portion may be a value that deviates from an integral multiple of ¼ of a wavelength $\lambda_0$ of light that is generated in the light-emitting element. That is, when a phase of light that circulates the inside of a resonator and forms a standing wave is disturbed in the mode loss operation portion, it is possible to disrupt the standing wave, and it is possible to provide a mode loss corresponding thereto. In addition, the mode loss operation portion may be formed from the dielectric material, and the optical thickness to of the mode loss operation portion (a refractive index is set as $n_0$) may be an integral multiple of ¼ of the wavelength $\lambda_0$ of light that is generated in the light-emitting element. That is, the optical thickness to of the mode loss operation portion may be set to a thickness at which a phase of light generated in the light-emitting element is not disturbed and thus a standing wave is not disrupted. However, strictly speaking, it is not necessary to be an integral multiple of ¼, and a relationship of $(\lambda_0/4n_0) \times m - (\lambda_0/8n_0)$ to $(\lambda_0/4n_0) \times 2m + (\lambda_0/8n_0)$ may be satisfied. In addition, when the mode loss operation portion is formed from the dielectric material, the metal material, or the alloy material, a phase of light that is transmitted through the mode loss operation portion may not be disturbed by the mode loss operation portion or the light may be absorbed thereto. In addition, when employing the above-described configurations, it is possible to perform control of oscillation mode loss with higher degree of freedom, and it is possible to further raise the degree of freedom of design of the light-emitting element.

In addition, in the light-emitting element of Configuration 2 including the desirable configuration, a convex portion may be formed on the second surface side of the second compound semiconductor layer, and the mode loss operation portion may be formed on a region of the second surface of the second compound semiconductor layer which surrounds the convex portion. A light-emitting element of the configuration is referred to as "light-emitting element of Configuration 2-D" for convenience. The convex portion occupies the current injection region and the current non-injection/inner region. In addition, in this case, in the when an optical distance from an active layer in the current injection region to the second surface of the second compound semiconductor layer is set as $L_2$, and an optical distance from an active layer in the mode loss operation region to a top surface of the mode loss operation portion is set as $L_0$, a relationship of $L_0 < L_2$ may be satisfied. In addition, in this case, light having a higher-order mode that is generated can be trapped into the current injection region and the current non-injection/inner region due to the mode loss operation region, and thus it is possible to decrease the oscillation mode loss. That is, light field intensities of the basic mode and the higher-order mode which occur increase in an orthogonal projection image of the current injection region and the current non-injection/inner region due to existence of the mode loss operation region that operates on an increase and a decrease of the oscillation mode loss. In addition, in this case, the mode loss operation portion may be formed from a dielectric material, a metal material, or an alloy material. Here, as the dielectric material, the metal material, or the alloy material, the above-described various kinds of materials can be exemplified.

In addition, in the light-emitting element of Configuration 3 including the desirable configuration, a convex portion may be formed on the first surface side of the first compound semiconductor layer, and the mode loss operation portion may be formed on a region of the first surface of the first compound semiconductor layer which surrounds the convex portion, or the mode loss operation portion is constituted by a region of the first compound semiconductor layer which surrounds the convex portion. The light-emitting element of the configuration is referred to as "light-emitting element of Configuration 3-D" for convenience. The convex portion matches an orthogonal projection image of the current injection region and the current non-injection/inner region. In addition, in this case, when an optical distance from an active layer in the current injection region to the first surface of the first compound semiconductor layer is set as $L_1'$, and an optical distance from an active layer in the mode loss operation region to a top surface of the mode loss operation portion is set as $L_0'$, a relationship of $L_0' < L_1'$ may be satisfied. In addition, in this case, light having a higher-order mode that is generated may be trapped into the current injection region and the current non-injection region due to the mode loss operation region, and thus the oscillation mode loss may decrease. In addition, in this case, the mode loss operation portion may be formed from a dielectric material, a metal material, or an alloy material. Here, as the dielectric material, the metal material, or the alloy material, the above-described various kinds of materials can be exemplified.

In addition, in the light-emitting element of the present disclosure and the like which include the desirable aspect and the configuration (including the light-emitting element of Configuration 1 to the light-emitting element of Configuration 3), at least two layers of light absorption material layers may be formed in the laminated structure body including the second electrode to be parallel to a virtual plane that is occupied by the active layer. Here, the light-emitting element of the configuration is referred to as "light-emitting element of Configuration 4" for convenience.

In the light-emitting element of Configuration 4, it is desirable that at least four layers of the light absorption material layers are formed.

In the light-emitting element of Configuration 4 including the desirable configuration, when an oscillation wavelength (a wavelength of light that is mainly emitted from the light-emitting element, and a desired oscillation wavelength) is set as $\lambda_0$, an equivalent refractive index of the entirety of two layers of the light absorption material layers, and a portion of the laminated structure body which is located between the light absorption material layers is set as $n_{eq}$, and a distance between the light absorption material layers is set as $L_{Abs}$, it is desirable that a relationship of $0.9 \times \{(m \cdot \lambda_0)/(2 \cdot n_{eq})\} \le L_{Abs} \le 1.1 \times \{(m \cdot \lambda_0)/(2 \cdot n_{eq})\}$ is satisfied. Here, m is 1 or an arbitrary integer of 2 or greater (including 1). When the thickness of each of the two layers of light absorption material layers, and a layer that constitutes the portion of the laminated structure body which is located between the light absorption material layers is set as $t_i$, and a refractive index of each of the layers is set as $n_i$, the equivalent refractive index $n_{eq}$ is expressed by $n_{eq} = \Sigma(t_i \times n_i)/\Sigma(t_i)$. Provided that, i=1, 2, 3 . . . , I, "I" represents a total number of the two layers of the light absorption material layers, and the layer that constitutes the portion of the laminated structure body between the light absorption material layers, and "Σ" represents that a total sum from i=1 to i=I is taken. After observing constituent materials on a cross-section of a light-emitting element through electron microscope observation and the like, the equivalent refractive index $n_{eq}$ may be calculated on the basis of known refractive indexes of the respective constituent materials and a thickness that is obtained through the observation. In a case where m is 1, a distance between adjacent light absorption material layers satisfies a relationship of $0.9 \times \{\lambda_0/(2 \cdot n_{eq})\} \le L_{Abs} \le 1.1 \times \{\lambda_0/(2 \cdot n_{eq})\}$ in all of a plurality of the light absorption material layers. In addition, when m is an arbitrary integer of 2 or greater (including 1), as an example, when m=1, 2, in partial light absorption material layers, a distance between adjacent light absorption material layers satisfies a relationship of $0.9 \times \{\lambda_0/(2 \cdot n_{eq})\} \le L_{Abs} \le 1.1 \times \{\lambda_0/(2 \cdot n_{eq})\}$, and in remaining light absorption material layers, a distance between adjacent light absorption material layers satisfies a relationship of $0.9 \times \{(2 \cdot \lambda_0)/(2 \cdot n_{eq})\} \le L_{Abs} \le 1.1 \times \{(2 \cdot \lambda_0)/(2 \cdot n_{eq})\}$. Broadly, in partial light absorption material layers, a distance between adjacent light absorption material layers satisfies $0.9 \times \{\lambda_0/(2 \cdot n_{eq})\} \le L_{Abs} \le 1.1 \times \{\lambda_0/(2 \cdot n_{eq})\}$, and in remaining light absorption material layers, a distance between adjacent light absorption material layers satisfies a relationship of $0.9 \times \{(m' \cdot \lambda_0)/(2 \cdot n_{eq})\} \le L_{Abs} \le 1.1 \times \{(m' \cdot \lambda_0)/(2 \cdot n_{eq})\}$. Here, m' is an arbitrary integer of 2 or greater. In addition, the distance between the adjacent light absorption material layers is a distance between the centers of the adjacent light absorption material layers. That is, actually, the distance is a distance between the centers of the light absorption material layers when being cut off on a virtual plane along a thickness direction of the active layer.

In addition, in the light-emitting element of Configuration 4 including the various desirable configurations, it is desirable that the thickness of the light absorption material layers is $\lambda_0/(4 \cdot n_{eq})$ or less. As the lower limit value of the thickness of the light absorption material layer, 1 nm can be exemplified.

In addition, in the light-emitting element of Configuration 4 including the various desirable configurations, it is possible to employ a configuration in which the light absorption material layers are located at a portion with the minimum amplitude that occurs in a standing wave of light which is formed inside the laminated structure body.

In addition, in the light-emitting element of Configuration 4 including the various desirable configurations, it is possible to employ a configuration in which the active layer is located at a portion with the maximum amplitude that occurs in a standing wave of light which is formed inside the laminated structure body.

In addition, in the light-emitting element of Configuration 4 including the various desirable configurations, it is possible to employ a configuration in which the light absorption material layers have a light absorption coefficient that is two or more times a light absorption coefficient of a compound semiconductor that constitutes the laminated structure body. Here, after observing constituent materials on a cross-section of the light-emitting element through electron microscope observation and the like, the light absorption coefficient of the light absorption material layer or the light absorption coefficient of a compound semiconductor that constitutes the laminated structure body can be obtained through analogy from known evaluation results observed with respect to the respective constituent materials.

In addition, in the light-emitting element of Configuration 4 including the various desirable configurations, the light absorption material layers may be constituted by at least one material selected from the group consisting of a compound semiconductor material having a bandgap narrower than a bandgap of a compound semiconductor that constitutes the laminated structure body, a compound semiconductor material doped with impurities, a transparent conductive material, and a light reflection layer constituent material having light absorption characteristics. Here, as the compound semiconductor material having a bandgap narrower than a bandgap of a compound semiconductor that constitutes the laminated structure body, for example, in a case where the compound semiconductor that constitutes the laminated structure body is set as GaN, InGaN can be exemplified. As the compound semiconductor material doped with impurities, Si-doped n-GaN, and B-doped n-GaN can be exemplified. As the transparent conductive material, a transparent conductive material that constitutes an electrode to be described later can be exemplified, As the light reflection layer constituent material having light absorption characteristics, a material that constitutes the following light reflection layer (for example, $SiO_X$, $SiN_X$, $TaO_X$, and the like) can be exemplified. All of the light absorption material layers can be constituted by one kind of material in the above-described materials. In addition, each of the light absorption material layers may be constituted by various materials selected from the materials. However, it is desirable that a light absorption material layer of one layer is constituted by one kind of material from the viewpoint of simplification of formation of the light absorption material layers. The light absorption material layers may be formed in the first compound semiconductor layer, may be formed in the second compound semiconductor layer, may be formed in the first light reflection layer, may be formed in the second light reflection layer, or an arbitrary combination thereof may be employed. In addition, the light absorption material layer may also function as an electrode formed from a transparent conductive material to be described later.

In addition, in the light-emitting element of the present disclosure and the like which include the desired aspect and the configuration (including the light-emitting element of Configuration 1 to the light-emitting element of Configuration 4), a compound semiconductor substrate may be disposed between the first surface of the first compound semiconductor layer and the first light reflection layer. Here, the light-emitting element of the configuration is referred to as "light-emitting element of Configuration 5" for convenience. In this case, the compound semiconductor substrate may be constituted by a GaN substrate. Provided that, as the thickness of the compound semiconductor substrate, $5 \times 10^{-5}$ m to $1 \times 10^{-4}$ m can be exemplified, but there is no limitation to this value. In addition, in the light-emitting element of Configuration 5 including the configuration, the concave mirror portion of the first light reflection layer may include a base portion that is a protruding portion of the compound semiconductor substrate, and a multi-layer light reflection film that is formed on at least a partial surface of the base portion. Here, a light-emitting element of this configuration is referred to as "light-emitting element of Configuration 5-A" for convenience. In addition, the concave mirror portion of the first light reflection layer may include a base portion that is formed on the compound semiconductor substrate, and a multi-layer light reflection film that is formed on at least a partial surface of the base portion. Here, a light-emitting element of this configuration is referred to as "light-emitting element of Configuration 5-B" for convenience. For example, a material that constitutes the base portion in the light-emitting element of Configuration 5-A is a GaN substrate. As the GaN substrate, any one of a polarity substrate, a reversed-polarity substrate, or a non-polarity substrate may be used. Furthermore, examples of the material that constitutes the base portion in the light-emitting element of Configuration 5-B include a transparent dielectric material such as $TiO_2$, $Ta_2O_5$, and $SiO_2$, a silicone-based resin, and an epoxy-based resin.

In addition, in the light-emitting element of the present disclosure and the like which include the desired aspect and the configuration (including the light-emitting element of Configuration 1 to the light-emitting element of Configuration 4), the first light reflection layer may be formed on the first surface of the first compound semiconductor layer. Here, a light-emitting element of this configuration is referred to as "light-emitting element of Configuration 6" for convenience.

In addition, in the light-emitting element of the present disclosure and the like which include the desired aspect and the configuration (including the light-emitting element of Configuration 1 to the light-emitting element of Configuration 6), a value of heat conductivity of the laminated structure body may be higher than a value of heat conductivity of the first light reflection layer. Typically, a value of heat conductivity of a dielectric material that constitutes the first light reflection layer is approximately 10 watts/(m·K) or less. On the other hand, a value of heat conductivity of a GaN-based compound semiconductor that constitutes the laminated structure body is approximately 50 watts/(m·K) to 100 watts/(m·K).

In addition, in the light-emitting element of the present disclosure and the like which include the desired aspect and the configuration (including the light-emitting element of Configuration 1 to the light-emitting element of Configuration 6), when a radius of curvature of the concave mirror portion (specifically, an effective region of a radius $r'_{DBR}$ in the concave mirror portion of the first light reflection layer) of the light-emitting element is set as $R_{DBR}$, a relationship of $R_{DBR}$ 1×10$^{-3}$ m, desirably a relationship of 1×10$^{-5}$ m $R_{DBR}$ 1×10$^{-3}$ m, and more desirably a relationship of 1×10$^{-5}$ m≤$R_{DBR}$≤1×10$^{-4}$ m is satisfied. In addition, a relationship of 1×10$^{-5}$ m $L_{OR}$ is satisfied, but it is desirable to satisfy a relationship of 1×10$^{-5}$ m≤$L_{OR}$≤5×10$^{-4}$, and more desirably a relationship of 1×10$^{-5}$ m≤$L_{OR}$≤1×10$^{-4}$.

In addition, in the light-emitting element of the present disclosure and the like which include the desired aspect and the configuration (including the light-emitting element of Configuration 1 to the light-emitting element of Configuration 6), a convex portion may be formed at the periphery of the first light reflection layer, and the first light reflection layer may do not protrude from the convex portion. According to this, it is possible to protect the first light reflection layer. That is, the first light reflection layer is provided in a state of being receded in comparison to the convex portion. Accordingly, for example, even when any object comes into contact with the convex portion, the object does not come into contact with the first light reflection layer, and thus it is possible to reliably protect the first light reflection layer.

In addition, in the light-emitting element of the present disclosure and the like which include the desired aspect and the configuration (including the light-emitting element of Configuration 1 to the light-emitting element of Configuration 6), in materials which constitute various compound semiconductor layers (including the compound semiconductor substrate) located between the active layer and the first light reflection layer, it is desirable that modulation of a refractive index does not occur by 10% or greater (a refractive index difference by 10% or greater does not occur on the basis of an average refractive index of the laminated structure body). According to this, it is possible to suppress occurrence of disturbance of a light field inside a resonator.

According to the light-emitting element of the present disclosure and the like which include the desirable aspect and the configuration, it is possible to construct a surface light-emitting laser element (a vertical resonator laser, VCSEL) that emits laser light through the first light reflection layer, or it is possible to construct a surface light-emitting laser element that emits laser light through the second light reflection layer. Provided that, a substrate for manufacturing a light-emitting element may be removed in some cases.

In the light-emitting element of the present disclosure and the like, specifically, the laminated structure body may be constituted by an AlInGaN-based compound semiconductor. Here, more specific examples of the AlInGaN-based compound semiconductor include GaN, AlGaN, InGaN, and AlInGaN. In addition, a boron (B) atom, a thallium (Tl) atom, an arsenic (As) atom, a phosphorus (P) atom, and an antimony (Sb) atom may be contained in the compound semiconductor in correspondence with desire. It is desirable that the active layer has a quantum well structure. Specifically, the active layer may have a single quantum well structure (SQW structure) or a multiple quantum well structure (MQW structure). The active layer having the quantum well structure has a structure in which at least one layer of a well layer or a barrier layer is laminated, and as a combination of (a compound semiconductor that constitutes the well layer, and a compound semiconductor that constitutes the barrier layer), $(In_yGa_{(1-y)}N, GaN)$, $(In_yGa_{(1-y)}N, In_zGa_{(1-z)}N)$ [provided that, y>z], $(In_yGa_{(1-y)}N, AlGaN)$ can be exemplified. The first compound semiconductor layer may be constituted by a compound semiconductor of a first conduction type (for example, an n-type), and the second compound semiconductor layer may be constituted by a compound semiconductor of a second conduction type (for example, a p-type) that is different from the first conduction type. The first compound semiconductor layer and the second compound semiconductor layer are referred to as a first clad layer and a second clad layer, respectively. The first compound semiconductor layer and the second compound semiconductor layer may be layers having a single structure, layers having multi-layer structure, layers having a superlattice structure. In addition, the first compound semiconductor layer and the second compound semiconductor layer may set as a layer including a composition gradient layer and a concentration gradient layer.

The laminated structure body is formed on the second surface of the substrate for manufacturing a light-emitting element, or on the second surface of the compound semiconductor substrate. Examples of the substrate for manufacturing a light-emitting element include a GaN substrate, a sapphire substrate, a GaAs substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, a Si substrate, and these substrates in which a underlying layer or a buffer layer is formed on a surface (main surface) thereof, and it is desirable to use the GaN substrate when considering that a defect density is small. In addition, examples of the compound semiconductor substrate include a GaN substrate. It is known that polarity/non-polarity/semi-polarity and characteristics of the GaN substrate vary in accordance with a growth plane, but any main surface (second surface) of the GaN substrate can be used in formation of the compound semiconductor layer. In addition, with regard to the main surface of the GaN substrate, in accordance with a crystal structure (for example, a cubic type, a hexagonal type, and the like), crystal orientation planes called a A plane, a B plane, a C plane, an R plane, an M plane, an N plane, and an S plane, or planes which are made off in a specific direction, and the like can also be used. Examples of a method of forming various compound semiconductor layers which constitute the light-emitting element include an organic metal chemical vapor phase growth method (MOCVD method, a metal organic-chemical vapor deposition method, MOVPE method, Metal organic-vapor phase epitaxy method), a molecular beam epitaxy method (MBE method), a hydride vapor phase epitaxy method (HVPE method) in which halogen contributes to transportation or reaction, an atomic layer deposition method (ALD method), a migration-enhanced epitaxy method (MEE method), a plasma assistant physical deposition method (PPD method), and the like, but there is no limitation to the methods.

Here, in the MOCVD method, examples of an organic gallium source gas include a trimethyl gallium (TMG) gas and a trimethyl gallium (TEG) gas, and examples of a nitrogen source gas include an ammonia gas and a hydrazine gas. In formation of the GaN-based compound semiconductor layer having a conduction type of the n-type, for example, silicon (Si) may be added as an n-type impurity (n-type dopant), and in formation of the GaN-based compound semiconductor layer having a conduction type of the p-type, for example, magnesium (Mg) may be added as a p-type impurity (p-type dopant). In a case where aluminum (Al) or indium (In) is contained as constituent atoms of the GaN-based compound semiconductor layer, a trimethyl aluminum (TMA) gas may be used as an Al source, and a trimethyl indium (TMI) gas may be used as an In source. In addition, as a Si source, a monosilane gas ($SiH_4$ gas) may be used. In addition, as a Mg source, a biscyclopentadienyl magnesium gas, methylcyclopentadienyl magnesium, or biscyclopentadienyl magnesium ($Cp_2Mg$) may be used. Provided that, as the n-type impurity (n-type dopant), Ge, Se, Sn, C, Te, S, O, Pd, and Po can be exemplified in addition to Si, and as the p-type impurity (p-type dopant), Zn, Cd, Be, Ca, Ba, C, Hg, and Sr can be exemplified in addition to Mg.

For example, a support substrate may be constituted by the various substrates which are exemplified as the substrate for manufacturing a light-emitting element, or may be constituted by an insulating substrate formed from AlN and the like, a semiconductor substrate formed from Si, SiC, Ge, and the like, a metal substrate, or an alloy substrate. However, it is desirable to use a substrate having conductivity. In addition, it is desirable to use the metal substrate or the alloy substrate from the viewpoints such as mechanical characteristics, elastic deformation, plastic deformation properties, heat dissipation properties, and the like. As the thickness of the support substrate, for example, a thickness of 0.05 mm to 1 mm can be exemplified. As a method of fixing the second light reflection layer to the support substrate, known methods such as a solder joining method, a normal temperature joining method, a joining method using an adhesive tape, a joining method using wax joining, and a method using an adhesive can be used, but it is desirable to employ the solder joining method or the normal temperature joining method from the viewpoint of securing conductivity. For example, in the case of using the silicon semiconductor substrate that is a conductive substrate as the support substrate, it is desirable to use a method capable of performing joining at a low temperature of 400° C. or lower to suppress bending due to a difference of a coefficient of thermal expansion. In the case of using the GaN substrate as the support substrate, a joining temperature may be 400° C. or higher.

When manufacturing the light-emitting element of the present disclosure and the like, the manufacturing may be performed in a state in which the substrate for manufacturing a light-emitting element is left, and the substrate for manufacturing a light-emitting element may be removed after sequentially forming the active layer, the second compound semiconductor layer, the second electrode, and the second light reflection layer on the first compound semiconductor layer. Specifically, the active layer, the second compound semiconductor layer, the second electrode, and the second light reflection layer are sequentially formed on the first compound semiconductor layer, the second light reflection layer is fixed to the support substrate, and the substrate for manufacturing a light-emitting element may be removed to expose the first compound semiconductor layer (the first surface of the first compound semiconductor layer). Removal of the substrate for manufacturing a light-emitting element may be performed by a wet etching method using an alkali aqueous solution such as a sodium hydroxide aqueous solution and a potassium hydroxide aqueous solution, an ammonia solution+a hydrogen peroxide solution, a sulfuric acid solution+a hydrogen peroxide solution, a hydrochloric acid solution+a hydrogen peroxide solution, a phosphoric acid solution+a hydrogen peroxide solution, and the like, a chemical mechanical polishing method (CMP method), a mechanical polishing method, a dry etching method, a lift-off method using a laser, and the like, or removal of the substrate for manufacturing a light-emitting element may be performed by a combination of the methods.

In a case where the substrate for manufacturing a light-emitting element is left, the first electrode may be formed on the first surface opposed to the second surface of the substrate for manufacturing a light-emitting element, or may be formed on the first surface opposed to the second surface of compound semiconductor substrate. In addition, in a case where the substrate for manufacturing a light-emitting element is not left, the first electrode may be formed on the first surface of the first compound semiconductor layer that constitutes the laminated structure body. Provided that, in this case, the first light reflection layer is formed on the first surface of the first compound semiconductor layer, and thus the first electrode may be formed to surround, for example, the first light reflection layer. For example, it is desirable that the first electrode has a single-layer configuration or a multi-layer configuration including at least one kind of metal (including an alloy) selected from the group consisting of gold (Au), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn), and indium (In), and specific examples thereof include Ti/Au, Ti/Al, Ti/Al/Au, Ti/Pt/Au, Ni/Au, Ni/Au/Pt, Ni/Pt, Pd/Pt, and Ag/Pd. Provided that, a layer before "/" in the multi-layer configuration is located on a further active layer side. The same shall apply hereinafter. For example, the first electrode may be formed as a film by a PVD method such as a vacuum deposition method and a sputtering method.

In the case of forming the first electrode to surround the first light reflection layer, it is possible to employ a configuration in which the first light reflection layer and the first electrode are in contact with each other. In addition, it is possible to employ a configuration in which the first light reflection layer and the first electrode are separated from each other, that is, an offset is formed, and a separation distance is within 1 mm. When the current injection region located in the first light reflection layer and the first electrode are planarly separated, a current flows along a long distance in the first compound semiconductor layer. Accordingly, it is desirable that the separation distance is within 1 mm to suppress electrical resistance that occurs in the current path to a low value. A state in which the first electrode is formed up to a location on an edge of the first light reflection layer, and a state in which the first light reflection layer is formed up to a location on an edge portion of the first electrode can be exemplified in some cases. Here, in the case of the state in which the first light reflection layer is formed up to a location on an edge portion of the first electrode, it is necessary for the first electrode to have an opening having a certain extent of size so as not to absorb basic mode light in laser oscillation. The size of the opening varies in accordance with a wavelength of the basic mode or a light trapping structure in a lateral direction (in-plane direction of the first compound semiconductor layer), and thus there is no limitation to the size, but it is desirable that the size is in an order of approximately several or more times an oscillation wavelength $\lambda_0$.

The second electrode may be formed from a transparent conductive material. Examples of the transparent conductive material that constitutes the second electrode include an indium-based transparent conductive material [specifically, for example, an indium-tin oxide (ITO including Sn-doped $In_2O_3$, crystalline ITO, and non-crystalline ITO), an indium-zinc oxide (IZO), an indium-gallium oxide (IGO), indium-doped gallium-zinc oxide (IGZO, In—GaZnO$_4$), IFO(F-doped In$_2$O$_3$), ITiO (Ti-doped In$_2$O$_3$), InSn, InSnZnO], a tin-based transparent conductive material [specifically, for example, a tin oxide (SnO$_2$), ATO (Sb-doped SnO$_2$), FTO (F-doped SnO$_2$)], a zinc-based transparent conductive material [specifically, for example, a zinc oxide (Zno including Al-doped ZnO (AZO) or B-doped ZnO), a gallium-doped zinc oxide (GZO), AlMgZnO (an aluminum oxide and magnesium oxide-doped zinc oxide)], and NiO. In addition, as the second electrode, a transparent conductive film in which a gallium oxide, a titanium oxide, a niobium oxide, an antimony oxide, a nickel oxide, or the like is set as a base layer can be exemplified, and a transparent conductive material such as a spinel-type oxide and an oxide having a YbFe$_2$O$_4$ structure can also be exemplified. The material that constitutes the second electrode depends on an arrangement state of the second light reflection layer and the second electrode. However, the material is not limited to the transparent conductive material, and as the material, metals such as palladium (Pd), platinum (Pt), nickel (Ni), gold (Au), cobalt (Co), and rhodium (Rh) can also be used. The second electrode may be constituted by at least one kind of the materials. For example, the second electrode can be formed as a film by a PVD method such as a vacuum deposition method and a sputtering method. In addition, as the transparent electrode layer, a low-resistance semiconductor layer can also be used. In this case, specifically, an n-type GaN-based compound semiconductor layer can also be used. In addition, in a case where a layer adjacent to the n-type GaN-based compound semiconductor layer is a p-type, it is possible to lower electrical resistance of an interface by joining both the layers through tunnel junction. In addition, when the second electrode is constituted by the transparent conductive material, it is possible to spread currents in a lateral direction (in-plane direction of the second compound semiconductor layer), and it is possible to supply currents to the current injection region with efficiency.

A pad electrode may be formed on the first electrode or the second electrode to be electrically connected to an external electrode or circuit. It is desirable that the pad electrode has a single-layer configuration or a multi-layer configuration including at least one kind of metal selected from the group consisting of titanium (Ti), aluminum (Al), platinum (Pt), gold (Au), nickel (Ni), and palladium (Pd). In addition, the pad electrode may have a multi-layer configuration such as a multi-layer configuration of Ti/Pt/Au, a multi-layer configuration of Ti/Pd/Au, a multi-layer configuration of Ti/Au, a multi-layer configuration of Ti/Pd/Au, a multi-layer configuration of Ti/Ni/Au, and a multi-layer configuration of Ti/Ni/Au/Cr/Au. In a case where the first electrode is constituted by a Ag layer or a Ag/Pd layer, it is desirable that for example, a cover metal layer of Ni/TiW/Pd/TiW/Ni is formed on a surface of the first electrode, and for example, the pad electrode having the multi-layer configuration of Ti/Ni/Au or the multi-layer configuration of Ti/Ni/Au/Cr/Au is formed on the cover metal layer.

A light reflection layer (distributed Bragg reflector layer (DBR layer)) that constitutes the first light reflection layer and the second light reflection layer is constituted, for example, by a semiconductor multi-layer film or a dielectric multi-layer film. Examples of a dielectric material include oxides of Si, Mg, Al, Hf, Nb, Zr, Sc, Ta, Ga, Zn, Y, B, Ti, and the like, nitrides (for example, SiN$_X$, AlN$_X$, AlGaN$_X$, GaN$_X$, BN$_X$, and the like), fluorides, and the like. Specific examples thereof include SiO$_X$, TiO$_X$, NbO$_X$, ZrO$_X$, TaO$_X$, ZnO$_X$, AlO$_X$, HfO$_X$, SiN$_X$, AlN$_X$, and the like. In addition, two or more kinds of dielectric films formed from dielectric materials having refractive indexes different from each other are alternately laminated within the dielectric material to obtain a light reflection layer. For example, multi-layer films such as SiO$_X$/SiN$_Y$, SiO$_X$/TaO$_X$, SiO$_X$/NbO$_Y$, SiO$_X$/ZrO$_Y$, and SiO$_X$/AlN$_Y$ are desirable. To obtain desired optical reflectivity, materials which constitute respective dielectric films, film thicknesses thereof, and the number of laminations may be appropriately selected. The thickness of each of the dielectric films may be appropriately adjusted by a material that is used and the like, and is determined by an oscillation wavelength (light-emitting wavelength) $\lambda_0$, and a refractive index n at the oscillation wavelength $\lambda_0$ of the material that is used. Specifically, it is desirable to set the thickness to an odd multiple of $\lambda_0/(4n)$. For example, in a light-emitting element in which an oscillation wavelength $\lambda_0$ is 410 nm, in a case where the light reflection layer is constituted by SiO$_X$/NbO$_Y$, a thickness of approximately 40 nm to 70 nm can be exemplified. Desirably, the number of laminations of approximately 5 to 20 can be exemplified. As an entire thickness of a plurality of the light reflection layers, for example, a thickness of approximately 0.6 μm to 1.7 μm can be exemplified. In addition, it is desirable that optical reflectivity of each of the light reflection layer is 95% or greater.

The light reflection layer can be formed on the basis of a known method, and specific examples thereof include PVD methods such as a vacuum deposition method, a sputtering method, a reactive sputtering method, an ECR plasma sputtering method, a magnetron sputtering method, an ion beam assist deposition method, an ion plating method, and a laser ablation method; various kinds of CVD methods; application methods such as a spray method, a spin coating method, and a dipping method; and a method in which two or more kinds of the methods are combined; and a method in which the methods and any one or more kinds among entire or partial pre-treatment, irradiation with an inert gas (Ar, He, Xe, and the like) or plasma, irradiation with an oxygen gas, an ozone gas, or plasma, oxidation treatment (heat treatment), and an exposure treatment are combined; and the like.

A size or a shape of the light reflection layer is not particularly limited as long as the light reflection layer covers the current injection region or an element region. Specific examples of a shape of a boundary between the current injection region and the current non-injection/inner region, a shape of a boundary between the current non-injection/inner region and the current non-injection/outer region, and a planar shape of an opening provided in the element region or a current constriction region include a circular shape, an oval shape, a rectangular shape, a polygonal shape (a triangle, a quadrangle, a hexagon, and the like). It is desirable that the shape of the boundary between the current injection region and the current non-injection/inner region, and the shape of the boundary between the current non-injection/inner region and the current non-injection/outer region are similar. In a case where the shape of the boundary between the current injection region and the current non-injection/inner region is a circular shape, a diameter of approximately 5 μm to 100 μm is desirable. Here, the "element region" represents a region to which a constricted current is injected, a region capable of trapping light due to a refractive index different and the like, the inside of a region interposed between the first light reflection layer and the second light reflection layer, a region in which laser oscillation occurs, the inside of a region interposed between the first light reflection layer and the second light reflection layer, and a region that actually contributes laser oscillation.

A lateral surface or an exposed surface of the laminated structure body may be covered with a covering layer (insulating film). Formation of the covering layer (insulating film) can be performed on the basis of a known method. It is desirable that a refractive index of a material that constitutes the covering layer (insulating film) is smaller than a refractive index of a material that constitutes the laminated structure body. Examples of the material that constitutes the covering layer (insulating film) include a $SiO_X$-based material including $SiO_2$, a $SiN_X$-based material, a $SiO_YN_Z$-based material, $TaO_X$, $ZrO_X$, $AlN_X$, $AlO_X$, and $GaO_X$, and further include organic materials such as a polyimide resin. Examples of a method of forming the covering layer (insulating film) include a PVD method such as a vacuum deposition method and a sputtering method, and a CVD method. The covering layer (insulating film) may be formed on the basis of an application method.

Example 1

Figure 1:
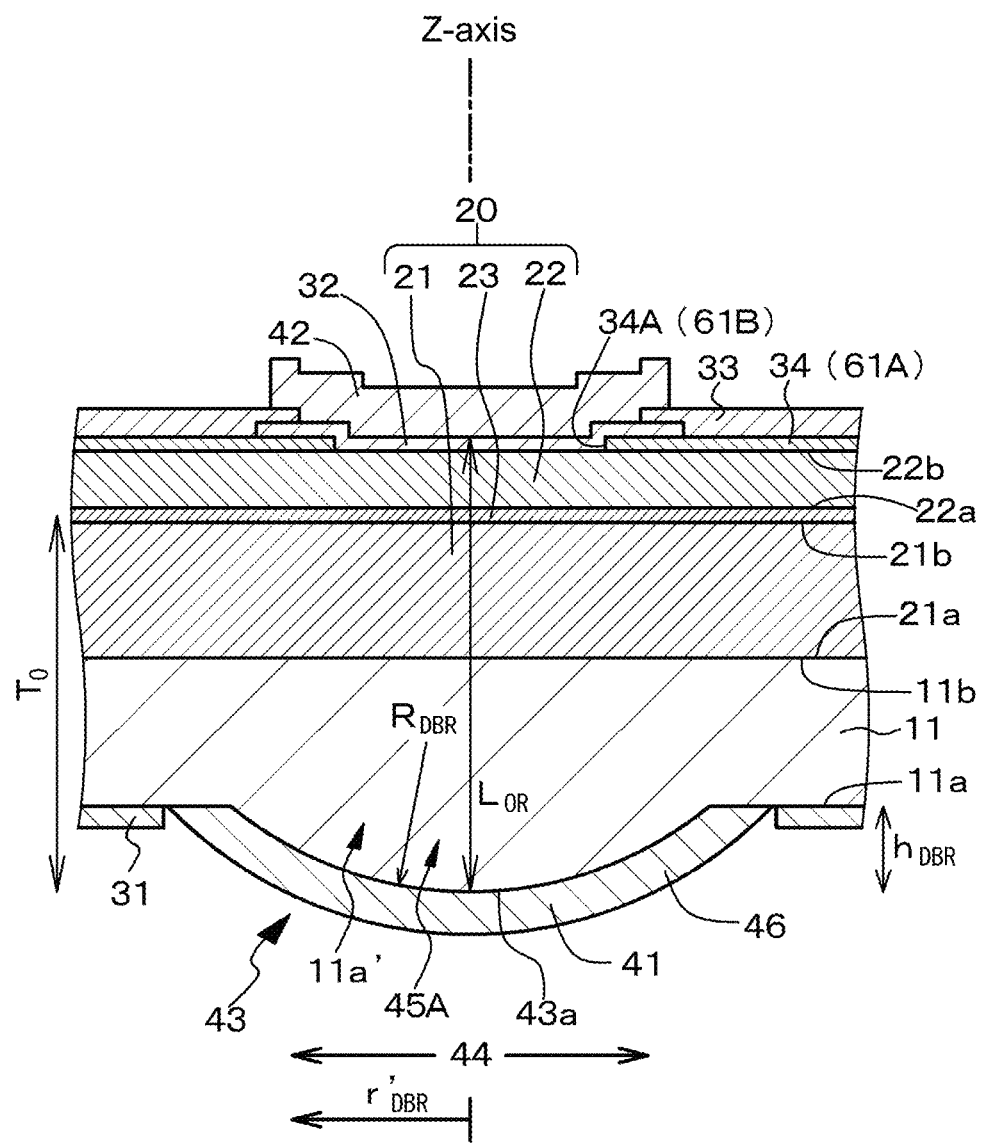
FIG. 1 is a schematic partial end view of a light-emitting element of Example 1.

Example 1 relates to the light-emitting element of the present disclosure, specifically, the light-emitting element of Configuration 5-A. More specifically, the light-emitting element of Example 1 or light-emitting elements of Example 2 to Example 9, and Example 12 to Example 14 to be described later are constituted by a surface light-emitting laser element (vertical resonator laser, VCSEL) that emits laser light from a top surface of the second compound semiconductor layer through the second light reflection layer. In addition, more specifically, light-emitting elements of Example 10, Example 11, and Example 15 to be described later are constituted by a surface light-emitting laser element (vertical resonator laser, VCSEL) that emits laser light from a top surface of the first compound semiconductor layer through the first light reflection layer. A schematic partial end view of the light-emitting element of Example 1 is illustrated in FIG. 1.

The light-emitting element of Example 1 or the light-emitting elements of Example 2 to Example 15 to be described later includes, (A) a laminated structure body 20 which is formed from a GaN-based compound semiconductor and in which a first compound semiconductor layer 21 including a first surface 21a and a second surface 21b that is opposed to the first surface 21a and having a first conduction type (specifically, an n-type), an active layer (light-emitting layer) 23 that faces the second surface 21b of the first compound semiconductor layer 21, and a second compound semiconductor layer 22 including a first surface 22a that faces the active layer 23 and a second surface 22b that is opposed to the first surface 22a having a second conduction type (specifically, a p type) are laminated, (B) a first light reflection layer 41 that is provided on the first surface 21a side of the first compound semiconductor layer 21, and (C) a second light reflection layer 42 that is provided on the second surface 22b side of the second compound semiconductor layer 22. The first light reflection layer 41 includes a concave mirror portion 43, and the second light reflection layer 42 has a flat shape.

A resonator is constituted by region of the first light reflection layer 41 from the first surface 21a of the first compound semiconductor layer 21 to a certain depth, the laminated structure body 20 (the first compound semiconductor layer 21, the active layer 23, and the second compound semiconductor layer 22), and a region of the second light reflection layer 42 from the second surface 22b of the second compound semiconductor layer 22 to a certain depth. Here, when a resonator length is set as $L_{OR}$, it is desirable to satisfy a relationship of $1 \times 10^{-5}$ m $\leq L_{OR}$.

In addition, in the light-emitting element of Example 1, when the first light reflection layer 41 is cut out on a virtual plane including a lamination direction of the laminated structure body 20, a figure that is drawn by an interface 43a, which faces the laminated structure body 20, of a part (an effective region 44 in the concave mirror portion 43 of the first light reflection layer 41) of the concave mirror portion 43 of the first light reflection layer 41 is a part of a circle or a part of a parabola. Provided that, a shape (figure of a cross-sectional shape) of a portion of the concave mirror portion 43, which is located on an outer side of the effective region 44, may not a part of a circle or a parabola.

In addition, a compound semiconductor substrate 11 constituted by a GaN substrate is disposed between the first surface 21a of the first compound semiconductor layer 21 and the first light reflection layer 41. A surface of the compound semiconductor substrate (substrate for manufacturing a light-emitting element) 11, which faces the first compound semiconductor layer 21, is referred to as "second surface 11b", and a surface opposed to the second surface 11b is referred to as "first surface 11a". That is, the laminated structure body 20 is formed on the second surface 11b of the compound semiconductor substrate 11 having conductivity. In addition, the concave mirror portion 43 of the first light reflection layer 41 includes a base portion 45A that is a protruding portion 11a' of the first surface 11a of the compound semiconductor substrate 11, and a multi-layer light reflection film 46 that is formed on at least a partial surface of the base portion 45A (specifically, a surface of the base portion 45A). In addition, when a radius of curvature of the concave mirror portion 43 (specifically, the effective region 44 having a radius $r'_{DBR}$ in the concave mirror portion 43 of the first light reflection layer 41) is set as $R_{DBR}$, a relationship of $R_{DBR} \leq 1 \times 10^{-3}$ m is satisfied. Specifically, there is no limitation, but $L_{OR}$=50 μm, $R_{DBR}$=70 μm, and $r'_{DBR}$=20 μm can be exemplified. In addition, as a desired wavelength (oscillation wavelength) $\lambda_0$ of light that is mainly emitted from the light-emitting element, $\lambda_0$=450 nm can be exemplified.

Here, when a distance from the active layer 23 to an interface between the base portion 45A and the interface of the multi-layer light reflection film 46 is set as $T_0$, a function $x=f(z)$ of an ideal parabola can be expressed by the following Expressions.

$$x=z^2/t_0$$

$$h_{DBR}=r'_{DBR}{}^2/2T_0$$

When a figure that is drawn by the interface 43a is set as a part of a parabola, it is needless say that a parabola that deviates from the ideal parabola is also possible.

In addition, a value of heat conductivity of the laminated structure body 20 is higher than a value of heat conductivity of the first light reflection layer 41. A value of heat conductivity of a dielectric material that constitutes the first light reflection layer 41 is approximately 10 watts/(m·K) or less. On the other hand, a value of heat conductivity of the GaN-based compound semiconductor that constitutes the laminated structure body 20 is approximately 50 watts/(m·K) to 100 watts/(m·K).

The first compound semiconductor layer 21 is constituted by an n-GaN layer, the active layer 23 is constituted by a five-layer multiple quantum well structure in which In$_{0.04}$Ga$_{0.96}$N layer (barrier layer) and an In$_{0.16}$Ga$_{0.84}$N layer (well layer) are laminated, and the second compound semiconductor layer 22 is constituted by a p-GaN layer. A first electrode 31 is formed on the first surface 11a of the compound semiconductor substrate 11. On the other hand, the second electrode 32 is formed on the second compound semiconductor layer 22, and the second light reflection layer 42 is formed on the second electrode 32. The second light reflection layer 42 on the second electrode 32 has a flat shape. The first electrode 31 is formed from Ti/Pt/Au, and the second electrode 32 is formed from a transparent conductive material, specifically, ITO. A pad electrode (not illustrated) that is electrically connected to an external electrode or circuit and is formed from, for example, Ti/Pt/Au or V/Pt/Au is formed on or connected to an edge portion of the first electrode 31. A pad electrode 33 that is electrically connected to an external electrode or circuit and is formed from, for example, Pd/Ti/Pt/Au or Ti/Pd/Au, Ti/Ni/Au is formed on or connected to an edge portion of the second electrode 32. The first light reflection layer 41 and the second light reflection layer 42 have a lamination structure of a Ta$_2$O$_5$ layer and a SiO$_2$ layer (a total number of laminations of a dielectric film: 20 layers). The first light reflection layer 41 and the second light reflection layer 42 have the multi-layer structure, but are illustrated as one layer for simplification of drawings. A planar shape of each of the first electrode 31, the first light reflection layer 41, the second light reflection layer 42, and an opening 34A provided in an insulating layer (current constriction layer) 34 has a circular shape.

Hereinafter, a method of manufacturing the light-emitting element of Example 1 will be described with reference to FIG. 2A, FIG. 2B, FIG. 3, FIG. 4, FIG. 5, FIG. 6, and FIG. 7 which are schematic partial end views of the laminated structure body and the like.

[Process—100]

First, the laminated structure body 20, which is formed from a GaN-based compound semiconductor and in which the first compound semiconductor layer 21 including the first surface 21a and the second surface 21b that is opposed to the first surface 21a, the active layer (light-emitting layer) 23 that faces the second surface 21b of the first compound semiconductor layer 21, and the second compound semiconductor layer 22 including the first surface 22a that faces the active layer 23 and the second surface 22b that is opposed to the first surface 22a are laminated, is formed on the second surface 11b of compound semiconductor substrate 11 having a thickness of approximately 0.4 mm. Specifically, the first compound semiconductor layer 21, the active layer 23, and the second compound semiconductor layer 22 are sequentially formed on the second surface 11b of the compound semiconductor substrate 11 on the basis of an epitaxial growth method by a known MOCVD method to obtain the laminated structure body 20 (refer to FIG. 2A).

[Process—110]

Figure 2A:
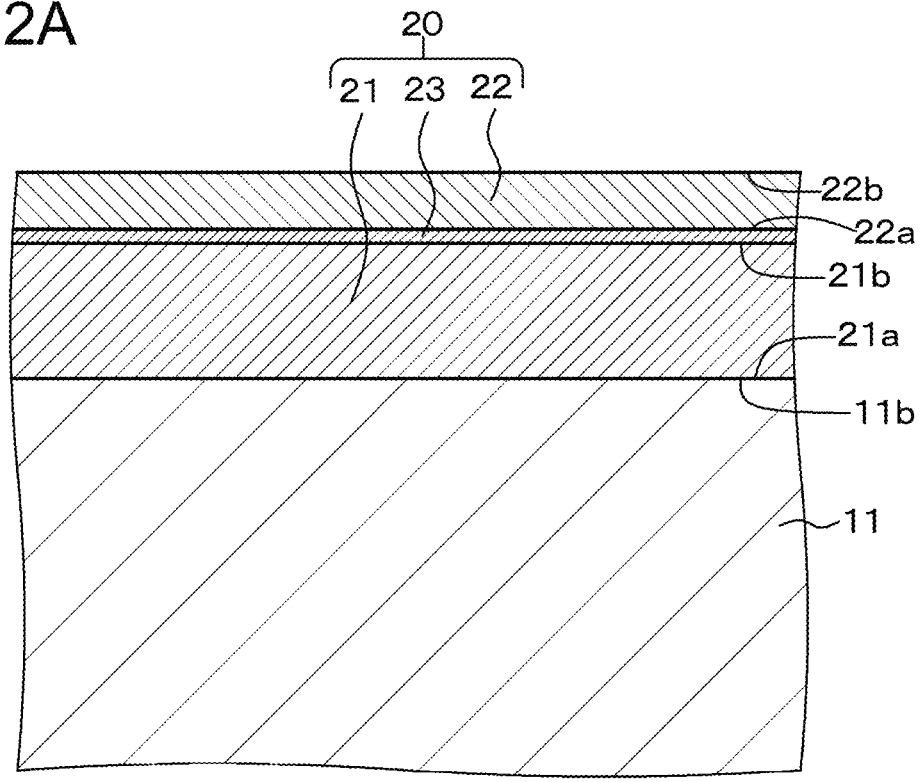
FIG. 2A and FIG. 2B are schematic partial end views of a laminated structure body and the like for illustrating a method of manufacturing the light-emitting element of Example 1.
Figure 2B:
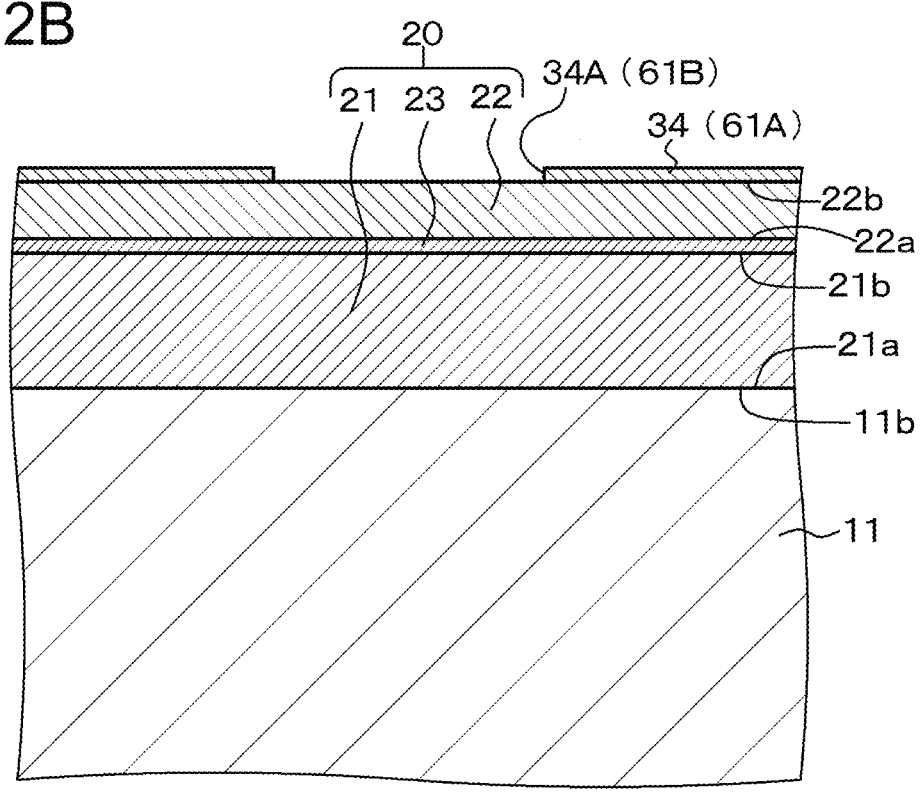
Figure 3:
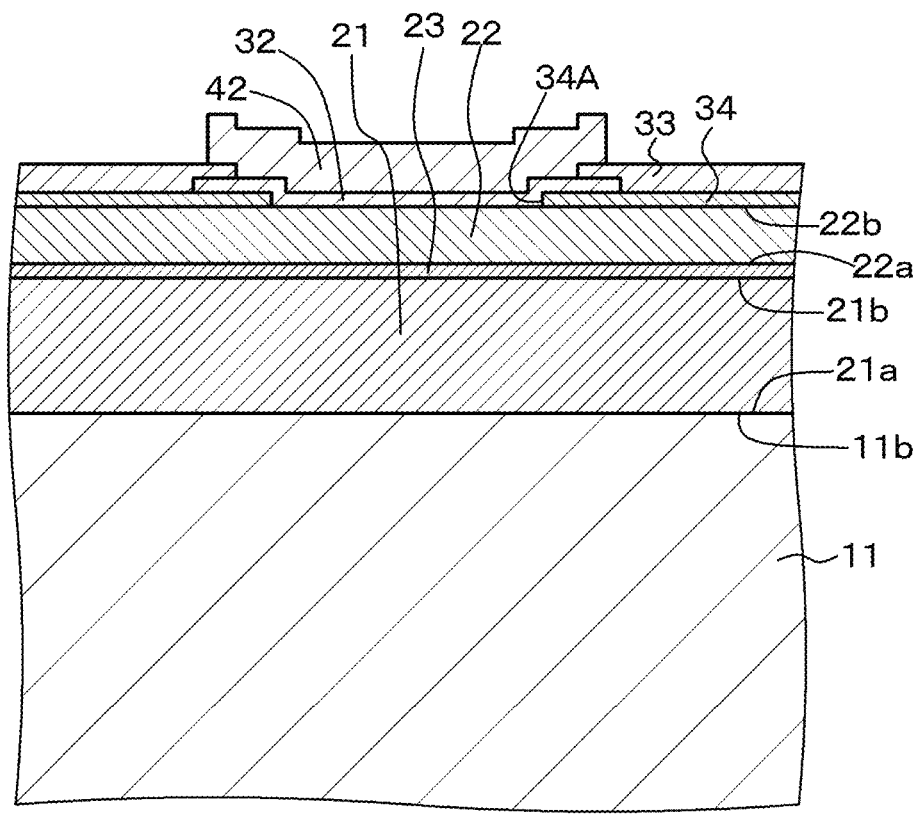
FIG. 3 continues from FIG. 2B and is a schematic partial end view of a laminated structure body and the like for illustrating the method of manufacturing the light-emitting element of Example 1.

Next, the insulating layer (current constriction layer) 34 that includes the opening 34A and is formed from SiO$_2$ is formed on the second surface 22b of the second compound semiconductor layer 22 on the basis a combination of a film formation method such as a CVD method, a sputtering method, and a vacuum deposition method, and a wet etching method or a dry etching method (refer to FIG. 2B). A current constriction region (a current injection region 61A and a current non-injection region 61B) are defined by the insulating layer 34 including the opening 34A. That is, the current injection region 61A is defined by the opening 34A.

To obtain the current constriction region, an insulating layer (current constriction layer) formed from an insulating material (for example, SiO$_X$, SiN$_X$, AlO$_X$) may be formed between the second electrode 32 and the second compound semiconductor layer 22, a mesa structure may be formed by etching the second compound semiconductor layer 22 by an RIE method and the like, the current constriction region may be formed by partially oxidizing a partial layer of the second compound semiconductor layer 22 that is laminated from a lateral direction, a region of which conductivity decreases may be formed through ion implantation of impurities to the second compound semiconductor layer 22, or the above-described methods may be appropriately combined. However, it is necessary for the second electrode 32 to be electrically connected to a portion of the second compound semiconductor layer 22 through which a current flows due to current constriction.

[Process—120]

Next, the second electrode 32 and the second light reflection layer 42 are formed on the second compound semiconductor layer 22. Specifically, the second electrode 32 is formed on the second surface 22b of the second compound semiconductor layer 22 which is exposed to a bottom surface of the opening 34A (current injection region 61A) and on the insulating layer 34, for example, a lift-off method, and the pad electrode 33 is formed on the basis of a combination of a film formation method such as a sputtering method and a vacuum deposition method and a patterning method such as a wet etching method and a dry etching method. Next, the second light reflection layer 42 is formed on the second electrode 32 and on the pad electrode 33 on the basis of a combination of the film formation method such as the sputtering method and the vacuum deposition method and the patterning method such as the wet etching method and the dry etching method. The second light reflection layer 42 on the second electrode 32 has a flat shape. In this manner, a structure illustrated in FIG. 3 can be obtained.

[Process—130]

Figure 4:
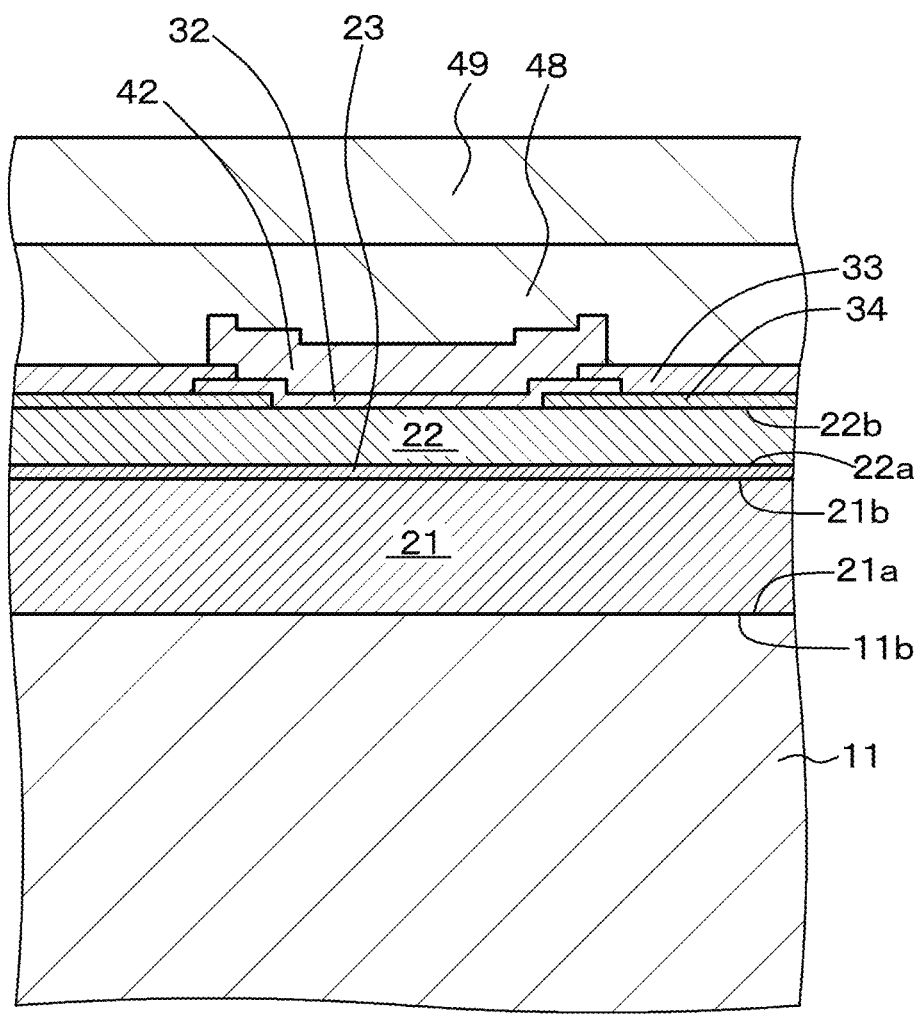
FIG. 4 continues from FIG. 3 and is a schematic partial end view of a laminated structure body and the like for illustrating the method of manufacturing the light-emitting element of Example 1.

Next, the second light reflection layer 42 is fixed to a support substrate 49 through a joining layer 48 (refer to FIG. 4). Specifically, the second light reflection layer 42 is fixed to the support substrate 49 constituted by a sapphire substrate by using the joining layer 48 formed from an adhesive.

[Process—140]

Figure 5:
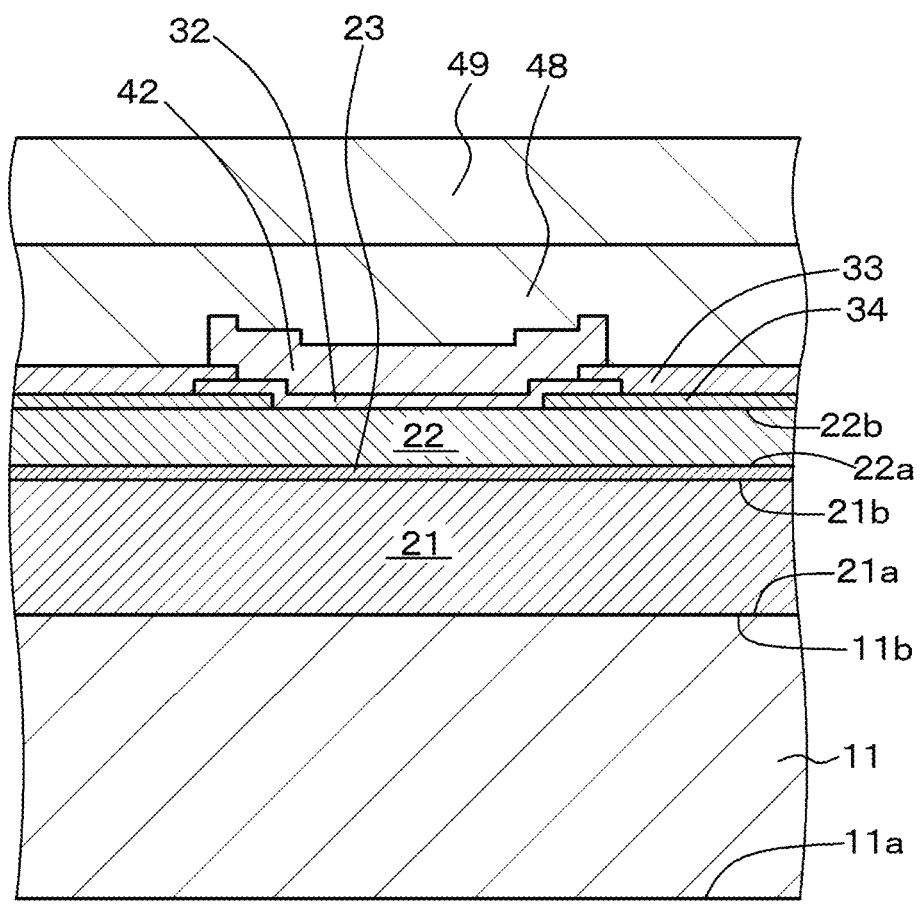
FIG. 5 continues from FIG. 4 and is a schematic partial end view of a laminated structure body and the like for illustrating the method of manufacturing the light-emitting element of Example 1.
Figure 6:
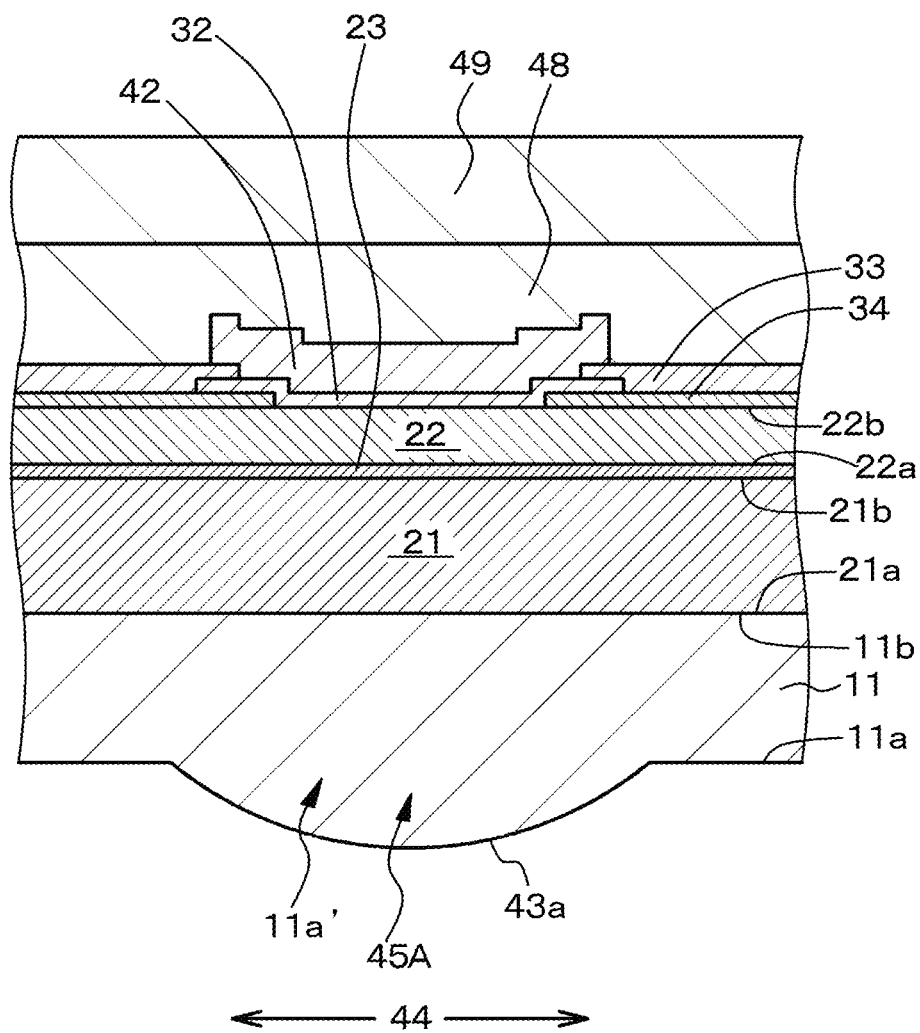
FIG. 6 continues from FIG. 5 and is a schematic partial end view of a laminated structure body and the like for illustrating the method of manufacturing the light-emitting element of Example 1.
Figure 7:
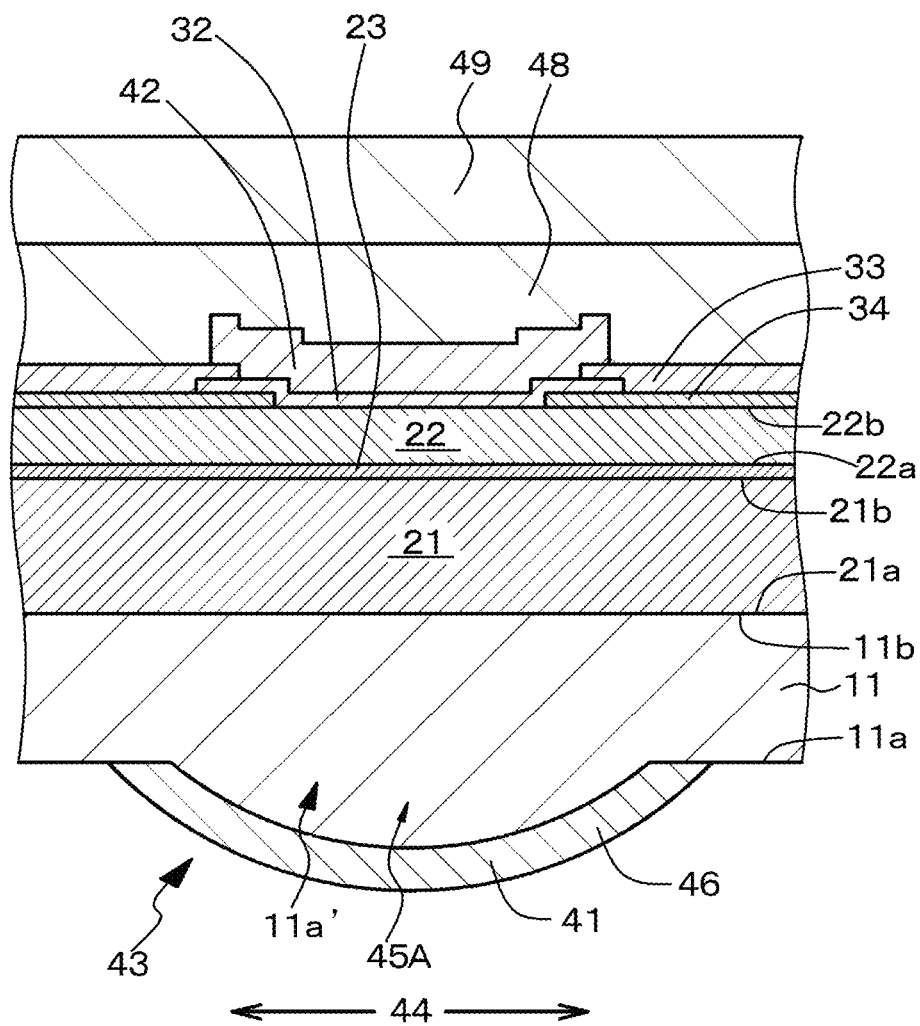
FIG. 7 continues from FIG. 6 and is a schematic partial end view of a laminated structure body and the like for illustrating the method of manufacturing the light-emitting element of Example 1.

Next, the compound semiconductor substrate 11 is thinned on the basis of a mechanical polishing method or a CMP method, and a mirror surface treatment is performed with respect to the first surface 11a of the compound semiconductor substrate 11 (refer to FIG. 5). It is desirable that a value of surface roughness Ra of the first surface 11a of the compound semiconductor substrate 11 is 10 nm or less. The surface roughness Ra is defined by JIS B-610: 2001, and specifically, measurement thereof can be performed through observation based on an AFM or a cross-section TEM. In addition, the base portion 45A that is a protruding portion 11a' is formed on an exposed surface (first surface 11a) of the compound semiconductor substrate 11. Specifically, a patterned resist layer is formed on the first surface 11a of the compound semiconductor substrate 11 in which the base portion 45A is to be formed, and the resist layer is heated to allow the resist layer to reflow, thereby obtaining a resist pattern. The same shape (or a similar shape) as that of the protruding portion 11a' is applied to the resist pattern. In addition, the resist pattern and the first surface 11a of the compound semiconductor substrate 11 is etched back by using an RIE method and the like to form the base portion 45A that is the protruding portion 11a' in the exposed surface (first surface 11a) of the compound semiconductor substrate 11 (refer to FIG. 6).

[Process—150]

Next, the multi-layer light reflection film 46 is formed on at least a part of the base portion 45A. Specifically, the multi-layer light reflection film 46 is formed on the exposed surface (first surface 11a) of the compound semiconductor substrate 11 and the base portion 45A on the basis of a known method such as the sputtering method and the vacuum deposition method. In addition, an unnecessary portion of the multi-layer light reflection film 46 is removed on the basis of the patterning method such as the wet etching method and the dry etching method to obtain the first light reflection layer 41 (refer to FIG. 7). Next, the first electrode 31 is formed on the first surface 11a of the compound semiconductor substrate 11 on the basis of a combination of the film formation method such as the sputtering method and the vacuum deposition method and the patterning method such as the wet etching method and the dry etching method, thereby obtaining the first electrode 31 that is electrically connected to the first compound semiconductor layer 21.

[Process—160]

Next, the support substrate 49 is peeled off. In this manner, the structure illustrated in FIG. 1 can be obtained. Next, so-called element isolation is performed to separate light-emitting elements from each other, and a lateral surface or an exposed surface of the laminated structure body is covered, for example, with an insulating film formed from $SiO_2$. Next, packaging or sealing is performed to complete the light-emitting element of Example 1.

Provided that, in [Process—140], the compound semiconductor substrate 11 may be thinned, the mirror surface treatment may be performed, and the support substrate 49 may be peeled off.

Figure 8:
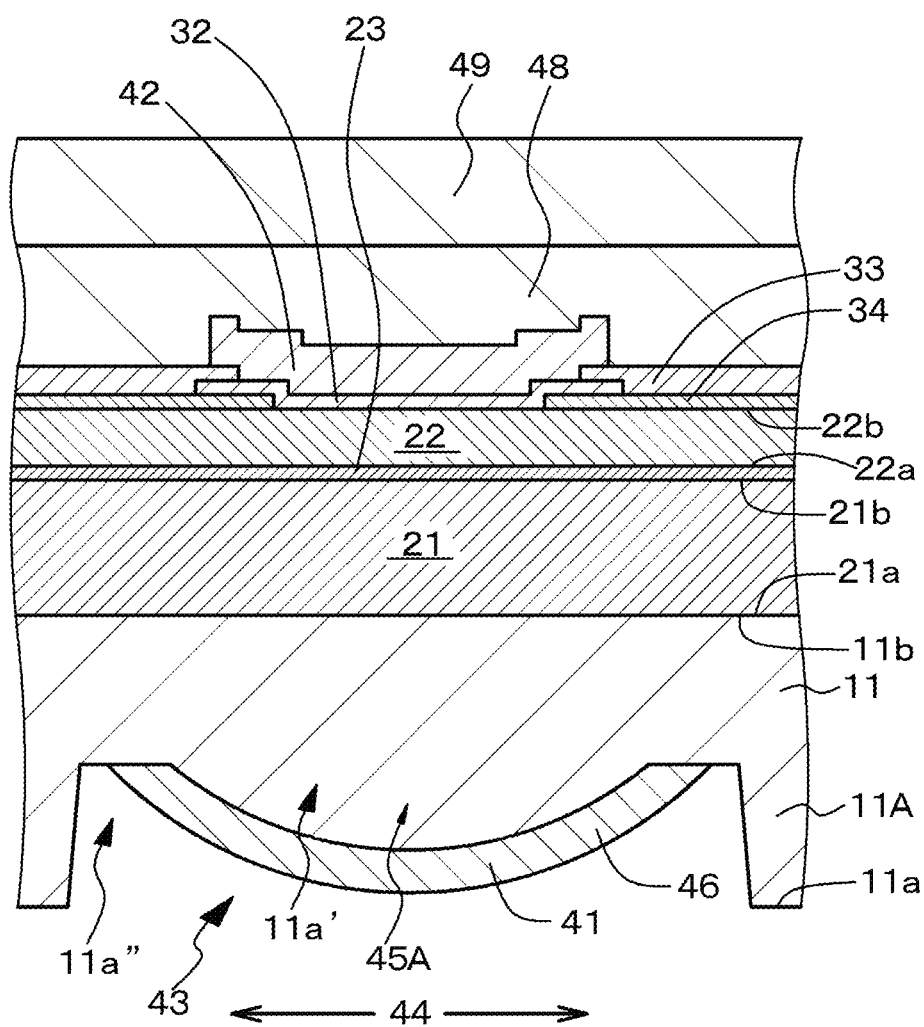
FIG. 8 is a schematic partial end view of a laminated structure body and the like of a modification example of the light-emitting element of Example 1.

In addition, as a modification example of the light-emitting element of Example 1, in [Process—140], the compound semiconductor substrate 11 is thinned, and the mirror surface treatment is performed. Then, before forming the base portion 45A that is the protruding portion 11a' in the exposed surface (first surface 11a) of the compound semiconductor substrate 11, a recess 11a" is formed in a region of the exposed surface (first surface 11a) of the compound semiconductor substrate 11 in which the base portion 45A is to be formed, a patterned resist layer is formed in the recess 11a", and the resist layer is heated to allow the resist layer to reflow, thereby obtaining the resist pattern. The same shape (or a similar shape) as that of the protruding portion 11a' is applied to the resist pattern. In addition, the resist pattern and a portion of the recess 11a" are etched back by using the RIE method and the like to form the base portion 45A that is the protruding portion 11a' in the recess 11a" of the exposed surface (first surface 11a) of the compound semiconductor substrate 11 (refer to FIG. 8). Next, the multi-layer light reflection film 46 is formed on the entire surface including a surface of the base portion 45A on the basis of a known method such as the sputtering method and the vacuum deposition method. In addition, an unnecessary portion of the multi-layer light reflection film 46 is removed on the basis of the patterning method such as the wet etching method and the dry etching method, thereby obtaining the first light reflection layer 41. That is, a convex portion 11A is formed at the periphery of the first light reflection layer 41, and the first light reflection layer 41 does not protrude from the convex portion 11A (including the exposed surface (first surface 11a) of the compound semiconductor substrate 11), and thus it is possible to protect the first light reflection layer 41.

In addition, in [Process—140], the base portion 45A that is the protruding portion 11a' may be formed on the exposed surface (first surface 11a) of the compound semiconductor substrate 11, and a protrusion may be formed in the exposed surface (first surface 11a) of the compound semiconductor substrate 11 to be spaced away from the base portion 45A and to surround the base portion 45A. Specifically, a patterned resist layer is formed on the first surface 11a of the compound semiconductor substrate 11 in which the base portion 45A is to be formed, and the resist layer is heated to allow the resist layer to reflow, thereby obtaining the resist pattern. The same shape (or a similar shape) as that of the protruding portion 11a' is applied to the resist pattern. In addition, the resist layer is formed on a portion of the first surface 11a of the compound semiconductor substrate 11, in which the protrusion is to be formed, to be separated from the resist pattern and to surround the resist pattern. In addition, the resist pattern, the resist layer, and the first surface 11a of the compound semiconductor substrate 11 are etched back by using the RIE method and the like to form the base portion 45A that is the protruding portion 11a' in the exposed surface (first surface 11a) of the compound semiconductor substrate 11, and the protrusion in combination. The protrusion is formed at the periphery of the first light reflection layer 41, and the first light reflection layer 41 does not protrude from protrusion (including the exposed surface (first surface 11a) of the compound semiconductor substrate 11), and thus it is possible to protect the first light reflection layer 41.

Figure 9:
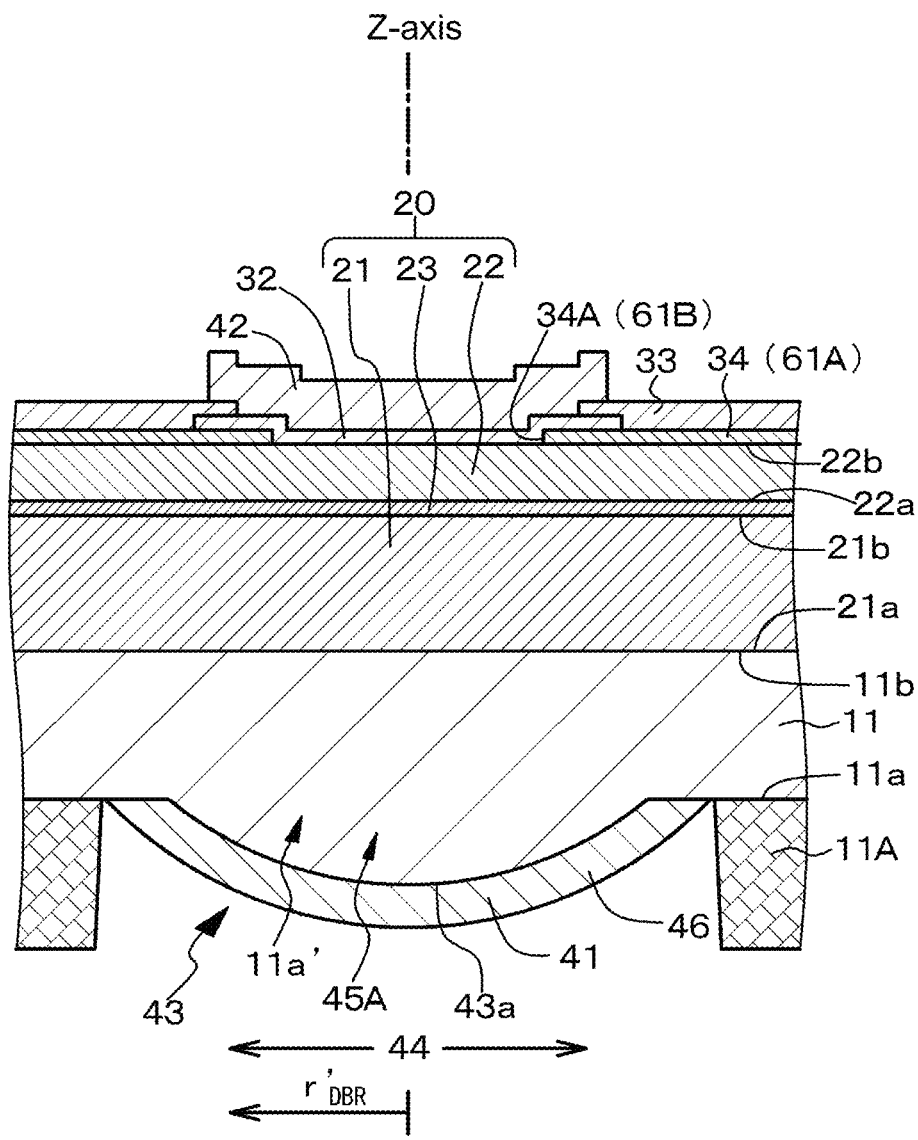
FIG. 9 is a schematic partial end view of a laminated structure body and the like of a modification example of the light-emitting element of Example 1.

In addition, In [Process—150], the multi-layer light reflection film 46 may be formed on at least a part of the base portion 45A to obtain the first light reflection layer 41, and the convex portion 11A may be formed on the first surface 11a of the compound semiconductor substrate 11 to surround the first light reflection layer 41 (refer to FIG. 9). For example, the convex portion 11A may be formed from an insulating material or a metal material. As described above, the convex portion 11A is formed at the periphery of the first light reflection layer 41, and the first light reflection layer 41 does not protrude the convex portion 11A, and thus it is possible to protect the first light reflection layer 41.

In the light-emitting element of Example 1, the first light reflection layer includes the concave mirror portion. Accordingly, even when the resonator length $L_{OR}$ is $1 \times 10^{-5}$ m or greater, it is possible to avoid an increase of a diffraction loss. As a result, it is possible to reliably perform laser oscillation. In addition, the resonator length $L_{OR}$ can be set to $1 \times 10^{-5}$ m or greater, and thus it is possible to mitigate a problem of heat saturation. In addition, the resonator length $L_{OR}$ can be set to $1 \times 10^{-5}$ m or greater. As a result, the tolerance of a manufacturing process of the light-emitting element becomes higher, and thus it is possible to realize an improvement of a yield ratio.

In addition, in the manufacturing process of the light-emitting element, the GaN substrate is used except for Example 4, but the GaN-based compound semiconductor is not formed on the basis of a method such as an ELO method in which epitaxial growth occurs in a lateral direction. Accordingly, as the GaN substrate, not only a polarity GaN substrate but also an inverted-polarity GaN substrate or a non-polarity GaN substrate can be used. When using the polarity GaN substrate, light-emission efficiency tends to deteriorate due to piezo electric field effect in the active layer, but when using the non-polarity GaN substrate or the inverted-polarity GaN substrate, it is possible to solve or mitigate the problem.

Example 2

Figure 10:
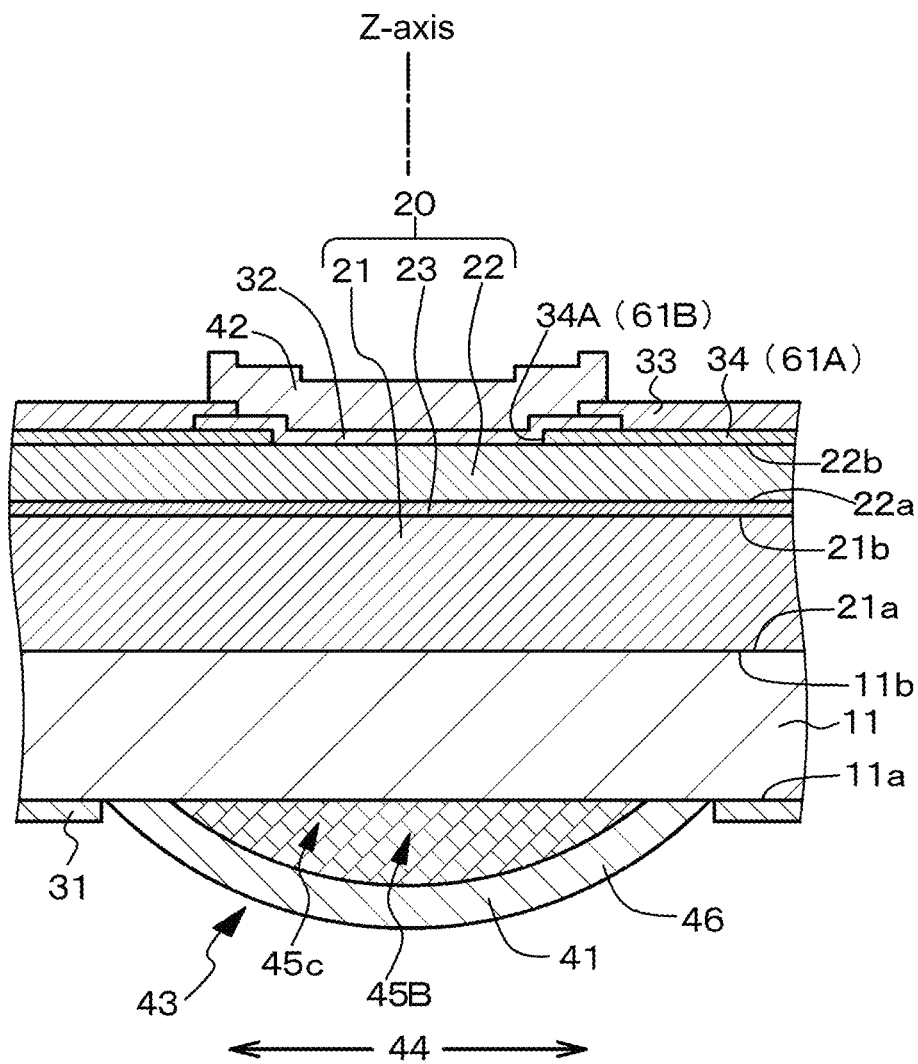
FIG. 10 is a schematic partial end view of a light-emitting element of Example 2.

Example 2 is a modification of Example 1, and relates to the light-emitting element of Configuration 5-B. In the light-emitting element of Example 2 of which a schematic partial end view is illustrated in FIG. 10, the concave mirror portion 43 of the first light reflection layer 41 includes a base portion 45B that is a protruding portion 45c formed on the compound semiconductor substrate 11 (specifically, on the first surface 11a of the compound semiconductor substrate 11), and a multi-layer light reflection film 46 that is formed at least at a part of the base portion 45B (specifically, a surface of the base portion 45B). Examples of a material that constitutes the base portion 45B (protruding portion 45c) include a transparent dielectric material such as $TiO_2$, $Ta_2O_5$, and $SiO_2$, a silicone-based resin, an epoxy-based resin, and the like.

With regard to the light-emitting element of Example 2, in a process similar to [Process—140] of Example 1, the compound semiconductor substrate 11 is thinned, and a mirror surface treatment is performed, and the base portion 45B that is the protruding portion 45c is formed on an exposed surface (first surface 11a) of the compound semiconductor substrate 11 is formed. Specifically, for example, a $TiO_2$ layer or a $Ta_2O_5$ layer is formed on the exposed surface (first surface 11a) of the compound semiconductor substrate 11, a patterned resist layer is formed on the $TiO_2$ layer or the $Ta_2O_5$ layer in which the base portion 45B is to be formed, and the resist layer is heated to allow the resist layer to reflow, thereby obtaining a resist pattern. The same shape (or a similar shape) as that of the protruding portion 45c is applied to the resist pattern. In addition, the resist pattern and the $TiO_2$ layer or the $Ta_2O_5$ layer are etched back to form the base portion 45B that is the protruding portion 45c on the exposed surface (first surface 11a) of the compound semiconductor substrate 11. Next, the multi-layer light reflection film 46 is formed on the exposed surface (first surface 11a) of the compound semiconductor substrate 11 and on the base portion 45B on the basis of a known method. Next, an unnecessary portion of the multi-layer light reflection film 46 is removed to obtain the first light reflection layer 41, and the first electrode 31 is formed on the first surface 11a of the compound semiconductor substrate 11, thereby obtaining the first electrode 31 that is electrically connected to the first compound semiconductor layer 21.

A configuration and a structure of the light-emitting element of Example 2 are similar to the configuration and the structure of the light-emitting element of Example 1 except for the above-described configuration, and thus detailed description thereof will be omitted. Provided that, the modification example of the light-emitting element of Example 1 is also applicable to Example 2.

Example 3

Figure 11:
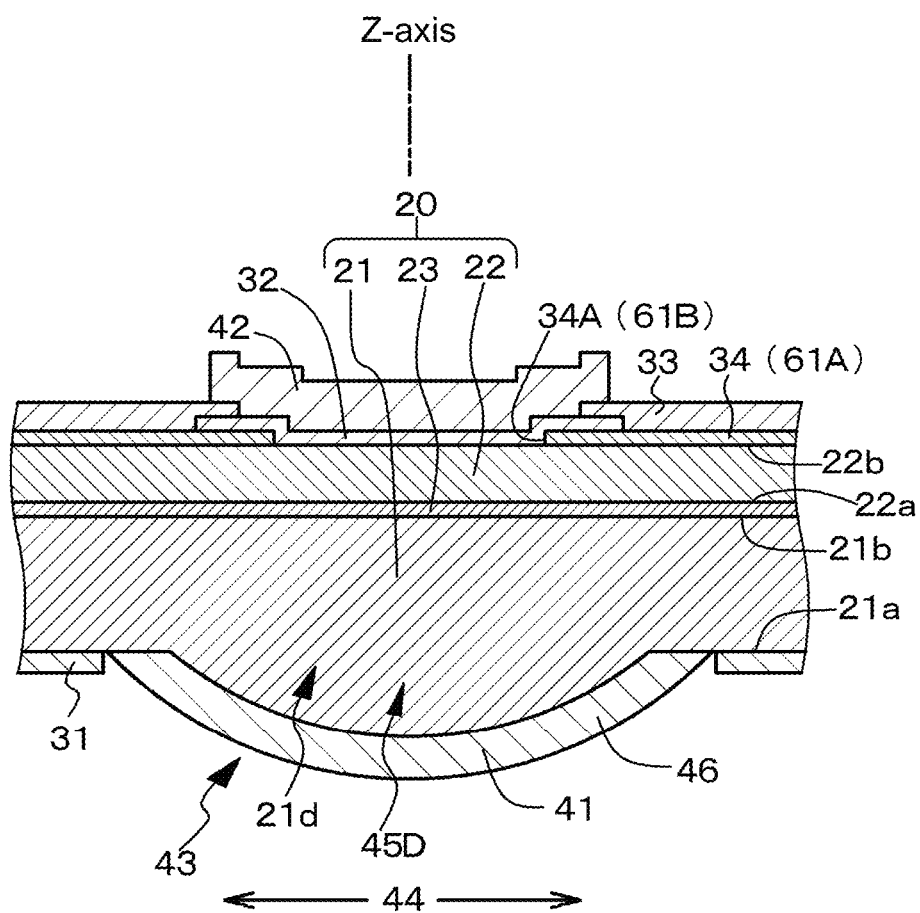
FIG. 11 is a schematic partial end view of a light-emitting element of Example 3.
Figure 12:
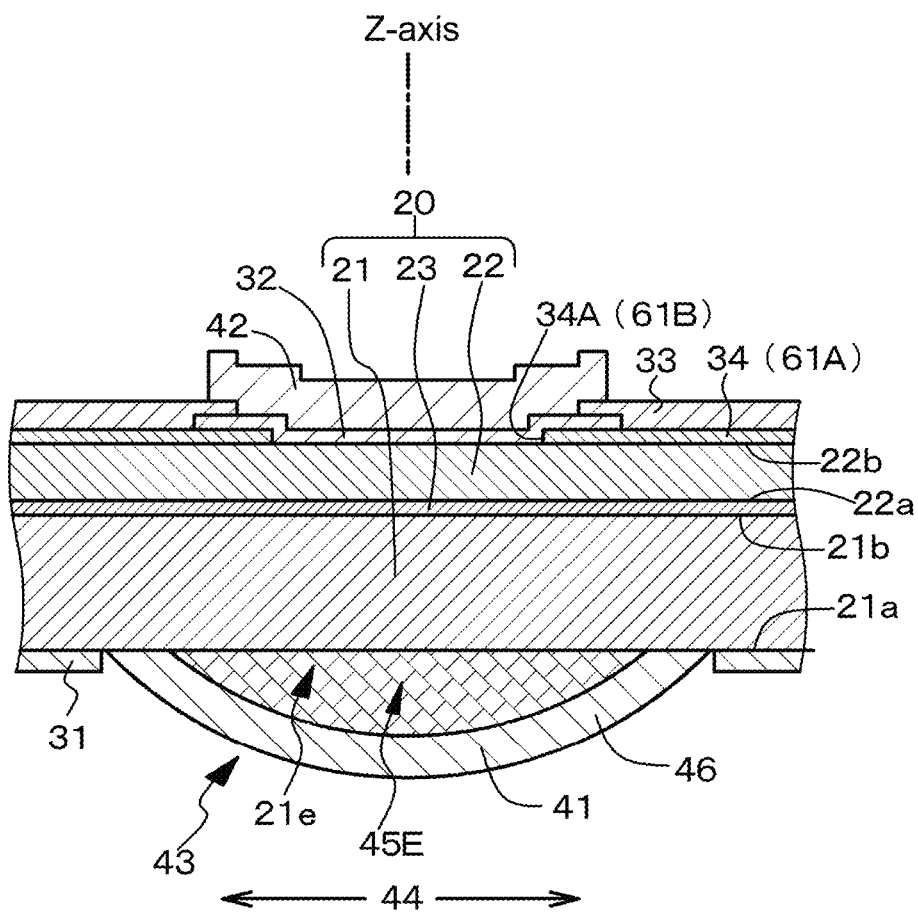
FIG. 12 is a schematic partial end view of a modification example of the light-emitting element of Example 3.

Example 3 is also a modification of Example 1 or Example 2, and relates to the light-emitting element of Configuration 6. In the light-emitting element of Example 3 of which a schematic partial end view is illustrated in FIG. 11, the first light reflection layer 41 is formed on the first surface 21a of the first compound semiconductor layer 21. In manufacturing of the light-emitting element of Example 3, in a process similar to [Process—140] of Example 1, the substrate 11 for manufacturing a light-emitting element is removed to expose the first surface 21a of the first compound semiconductor layer 21. In addition, in a similar manner as in Example 1, a patterned resist layer is formed on the first surface 21a of the first compound semiconductor layer 21 in which a base portion 45D is to be formed, and the resist layer is heated to allow the resist layer to reflow, thereby obtaining a resist pattern. The same shape (or a similar shape) as that of a protruding portion 21d is applied to the resist pattern. In addition, the resist pattern and the first surface 21a of the first compound semiconductor layer 21 are etched back to form the base portion 45D that is the protruding portion 21d in the first surface 21a of the first compound semiconductor layer 21. In addition, in a modification example of the light-emitting element of Example 3 of which a schematic partial end view is illustrated in FIG. 12, for example, a $TiO_2$ layer or a $Ta_2O_5$ layer is formed on the first surface 21a of the first compound semiconductor layer 21, patterned resist layer is formed on the $TiO_2$ layer or the $Ta_2O_5$ layer in which a base portion 45E is to be formed, and the resist layer is heated to allow the resist layer to reflow, thereby obtaining a resist pattern. The same shape (or a similar shape) as a shape of a protruding portion 21e is applied to the resist pattern. In addition, the resist pattern and the $TiO_2$ layer or the $Ta_2O_5$ layer are etched back to form the base portion 45E that is the protruding portion 21e on the first surface 21a of the first compound semiconductor layer 21.

A configuration and a structure of the light-emitting element of Example 3 and the modification example thereof are similar to the configuration and the structure of the light-emitting element of Example 1 or Example 2 except for the above-described configuration, and thus detailed description thereof will be omitted. Provided that, the support substrate 49 or the joining layer 48 may be left without being removed.

Example 4

Example 4 is a modification of Example 3. A schematic partial end view of a light-emitting element of Example 4 is substantially similar to FIG. 12, and a configuration and a structure of the light-emitting element of Example 4 are similar to the configuration and the structure of the light-emitting element of Example 3, and thus detailed description thereof will be omitted.

Figure 13A:
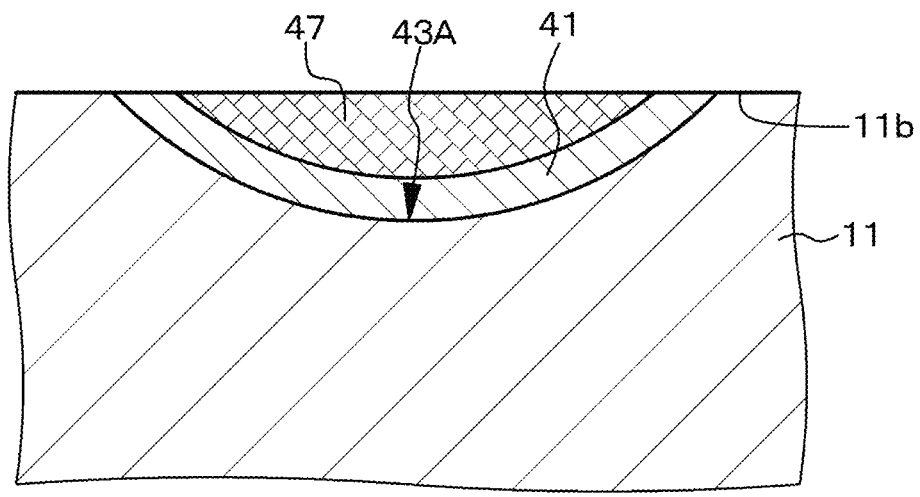
FIG. 13A and FIG. 13B are schematic partial end views of a laminated structure body and the like for illustrating a method of manufacturing a light-emitting element of Example 4.

In Example 4, first, a concave portion 43A for forming the concave mirror portion 43 is formed in the second surface 11b of the substrate 11 for manufacturing a light-emitting element. In addition, the first light reflection layer 41 constituted by a multi-layer film is formed on the second surface 11b of the substrate 11 for manufacturing a light-emitting element, a planarization film 47 is formed on the first light reflection layer 41, a planarization treatment is performed with respect to the planarization film 47 and the first light reflection layer 41 to expose a part of the second surface 11b of the substrate 11 for manufacturing a light-emitting element while remaining the planarization film 47 and the first light reflection layer 41 (refer to FIG. 13A). A planar shape of the first light reflection layer 41 is a circular shape. However, the shape of the first light reflection layer 41 is not limited thereto.

Figure 13B:
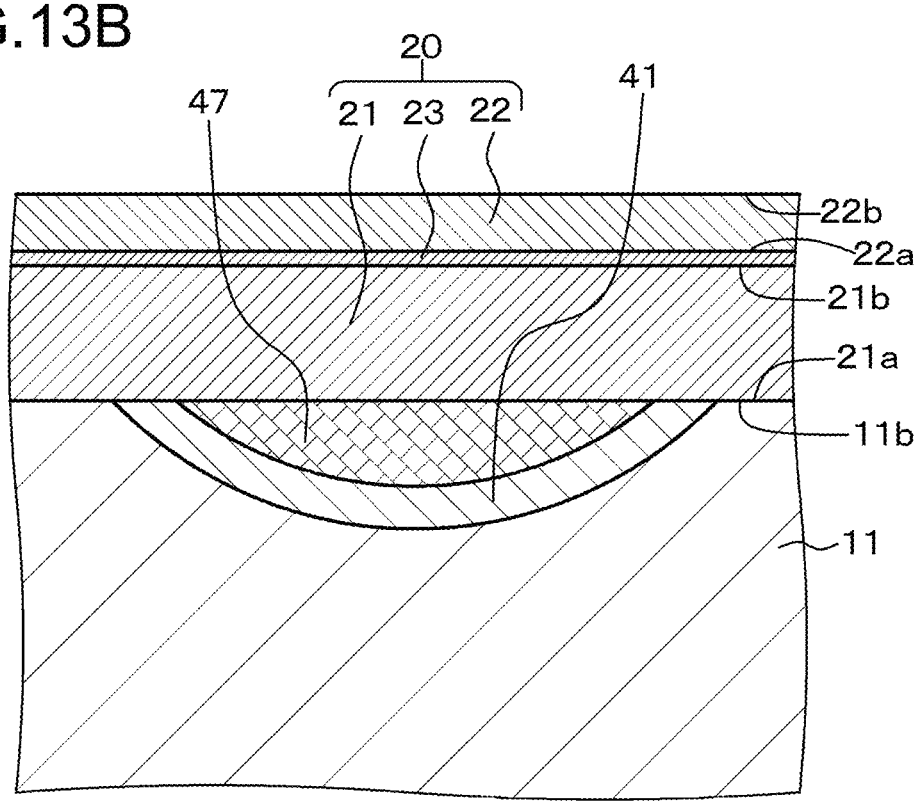

Next, the laminated structure body 20 is formed on the substrate 11 for manufacturing a light-emitting element which includes the first light reflection layer 41 on the basis of lateral direction growth by using a method such as the ELO method in which epitaxial growth occurs in a lateral direction (refer to FIG. 13B). Then, [Process—110] and [Process—120] of Example 1 are executed. In addition, the substrate 11 for manufacturing a light-emitting element is removed, and the first electrode 31 is formed on the exposed first surface 21a of the first compound semiconductor layer 21. Alternatively, the first electrode 31 is formed on the first surface 11a of the substrate 11 for manufacturing a light-emitting element without removing the substrate 11 for manufacturing a light-emitting element. Next, so-called element isolation is performed to separate light-emitting elements from each other, and a lateral surface or an exposed surface of the laminated structure body is covered, for example, with an insulating film formed from $SiO_2$. Next, packaging or sealing is performed to complete the light-emitting element of Example 4.

Example 5

Example 5 is a modification of Example 1 to Example 4, and relates to the light-emitting element of Configuration 1. As described above, the current constriction region (the current injection region 61A and the current non-injection region 61B) is defined by the insulating layer 34 including the opening 34A. That is, the current injection region 61A is defined by the opening 34A. That is, in the light-emitting element of Example 5, the current injection region 61A and the current non-injection region 61B that surrounds the current injection region 61A are provided in the second compound semiconductor layer 22, and a shortest distance $D_{CI}$ from an area central point of the current injection region 61A to a boundary 61C between the current injection region 61A and the current non-injection region 61B satisfies Expression (1-1) and Expression (1-2).

In the light-emitting element of Example 5, a radius $r'_{DBR}$ of an effective region in the concave mirror portion 43 of the first light reflection layer 41 satisfies a relationship of $\omega_0 \leq r'_{DBR} \leq 20 \cdot \omega_0$.

In addition, a relationship of $D_{CI} \geq \omega_0$ is satisfied. In addition, a relationship of $R_{DBR} \leq 1 \times 10^{-3}$ m is satisfied. Specifically, $D_{CI}=4$ µm, $\omega_0=1.5$ µm, $L_{OR}=50$ µm, $R_{DBR}=60$ µm, $\lambda_0=525$ nm can be exemplified. In addition, as a diameter of the opening 34A, 8 µm can be exemplified. As the GaN substrate, a substrate in which a c-plane is inclined in an m-axis direction by approximately 75° is set as a main surface is used. That is, the GaN substrate includes [20-21] plane that is a semi-polarity plane as the main surface. Provided that, the GaN substrate can also be used in other Examples.

A deviation between the central axis (Z-axis) of the concave mirror portion 43 and the current injection region 61A in an XY-plane direction becomes a cause for deteriorating characteristics of the light-emitting element. Both patterning for formation of the concave mirror portion 43 and patterning for formation of the opening 34A frequently use a lithography technology. In this case, a positional relationship greatly deviates in the XY-plane in correspondence with performance of an exposing device. Particularly, positioning of the opening 34A (the current injection region 61A) is performed by performing alignment from a side of the second compound semiconductor layer 22. On the other hand, positioning of the concave mirror portion 43 is performed by performing alignment from a side of the compound semiconductor substrate 11. Here, in the light-emitting element of Example 5, the opening 34A (the current injection region 61) is formed to be greater than a region in which light is narrowed by the concave mirror portion 43. Accordingly, even in a case where a deviation occurs between the central axis (Z-axis) of the concave mirror portion 43 and the current injection region 61A in the XY-plane, a structure that does not influence on oscillation characteristics is realized.

That is, in a case where a region in which light reflected by the first light reflection layer condenses is not included in the current injection region that corresponds to a region in which the active layer has an advantage due to current injection, induced emission of light from a carrier is inhibited, and thus there is a concern that laser oscillation is inhibited. However, when Expressions (1-1) and (1-2) are satisfied, it is possible to guarantee that a region in which light reflected by the first light reflection layer condenses is included in the current injection region, and thus it is possible to reliably accomplish laser oscillation.

Example 6

Figure 14:
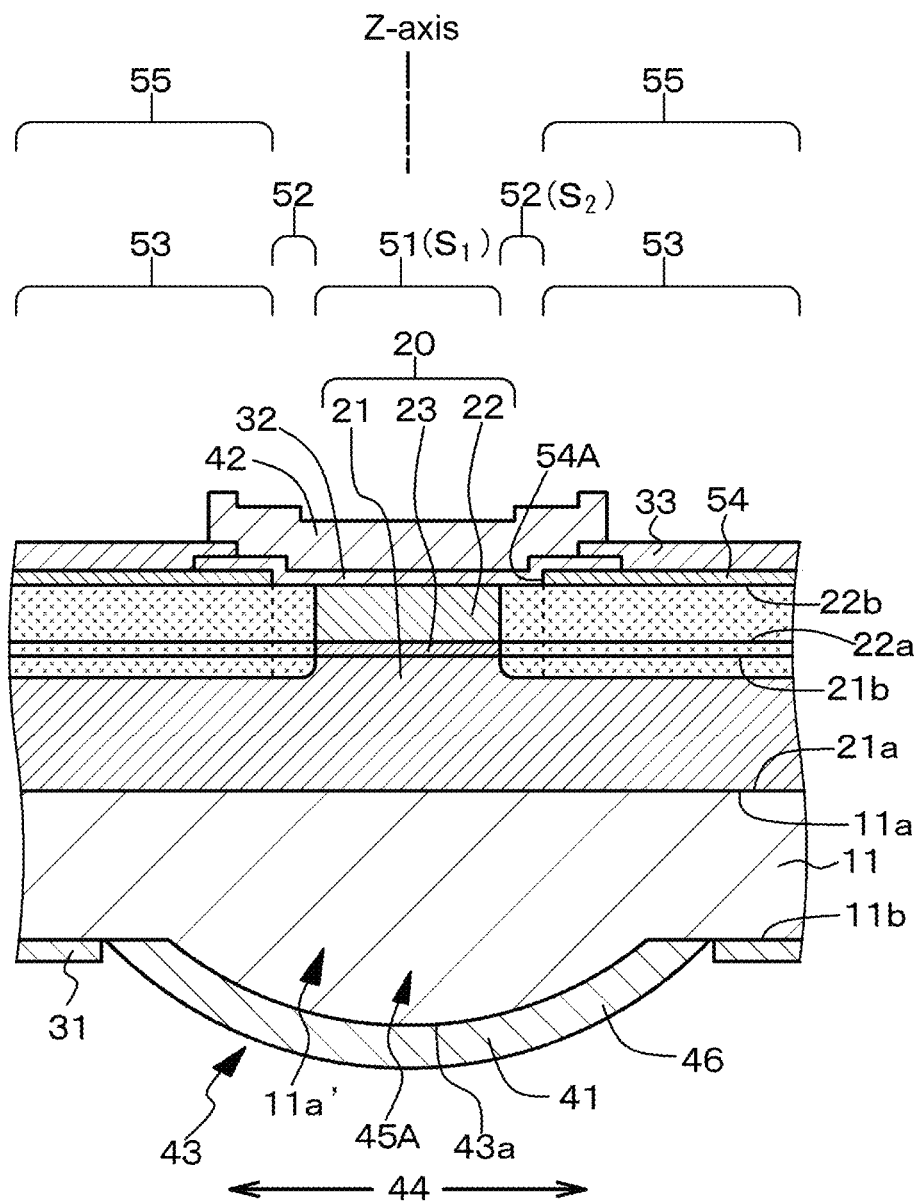
FIG. 14 is a schematic partial end view of a light-emitting element of Example 6.

Example 6 is a modification of Example 1 to Example 5, and relates to the light-emitting element of Configuration 2, specifically, the light-emitting element of Configuration 2-A. A schematic partial end view of the light-emitting element of Example 6 is illustrated in FIG. 14.

However, to control a flow passage (current injection region) of a current that flows between the first electrode and the second electrode, a current non-injection region is formed to surround the current injection region. In a GaAs-based surface light-emitting laser element (surface light-emitting laser element constituted by a GaAs-based compound semiconductor), the active layer is oxidized from an outer side along the XY-plane to form the current non-injection region that surrounds the current injection region. A refractive index of a region (current non-injection region) of the oxidized active layer further decreases in comparison to a refractive index of a region (current injection region) that is not oxidized. As a result, a light path length (expressed by a product of a refractive index and a physical distance) of a resonator is shorter on the current non-injection region in comparison to the current injection region. In addition, according to this, "lens effect" is generated, and leads to an action of trapping laser light in the central portion of the surface light-emitting laser element. Typically, light tends to be broadened due to a diffraction effect, and thus laser light that reciprocates in the resonator is dispersed to the outside of the resonator (diffraction loss), and thus an adverse effect such as an increase of a threshold current is generated. However, the lens effect compensates the diffraction loss, and thus it is possible to suppress the increase of the threshold current and the like.

However, in the light-emitting element constituted by the GaN-based compound semiconductor, it is difficult to oxidize the active layer from an outer side (from a lateral direction) along the XY-plane from the viewpoint of material characteristics. Accordingly, as described in Example 1 to Example 5, the insulating layer 34 that is formed form $SiO_2$ and includes an opening is formed on the second compound semiconductor layer 22, the second electrode 32 formed from a transparent conductive material is formed on the second compound semiconductor layer 22 that is exposed to a bottom portion of the opening 34A and on the insulating layer 34, and the second light reflection layer 42 having a lamination structure of an insulating material is formed on the second electrode 32. When the insulating layer 34 is formed in this manner, the current non-injection region 61B is formed. In addition, a portion of the second compound semiconductor layer 22 which is located in the opening 34A provided in the insulating layer 34 becomes the current injection region 61A.

In a case where the insulating layer 34 is formed on the second compound semiconductor layer 22, a resonator length in the region (current non-injection region 61B) in which the insulating layer 34 is formed becomes longer than a resonator length in a region (current injection region 61A) in which the insulating layer 34 is not formed by an optical thickness of the insulating layer 34. Accordingly, an operation in which laser light that reciprocates in a resonator formed by the two light reflection layers 41 and 42 of the surface light-emitting laser element (light-emitting element) diverges and disperses to the outside of the resonator occurs. The operation is referred to as "reversed lens effect" for convenience. In addition, as a result, oscillation mode loss occurs in laser light and there is a concern that, the threshold current increases or slope efficiency deteriorates. Here, the "oscillation mode loss" is a physical quantity that applies an increase and a decrease to light field intensities of a basic mode and a higher-order mode in oscillating laser light, and a different oscillation mode loss is defined with respect to an individual mode. Provided that, "light field intensity" is a light field intensity when a distance L from the Z-axis in the XY-plane is set as a function. Typically, the light field intensity monotonously decreases as the distance L increases in the basic mode, but the light field intensity decreases in the higher-order mode as the distance L increases while repeating an increase and a decrease once or a plurality of times (refer to a concept diagram of (A) of FIG. 16). Provided that, in FIG. 16, a solid line represents a light field intensity distribution of the basic mode, and a broken line represents a light field intensity distribution of the higher-order mode. In addition, in FIG. 16, the first light reflection layer 41 is illustrated in a flat state for convenience, but actually includes a concave mirror portion.

A light-emitting element of Example 6 or light-emitting elements of Example 7 to Example 10 to be described later includes, (A) the laminated structure body 20 which is formed from a GaN-based compound semiconductor and in which the first compound semiconductor layer 21 including the first surface 21a and the second surface 21b that is opposed to the first surface 21a, the active layer (light-emitting layer) 23 that faces the second surface 21b of the first compound semiconductor layer 21, and the second compound semiconductor layer 22 including the first surface 22a that faces the active layer 23 and the second surface 22b that is opposed to the first surface 22a are laminated, (B) a mode loss operation portion (mode loss operation layer) 54 that is provided on the second surface 22b of the second compound semiconductor layer 22 and constitutes a mode loss operation region 55 that operates on an increase and a decrease of an oscillation mode loss, (C) the second electrode 32 that is formed on the second surface 22b of the second compound semiconductor layer 22 and on the mode loss operation portion 54, (D) the second light reflection layer 42 that is formed on the second electrode 32, (E) the first light reflection layer 41 that is provided on the first surface 21a side of the first compound semiconductor layer 21, and (F) the first electrode 31 that is electrically connected to the first compound semiconductor layer 21.

In addition, a current injection region 51, a current non-injection/inner region 52 that surrounds the current injection region 51, and a current non-injection/outer region 53 that surrounds the current non-injection/inner region 52 are formed in the laminated structure body 20. An orthogonal projection image of the mode loss operation region 55 and an orthogonal projection image of the current non-injection/outer region 53 overlap each other. That is, the current non-injection/outer region 53 is located on a downward side of the mode loss operation region 55. Provided that, in a region that is sufficiently separated from the current injection region 51 to which a current is injected, the orthogonal projection image of the mode loss operation region 55 and the orthogonal projection image of the current non-injection/outer region 53 may not overlap each other. Here, the current non-injection regions 52 and 53 to which a current is not injected are formed in the laminated structure body 20. However, in the example illustrated in the drawing, the current non-injection regions are formed from the second compound semiconductor layer 22 to a part of the first compound semiconductor layer 21 in a thickness direction. However, the current non-injection regions 52 and 53 may be formed in a region of the second compound semiconductor layer 22 on the second electrode side in the thickness direction, may be formed at the entirety of the second compound semiconductor layer 22, or may be formed in the second compound semiconductor layer 22 and the active layer 23.

The mode loss operation portion (mode loss operation layer) 54 is formed from a dielectric material such as $SiO_2$, and is formed between the second electrode 32 and the second compound semiconductor layer 22 in the light-emitting element of Example 6, or in light-emitting elements of Example 7 to Example 10 to be described later. An optical thickness of the mode loss operation portion 54 can be set to a value that deviates from an integral multiple of ¼ of the wavelength $\lambda_0$ of light generated in the light-emitting elements. Alternatively, the optical thickness to of the mode loss operation portion 54 may be set to an integral multiple of ¼ of the wavelength $\lambda_0$ of light generated in the light-emitting elements. That is, the optical thickness to of the mode loss operation portion 54 can be set to a thickness at which a phase of light generated in the light-emitting elements is not disturbed and a standing wave is not disrupted. However, strictly speaking, it is not necessary to be an integral multiple of ¼, and a relationship of $(\lambda_0/4n_0) \times m - (\lambda_0/8n_0)$ to $(\lambda_0/4n_0) \times 2m + (\lambda_0/8n_0)$ may be satisfied. Specifically, when a value of ¼ times of the wavelength of light generated in the light-emitting elements is set as "100", it is desirable that the optical thickness to of the mode loss operation portion 54 is set to approximately 25 to 250. In addition, when employing the configuration, it is possible to change a phase difference (control a phase difference) between laser light that is transmitted through the mode loss operation portion 54 and laser light that is transmitted through the current injection region 51, and it is possible to perform control of oscillation mode loss with higher degree of freedom. As a result, it is possible to further raise the degree of freedom of design of the light-emitting element.

In Example 6, a shape of a boundary between the current injection region 51 and the current non-injection/inner region 52 is set to a circular shape (diameter: 8 μm), and a shape of a boundary between the current non-injection/inner region 52 and the current non-injection/outer region 53 is set to a circular shape (diameter: 12 μm). That is, when an area of an orthogonal projection image of the current injection region 51 is set as Si, and an area of an orthogonal projection image of the current non-injection/inner region 52 is set as $S_2$, a relationship of $0.01 \le S_1/(S_1+S_2) \le 0.7$ is satisfied. Specifically, $S_1/(S_1+S_2)$ is $8^2/12^2 = 0.04$.

In the light-emitting element of Example 6, or the light-emitting elements of Example 7, Example 8, and Example 10, when an optical distance from the active layer 23 in the current injection region 51 to the second surface of the second compound semiconductor layer 22 is set as $L_2$, and an optical distance from the active layer 23 in the mode loss operation region 55 to a top surface (surface that faces the second electrode 32) of the mode loss operation portion 54 is set as $L_0$, a relationship of $L_0 > L_2$ may be satisfied. Specifically, $L_0/L_2$ is set to 1.5. In addition, laser light having a higher-order mode that is generated is dispersed toward an outer side of the resonator structure constituted by the first light reflection layer 41 and the second light reflection layer 42 due to the mode loss operation region 55, and thus an oscillation mode loss increases. That is, light field intensities of the basic mode and the higher-order mode which occur further decrease as it is spaced away from the Z-axis in an orthogonal projection image of the mode loss operation region 55 due to existence of the mode loss operation region 55 that operates on an increase and a decrease of the oscillation mode loss (refer to a concept diagram of (B) of FIG. 16), but a decrease of the light field intensity in the higher-order mode is greater than a decrease of the light field intensity in the basic mode, and thus it is possible to further stabilize the basic mode, it is possible to realize a decrease of a threshold current, and it is possible to increase relative light field intensity of the basic mode. In addition, an edge portion of the light field intensity of the higher-order mode is located at a portion that is further spaced away from the current injection region in comparison to a light-emitting element of the related art (refer to (A) of FIG. 16), and thus it is possible to realize a reduction of an influence of the reversed lens effect. Provided that, in a case where the mode loss operation portion 54 formed from $SiO_2$ is not provided, mixing of oscillation modes occurs.

The first compound semiconductor layer 21 is constituted by an n-GaN layer, the active layer 23 is constituted by a five-layer multiple quantum well structure in which $In_{0.04}Ga_{0.96}N$ layer (barrier layer) and an $In_{0.16}Ga_{0.84}N$ layer (well layer) are laminated, and the second compound semiconductor layer 22 is constituted by a p-GaN layer. In addition, the first electrode 31 is formed from Ti/Pt/Au, and the second electrode 32 is formed from a transparent conductive material, specifically, ITO. A circular opening 54A is formed in the mode loss operation portion 54, and the second compound semiconductor layer 22 is exposed to the bottom of the opening 54A. A pad electrode (not illustrated), which is electrically connected to an external electrode or circuit and is formed from, for example, Ti/Pt/Au or V/Pt/Au, is formed on or connected to an edge portion of the first electrode 31. A pad electrode 33 that is electrically connected to an external electrode or circuit and is formed from, for example, Ti/Pd/Au or Ti/Ni/Au is formed on or connected to an edge portion of the second electrode 32. The first light reflection layer 41 and the second light reflection layer 42 have a lamination structure of a SiN layer and a $SiO_2$ layer (a total number of laminations of a dielectric film: 20 layers).

In the light-emitting element of Example 6, the current non-injection/inner region 52 and the current non-injection/outer region 53 are formed by ion implantation into the laminated structure body 20. As ion species, for example, boron is selected, but there is no limitation to a boron ion.

Hereinafter, an overview of a method of manufacturing the light-emitting element of Example 6 will be described.

[Process—600]

In manufacturing of the light-emitting element of Example 6, first, a process similar to [Process—100] of Example 1 is executed.

[Process—610] Next, the current non-injection/inner region 52 and the current non-injection/outer region 53 are formed in the laminated structure body 20 on the basis of an ion implantation method using a boron ion.

[Process—620]

Figure 15A:
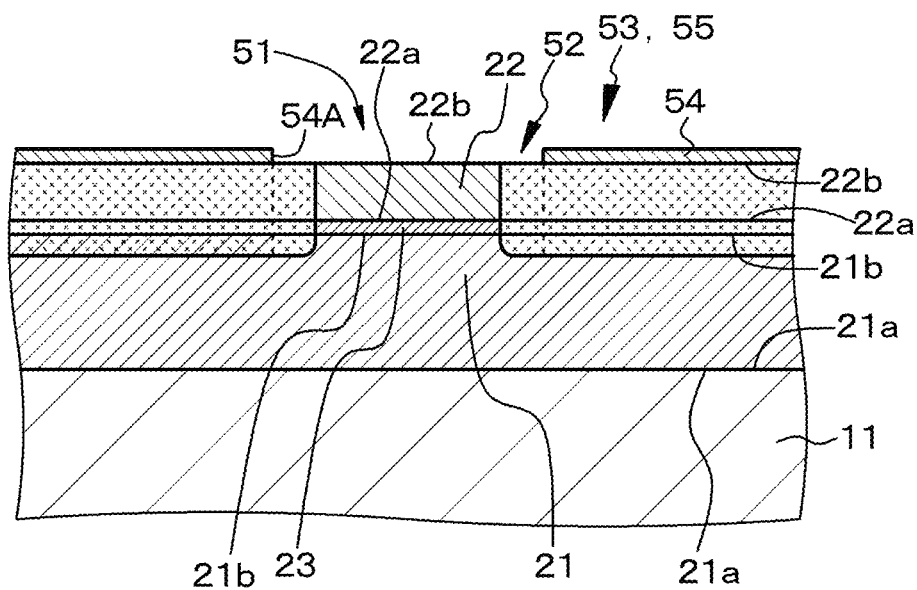
FIG. 15A and FIG. 15B are schematic partial end views of a laminated structure body and the like for illustrating a method of manufacturing the light-emitting element of Example 6.

Next, in a process similar to [Process—110] of Example 1, the mode loss operation portion (mode loss operation layer) 54 that includes the opening 54A and is formed from $SiO_2$ is formed on the second surface 22b of the second compound semiconductor layer 22 on the basis of a known method (refer to FIG. 15A).

[Process—630]

Figure 15B:
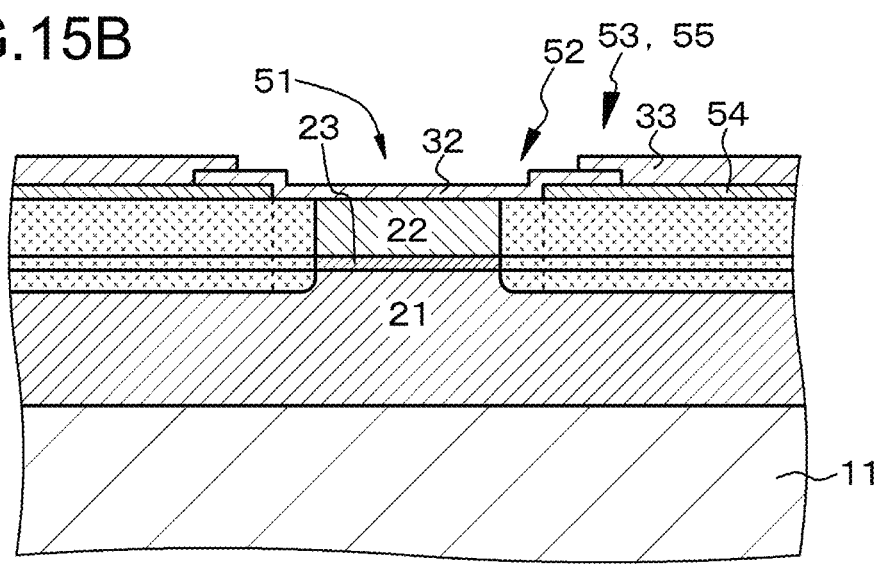

Next, processes similar to [Process—120] to [Process—160] of Example 1 are executed to obtain the light-emitting element of Example 6. Provided that, a structure obtained in the middle of a process similar to [Process—120] is illustrated in FIG. 15B.

In the light-emitting element of Example 6, the current injection region, the current non-injection/inner region that surrounds the current injection region, and the current non-injection/outer region that surrounds the current non-injection/inner region are formed in the laminated structure body, and the orthogonal projection image of the mode loss operation region and the orthogonal projection image of the current non-injection/outer region overlap each other. That is, the current injection region and the mode loss operation region are partitioned (separated from each other) due to the current non-injection/inner region. Accordingly, as illustrated in a concept diagram of (B) of FIG. 16, an increase and a decrease of the oscillation mode loss (specifically, an increase in Example 6) can be set to a desired state. In addition, when a positional relationship between the current injection region and the mode loss operation region, the thickness of the mode loss operation portion that constitutes the mode loss operation region, and the like are appropriately determined, it is possible to set the increase and decrease of the oscillation mode loss to a desired state. As a result, for example, it is possible to solve a problem in a light-emitting element of the related art such things as a threshold current increases and slope efficiency deteriorates. For example, when the oscillation mode loss in the basic mode is decreased, it is possible to realize a decrease of the threshold current. In addition, it is possible to independently control a region to which an oscillation mode loss is applied and a region to which a current is injected and which contributes light-emission, and thus it is possible to independently perform control of the oscillation mode loss and control of light-emitting state of the light-emitting element. As a result, it is possible to raise the degree of control and the degree of freedom of design of the light-emitting element. Specifically, when the current injection region, the current non-injection region, and the mode loss operation region are arranged in the predetermined arrangement relationship, it is possible to control a magnitude relationship of the oscillation mode loss that is provided by the mode loss operation region with respect to the basic mode and the higher-order mode, and the oscillation mode loss that is provided to the higher-order mode is made to be relatively greater than the oscillation mode loss that is provided to the basic mode, and thus it is possible to further stabilize the basic mode. In addition, in the light-emitting element of Example 6, the concave mirror portion 43 is provided, and thus it is possible to further reliably suppress occurrence of a diffraction loss.

Example 7

Example 7 is a modification of Example 6 and relates to the light-emitting element of Configuration 2-B. In the light-emitting element of Example 7 of which a schematic partial cross-sectional view is illustrated in FIG. 17, the current non-injection/inner region 52 and the current non-injection/outer region 53 are formed by plasma irradiation with respect to the second surface of the second compound semiconductor layer 22, an ashing treatment with respect to the second surface of the second compound semiconductor layer 22, or a reactive ion etching (ME) treatment with respect to the second surface of the second compound semiconductor layer 22.

In addition, in this manner, the current non-injection/inner region 52 and the current non-injection/outer region 53 are exposed to plasma particles (specifically, argon, oxygen, nitrogen, and the like), and thus conductivity of the second compound semiconductor layer 22 deteriorates, and the current non-injection/inner region 52 and the current non-injection/outer region 53 enter a high resistance state. That is, The current non-injection/inner region 52 and the current non-injection/outer region 53 are formed by exposure of the second surface 22b of the second compound semiconductor layer 22 to the plasma particles. Provided that, in FIG. 17, FIG. 18, and FIG. 20, illustration of the first light reflection layer 41 is omitted.

Even in Example 7, a shape of a boundary between the current injection region 51 and the current non-injection/inner region 52 is set to a circular shape (diameter: 10 µm), and a shape of a boundary between the current non-injection/inner region 52 and the current non-injection/outer region 53 is set to a circular shape (diameter: 15 µm). That is, when an area of an orthogonal projection image of the current injection region 51 is set as $S_1$, and an area of an orthogonal projection image of the current non-injection/inner region 52 is set as $S_2$, a relationship of $0.01 \le S_1/(S_1+S_2) \le 0.7$ is satisfied. Specifically, $S_1/(S_1+S_2)$ is $10^2/15^2=0.44$.

In Example 7, the current non-injection/inner region 52 and the current non-injection/outer region 53 may be formed in the laminated structure body 20 on the basis of plasma irradiation with respect to the second surface of the second compound semiconductor layer 22, an ashing treatment with respect to the second surface of the second compound semiconductor layer 22, or a reactive ion etching treatment with respect to the second surface of the second compound semiconductor layer 22 instead of [Process—610] of Example 6.

A configuration and a structure of the light-emitting element of Example 7 are similar to the configuration and the structure of the light-emitting element of Example 6 except for the above-described configuration, and thus detailed description thereof will be omitted.

Even in the light-emitting element of Example 7 or Example 8 to be described later, when the current injection region, the current non-injection region, and the mode loss operation region are arranged in the predetermined arrangement relationship, it is possible to control a magnitude relationship of the oscillation mode losses that is provided by the mode loss operation region with respect to the basic mode and the higher-order mode, and the oscillation mode loss that is provided to the higher-order mode is made to be relatively greater than the oscillation mode loss that is provided to the basic mode, and thus it is possible to further stabilize the basic mode.

Example 8

Example 8 is a modification of Example 6 and Example 7, and relates to the light-emitting element of Configuration 2-C. In the light-emitting element of Example 8 of which a schematic partial cross-sectional view is illustrated in FIG. 18, the second light reflection layer 42 includes a region that reflects or scatters light from the first light reflection layer 41 toward an outer side of a resonator structure including the first light reflection layer 41 and the second light reflection layer 42 (that is, toward the mode loss operation region 55). Specifically, a portion of the second light reflection layer 42 which is located on an upward side of a lateral wall of the mode loss operation portion 54 (lateral wall of an opening 54B) has a forward taper-shaped inclination portion 42A, or includes a region that is curved in a convex shape toward the first light reflection layer 41.

In Example 8, a shape of a boundary between the current injection region 51 and the current non-injection/inner region 52 is set to a circular shape (diameter: 8 µm), and a shape of a boundary between the current non-injection/inner region 52 and the current non-injection/outer region 53 is set to a circular shape (diameter: 10 µm to 20 µm).

In Example 8, in a process similar to [Process—620] of Example 6, when forming the mode loss operation portion (mode loss operation layer) 54 that includes the opening 54B and is formed from $SiO_2$, the opening 54B including a forward taper-shaped lateral wall may be formed. Specifically, a resist layer is formed on the mode loss operation layer that is formed on the second surface 22b of the second compound semiconductor layer 22, and an opening is provided in a portion of the resist layer, in which the opening 54B is to be formed, on the basis of a photolithography technology. A lateral wall of the opening is made to be a forward taper shape on the basis of a known method. In addition, etching-back is performed to form the opening 54B including the forward taper-shaped lateral wall in the mode loss operation portion (mode loss operation layer) 54. In addition, the second electrode 32 and the second light reflection layer 42 are formed on the mode loss operation portion (mode loss operation layer) 54 to provide the forward taper-shaped inclination portion 42A in the second light reflection layer 42.

A configuration and a structure of the light-emitting element of Example 8 is similar to the configuration and the structure of the light-emitting elements of Example 6 and Example 7 except for the above-described configuration, and thus description thereof will be omitted.

Example 9

Example 9 is a modification of Example 6 to Example 8, and relates to the light-emitting element of Configuration 2-D. As illustrated in FIG. 19 that illustrates a schematic partial cross-sectional view of the light-emitting element of Example 9, and FIG. 20 that illustrates a cut-out schematic partial cross-sectional view of a main section, a convex portion 22A is formed on the second surface 22b side of the second compound semiconductor layer 22. In addition, as illustrated in FIG. 19 and FIG. 20, the mode loss operation portion (mode loss operation layer) 54 is formed on a region 22B of the second surface 22b of the second compound semiconductor layer 22 which surrounds the convex portion 22A. The convex portion 22A occupies the current injection region 51, the current injection region 51, and the current non-injection/inner region 52. As in Example 6, the mode loss operation portion (mode loss operation layer) 54 is formed from a dielectric material such as SiO$_2$. The current non-injection/outer region 53 is provided in the region 22B. When an optical distance from the active layer 23 in the current injection region 51 to the second surface of the second compound semiconductor layer 22 is set as L$_2$, and an optical distance from the active layer 23 in the mode loss operation region 55 to a top surface (surface that faces the second electrode 32) of the mode loss operation portion 54 is set as L$_0$, a relationship of L$_0$<L$_2$ is satisfied. Specifically, L$_2$/L$_0$ is set to 1.5. According to this, a lens effect occurs in the light-emitting element.

In the light-emitting element of Example 9, laser light having a higher-order mode that is generated can be trapped into the current injection region 51 and the current non-injection/inner region 52 due to the mode loss operation region 55, and thus the oscillation mode loss decreases. That is, light field intensities of the basic mode and the higher-order mode which occur increase in an orthogonal projection image of the current injection region 51 and the current non-injection/inner region 52 due to existence of the mode loss operation region 55 that operates on an increase and a decrease of the oscillation mode loss.

In Example 9, a shape of a boundary between the current injection region 51 and the current non-injection/inner region 52 is set to a circular shape (diameter: 8 μm), and a shape of a boundary between the current non-injection/inner region 52 and the current non-injection/outer region 53 is set to a circular shape (diameter: 30 μm).

In Example 9, a part of the second compound semiconductor layer 22 may be removed on the second surface 22b side between [Process—610] and [Process—620] of Example 6 to form the convex portion 22A.

A configuration and a structure of the light-emitting element of Example 9 are similar to the configuration and the structure of the light-emitting element of Example 6 except for the above-described configuration, and thus detailed description thereof will be omitted. In the light-emitting element of Example 9, it is possible to suppress the oscillation mode loss that is provided by the mode loss operation region with respect to various modes, a lateral mode can be performed in a multi-mode oscillation, and a threshold value of laser oscillation can be reduced. In addition, as illustrated in a concept diagram of (C) of FIG. 16, light field intensities of the basic mode and the higher-order mode which occur can be increased in an orthogonal projection image of the current injection region and the current non-injection/inner region due to existence of the mode loss operation region that operates on an increase and a decrease of the oscillation mode loss (specifically, a decrease in Example 9).

Example 10

Example 10 is a modification of Example 6 to Example 9. More specifically, a light-emitting element of Example 10 or Example 11 to be described later is constituted by a surface light-emitting laser element (light-emitting element) (vertical resonator laser, VCSEL) that emits laser light from a top surface of the first compound semiconductor layer 21 through the first light reflection layer 41.

In the light-emitting element of Example 10 of which a schematic partial cross-sectional view is illustrated in FIG. 21, the second light reflection layer 42 is fixed to a support substrate 49 constituted by a silicon semiconductor substrate through the joining layer 48 that is constituted by a gold (Au) layer or a solder layer including tin (Sn) on the basis of a soldering method. In manufacturing of the light-emitting element of Example 10, for example, processes similar to [Process—600] to [Process—630] of Example 6 may be executed except for removal of the support substrate 49, that is, without removing the support substrate 49.

Even in the light-emitting element of Example 10, when the current injection region, the current non-injection region, and the mode loss operation region are arranged in the predetermined arrangement relationship, it is possible to control a magnitude relationship of the oscillation mode loss that is provided by the mode loss operation region with respect to the basic mode and the higher-order mode, and the oscillation mode loss that is provided to the higher-order mode is made to be relatively greater than the oscillation mode loss that is provided to the basic mode, and thus it is possible to further stabilize the basic mode.

In an example of the light-emitting element illustrated in FIG. 21, an end of the first electrode 31 is spaced away from the first light reflection layer 41. That is, the first light reflection layer 41 and the first electrode 31 are spaced away from each other, in order words, have an offset, and a separation distance is set within 1 mm, specifically, an average of the separation distance is, for example, 0.05 mm. However, there is no limitation to the structure, and the end of the first electrode 31 may in contact with the first light reflection layer 41, or the end of the first electrode 31 may be formed over an edge of the first light reflection layer 41.

In addition, after executing processes similar to [Process—600] to [Process—630] of Example 6, the substrate 11 for manufacturing a light-emitting element may be removed to expose the first surface 21a of the first compound semiconductor layer 21, and the first light reflection layer 41 and the first electrode 31 may be formed on the first surface 21a of the first compound semiconductor layer 21. In addition, when forming the first light reflection layer 41 on the first surface 21a of the first compound semiconductor layer 21, the first compound semiconductor layer 21 may be etched to form a recess in the first surface 21a of the first compound semiconductor layer 21, and the first light reflection layer 41 may be formed in the recess. In addition, in this case, when a lateral wall of the recess is set to the forward taper shape, it is possible to obtain the light-emitting element of Configuration 2-C. That is, the first light reflection layer 41 includes a region (inclination region) that reflects or scatters light from the second light reflection layer 42 to an outer side of a resonator structure including the first light reflection layer 41 and the second light reflection layer 42.

Example 11

Example 11 is a modification of Example 1 to Example 5, and relates to the light-emitting element of Configuration 3, specifically the light-emitting element of Configuration 3-A. More specifically, the light-emitting element of Example 11 is constituted by a surface light-emitting laser element (light-emitting element) (vertical resonator laser, VCSEL) that emits laser light from a top surface of the first compound semiconductor layer 21 through the first light reflection layer 41.

The light-emitting element of Example 11 of which a schematic partial end view is illustrated in FIG. 22 includes, (a) the laminated structure body 20 in which the first compound semiconductor layer 21 that is formed from a GaN-based compound semiconductor and includes the first surface 21a and the second surface 21b that is opposed to the first surface 21a, the active layer (light-emitting layer) 23 that is formed from a GaN-based compound semiconductor and is in contact with the second surface 21b of the first compound semiconductor layer 21, and the second compound semiconductor layer 22 which is formed from a GaN-based compound semiconductor and includes the first surface 22a and the second surface 22b that is opposed to the first surface 22a, and in which the first surface 22a is in contact with the active layer 23 are laminated, (b) the second electrode 32 that is formed on the second surface 22b of the second compound semiconductor layer 22, (c) the second light reflection layer 42 that is formed on the second electrode 32, (d) a mode loss operation portion 64 that is provided on the first surface 21a of the first compound semiconductor layer 21, and constitutes a mode loss operation region 65 operating on an increase and a decrease of the oscillation mode loss, (e) the first light reflection layer 41 that is formed on the first surface 21a of the first compound semiconductor layer 21 and on the mode loss operation portion 64, and (f) the first electrode 31 that is electrically connected to the first compound semiconductor layer 21. Provided that, in the light-emitting element of Example 11, the first electrode 31 is formed on the first surface 21a of the first compound semiconductor layer 21.

A current injection region 61, a current non-injection/inner region 62 that surrounds the current injection region 61, and a current non-injection/outer region 63 that surrounds the current non-injection/inner region 62 are formed in the laminated structure body 20, and an orthogonal projection image of the mode loss operation region 65 and an orthogonal projection image of the current non-injection/outer region 63 overlap each other. Here, the current non-injection regions 62 and 63 are formed in the laminated structure body 20, but in an example illustrated in the drawing, the current non-injection regions 62 and 63 are formed from the second compound semiconductor layer 22 to a part of the first compound semiconductor layer 21 in a thickness direction. However, the current non-injection regions 62 and 63 may be formed in a region of the second compound semiconductor layer 22 on the second electrode side in the thickness direction, may be formed at the entirety of the second compound semiconductor layer 22, or may be formed in the second compound semiconductor layer 22 and the active layer 23.

Configurations of the laminated structure body 20, the pad electrode 33, the first light reflection layer 41, and the second light reflection layer 42 may be similar to those in Example 6, and configurations of the joining layer 48 and the support substrate 49 may be similar to those in Example 10. A circular opening 64A is formed in the mode loss operation portion 64, and the first surface 21a of the first compound semiconductor layer 21 is exposed to the bottom of the opening 64A.

The mode loss operation portion (mode loss operation layer) 64 is formed from a dielectric material such as $SiO_2$, and is formed on the first surface 21a of the first compound semiconductor layer 21. An optical thickness to of the mode loss operation portion 64 may be set to a value that deviates from an integral multiple of ¼ of a wavelength $\lambda_0$ of light that is generated in the light-emitting element. In addition, the optical thickness to of the mode loss operation portion 64 may be set to an integral multiple of ¼ of the wavelength $\lambda_0$ of light that is generated in the light-emitting element. That is, the optical thickness to of the mode loss operation portion 64 may be set to a thickness at which a phase of light generated in the light-emitting element is not disturbed and thus a standing wave is not disrupted. However, strictly speaking, it is not necessary to be an integral multiple of ¼, and a relationship of $(\lambda_0/4n_0) \times m - (\lambda_0/8n_0)$ to $(\lambda_0/4n_0) \times 2m + (\lambda_0/8n_0)$ may be satisfied. Specifically, when a value of ¼ times of the wavelength $\lambda_0$ of light generated in the light-emitting elements is set as "100", it is desirable that the optical thickness to of the mode loss operation portion 64 is set to approximately 25 to 250. In addition, when employing the configuration, it is possible to change a phase difference (control a phase difference) between laser light that is transmitted through the mode loss operation portion 64 and laser light that is transmitted through the current injection region 61, and it is possible to perform control of oscillation mode loss with higher degree of freedom. As a result, it is possible to further raise the degree of freedom of design of the light-emitting element.

In Example 11, a shape of a boundary between the current injection region 61 and the current non-injection/inner region 62 is set to a circular shape (diameter: 8 μm), and a shape of a boundary between the current non-injection/inner region 62 and the current non-injection/outer region 63 is set to a circular shape (diameter: 15 μm). That is, when an area of an orthogonal projection image of the current injection region 61 is set as $S_1'$, and an area of an orthogonal projection image of the current non-injection/inner region 62 is set as $S_2'$, a relationship of $0.01 \leq S_1'/(S_1'+S_2') \leq 0.7$ is satisfied. Specifically, $S_1'/(S_1'+S_2')$ is $8^2/15^2 = 0.28$.

In the light-emitting element of Example 11, when an optical distance from the active layer 23 in the current injection region 61 to the first surface of the first compound semiconductor layer 21 is set as $L_1'$, and an optical distance from the active layer 23 in the mode loss operation region 65 to a top surface (surface that faces the first electrode 31) of the mode loss operation portion 64 is set as $L_0'$, a relationship of $L_0' > L_1'$ may be satisfied. Specifically, $L_0'/L_1'$ is set to 1.01. In addition, laser light having a higher-order mode that is generated is dispersed toward an outer side of the resonator structure constituted by the first light reflection layer 41 and the second light reflection layer 42 due to the mode loss operation region 65, and thus an oscillation mode loss increases. That is, light field intensities of the basic mode and the higher-order mode which occur further decrease as it is spaced away from the Z-axis in an orthogonal projection image of the mode loss operation region 65 due to existence of the mode loss operation region 65 that operates on an increase and a decrease of the oscillation mode loss (refer to a concept diagram of (B) of FIG. 16), but a decrease of the light field intensity in the higher-order mode is greater than a decrease of the light field intensity in the basic mode, and thus it is possible to further stabilize the basic mode, it is possible to realize a decrease of a threshold current, and it is possible to increase relative light field intensity of the basic mode.

In the light-emitting element of Example 11, the current non-injection/inner region 62 and the current non-injection/outer region 63 are formed by ion implantation into the laminated structure body 20 in a similar manner as in Example 6. As ion species, for example, boron is selected, but there is no limitation to a boron ion.

Hereinafter, a method of manufacturing the light-emitting element of Example 11 will be described.

[Process—1100]

First, a process similar to [Process—600] of Example 6 is executed to obtain the laminated structure body 20. Next, a process similar to [Process—610] of Example 6 is executed to form the current non-injection/inner region 62 and the current non-injection/outer region 63 in the laminated structure body 20.

[Process—1110]

Next, the second electrode 32 is formed on the second surface 22b of the second compound semiconductor layer 22, for example, on the basis of a lift-off method, and the pad electrode 33 is formed on the basis of a known method. Next, the second light reflection layer 42 is formed on the second electrode 32 and on the pad electrode 33 on the basis of known method.

[Process—1120]

Next, the second light reflection layer 42 is fixed to the support substrate 49 through the joining layer 48.

[Process—1130]

Next, the substrate 11 for manufacturing a light-emitting element is removed to expose the first surface 21a of the first compound semiconductor layer 21. Specifically, the thickness of the substrate 11 for manufacturing a light-emitting element is made to be thin on the basis of a mechanical polishing method, and the remainder of the substrate 11 for manufacturing a light-emitting element is removed on the basis of a CMP method. In this manner, the first surface 21a of the first compound semiconductor layer 21 is exposed.

[Process—1140]

Next, the mode loss operation portion (mode loss operation layer) 64 that includes the opening 64A and is formed form $SiO_2$ is formed on the first surface 21a of the first compound semiconductor layer 21 on the basis of a known method.

[Process—1150]

Next, the first light reflection layer 41 constituted by the concave mirror portion 43 including a base portion 45F and a multi-layer light reflection film 46 is formed on the first surface 21a of the first compound semiconductor layer 21 that is exposed to the bottom of the opening 64A of the mode loss operation portion 64, and the first electrode 31 is formed on the first surface 21a. In this manner, the light-emitting element of Example 11 which has a structure illustrated in FIG. 22 can be obtained.

[Process—1160]

Next, so-called element isolation is performed to separate light-emitting elements from each other, and a lateral surface or an exposed surface of the laminated structure body is covered, for example, with an insulating film formed from $SiO_2$. Next, packaging or sealing is performed to complete the light-emitting element of Example 11.

Even in the light-emitting element of Example 11, the current injection region, the current non-injection/inner region that surrounds the current injection region, and the current non-injection/outer region that surrounds the current non-injection/inner region are formed in the laminated structure body, and an orthogonal projection image of the mode loss operation region and an orthogonal projection image of the current non-injection/outer region overlap each other. Accordingly, as illustrated in a concept diagram of (B) of FIG. 16, an increase and a decrease of the oscillation mode loss (specifically, an increase in Example 11) can be set to a desired state. In addition, it is possible to independently perform control of the oscillation mode loss and control of light-emitting state of the light-emitting element. As a result, it is possible to raise the degree of freedom of control and the degree of freedom of design of the light-emitting element. Specifically, when the current injection region, the current non-injection region, and the mode loss operation region are arranged in the predetermined arrangement relationship, it is possible to control a magnitude relationship of the oscillation mode loss that is provided by the mode loss operation region with respect to the basic mode and the higher-order mode, and the oscillation mode loss that is provided to the higher-order mode is made to be relatively greater than the oscillation mode loss that is provided to the basic mode, and thus it is possible to further stabilize the basic mode. In addition, it is possible to realize a reduction of an influence of the reversed lens effect. Provided that, in the light-emitting element of Example 11, the concave mirror portion 43 is provided, and thus it is possible to further reliably suppress occurrence of a diffraction loss.

Even in Example 11, as in Example 7, the current non-injection/inner region 62 and the current non-injection/outer region 63 are formed by plasma irradiation with respect to the second surface of the second compound semiconductor layer 22, an ashing treatment with respect to the second surface of the second compound semiconductor layer 22, or a reactive ion etching (RIE) treatment with respect to the second surface of the second compound semiconductor layer 22 (light-emitting element of Configuration 3-B). In this manner, the current non-injection/inner region 62 and the current non-injection/outer region 63 are exposed to plasma particles, and thus conductivity of the second compound semiconductor layer 22 deteriorates, and the current non-injection/inner region 62 and the current non-injection/outer region 63 enter a high resistance state. That is, The current non-injection/inner region 62 and the current non-injection/outer region 63 are formed by exposure of the second surface 22b of the second compound semiconductor layer 22 to the plasma particles.

In addition, as in Example 8, the second light reflection layer 42 can be set to a configuration including a region that reflects or scatters light from the first light reflection layer 41 to an outer side of a resonator structure including the first light reflection layer 41 and the second light reflection layer 42 (that is, toward the mode loss operation region 65) (light-emitting element of Configuration 3-C). In addition, as in Example 10, when forming the first light reflection layer 41 on the first surface 21a of the first compound semiconductor layer 21, the first compound semiconductor layer 21 is etched to form a concave portion in the first surface 21a of the first compound semiconductor layer 21, and the first light reflection layer 41 is formed in the concave portion, but a lateral wall of the concave portion may be set to a forward taper shape.

In addition, as in Example 9, a convex portion may be formed on the first surface 21a side of the first compound semiconductor layer 21, and the mode loss operation portion (mode loss operation layer) 64 may be formed on a region of the first surface 21a of the first compound semiconductor layer 21 which surrounds the convex portion (light-emitting element of Configuration 3-D). The mode loss operation portion (mode loss operation layer) 64 may be formed on a region of the first surface 21a of the first compound semiconductor layer 21 which surrounds the convex portion. The convex portion occupies the current injection region 61, the current injection region 61, and the current non-injection/inner region 62. In addition, according to this, laser light having a higher-order mode that is generated can be trapped into the current injection region 61 and the current non-injection/inner region 62 due to the mode loss operation region 65, and thus the oscillation mode loss decreases. That is, light field intensities of the basic mode and the higher-order mode which occur increase in an orthogonal projection image of the current injection region 61 and the current non-injection/inner region 62 due to existence of the mode loss operation region 65 that operates on an increase and a decrease of the oscillation mode loss. Even in the modification example of the light-emitting element of Example 11 which has the above-described configuration, it is possible to suppress the oscillation mode loss that is provided by the mode loss operation region 65 with respect to various modes, a lateral mode can be performed in a multi-mode oscillation, and a threshold value of laser oscillation can be reduced. In addition, as illustrated in a concept diagram of (C) of FIG. 16, light field intensities of the basic mode and the higher-order mode which occur can be increased in an orthogonal projection image of the current injection region and the current non-injection/inner region due to existence of the mode loss operation region 65 that operates on an increase and a decrease of the oscillation mode loss (specifically, a decrease in the modification example of the light-emitting element of Example 11).

In some cases, a convex portion (mesa structure) may be formed on the first surface 21a side of the first compound semiconductor layer 21, and a region of the first compound semiconductor layer 21 which surrounds the convex portion may be set as the mode loss operation region (mode loss operation portion). That is, in this case, formation of the mode loss operation layer may be omitted, and the mode loss operation portion may be constituted by the region of the first compound semiconductor layer which surrounds the convex portion. In addition, the first light reflection layer 41 may be formed on a top surface of the convex portion. The convex portion occupies the current injection region 61, the current injection region 61, and the current non-injection/inner region 62. In addition, according to this, laser light having a higher-order mode that is generated can be trapped into the current injection region 61 and the current non-injection/inner region 62 due to the mode loss operation region, and thus the oscillation mode loss decreases. That is, light field intensities of the basic mode and the higher-order mode which occur increase in an orthogonal projection image of the current injection region 61 and the current non-injection/inner region 62 due to existence of the mode loss operation region that operates on an increase and a decrease of the oscillation mode loss. Even in the modification example of the light-emitting element of Example 11 which has the above-described configuration, it is possible to suppress the oscillation mode loss that is provided by the mode loss operation region with respect to various modes, a lateral mode can be performed in a multi-mode oscillation, and a threshold value of laser oscillation can be reduced. In addition, as illustrated in a concept diagram of (C) of FIG. 16, light field intensities of the basic mode and the higher-order mode which occur can be increased in an orthogonal projection image of the current injection region and the current non-injection/inner region due to existence of the mode loss operation region that operates on an increase and a decrease of the oscillation mode loss (specifically, a decrease in the modification example of the light-emitting element of Example 11).

Example 12

Example 12 is a modification of Example 1 to Example 11, and relates to a light-emitting element of Configuration 4.

However, with regard to the resonator length $L_{OR}$ in the laminated structure body constituted by two DBR layers and a laminated structure body formed therebetween, when an equivalent refractive index of the entirety of the laminated structure body is set as $n_{eq}$, and a wavelength of laser light to be emitted from the surface light-emitting laser element (light-emitting element) is set as $\lambda_0$, the resonator length $L_{OR}$ is expressed by $L=(m\cdot\lambda_0)/(2\cdot n_{eq})$. Here, m is a positive integer. In addition, in the surface light-emitting laser element (light-emitting element), an oscillation-possible wavelength is determined by the resonator length $L_{OR}$. An oscillation-possible individual oscillation mode is referred to as a vertical mode. A wavelength that matches a gain spectrum that is determined by an active layer in the vertical mode can be subjected to laser oscillation. When an effective refractive index is set as $n_{eff}$, an interval $\Delta\lambda$ of the vertical mode is expressed by $\lambda_0^2/(2n_{eff}L)$. That is, the longer the resonator length $L_{OR}$ is, the narrower the interval $\Delta\lambda$ of the vertical mode is. Accordingly, in a case where the resonator length $L_{OR}$ is long, a plurality of vertical modes can exist in the gain spectrum, and thus the plurality of vertical modes can oscillate. Provided that, when an oscillation wavelength is set as $\lambda_0$, the equivalent refractive index $n_{eq}$ and the effective refractive index $n_{eff}$ have the following relationship.

$$n_{eff}=n_{eq}-\lambda_0\cdot(dn_{eq}/d\lambda_0)$$

Here, in a case where the laminated structure body is constituted by a GaAs-based compound semiconductor layer, the resonator length $L_{OR}$ is typically as short as 1 μm or less, and vertical-mode laser light emitted from a surface light-emitting laser element is one kind (one wavelength) (refer to a concept diagram of FIG. 30A). Accordingly, it is possible to accurately control an oscillation wavelength of the vertical-mode laser light emitted from the surface light-emitting laser element. On the other hand, in a case where the laminated structure body is constituted by a GaN-based compound semiconductor layer, the resonator length $L_{OR}$ is typically as long as several times a wavelength of laser light emitted from the surface light-emitting laser element. Accordingly, a plurality of kinds of vertical-mode laser light are emitted from the surface light-emitting laser element (refer to a concept diagram of FIG. 30B), and thus it is difficult to accurately control the oscillation wavelength of the laser light that can be emitted from the surface light-emitting laser element.

In the light-emitting element of Example 12, or the following light-emitting elements of Example 13 to Example 15 of which a schematic partial cross-sectional view is illustrated in FIG. 23, at least two layers of light absorption material layers 71, desirably at least four layers of the light absorption material layers 71, and specifically, twenty layers of the light absorption material layers 71 in Example 12 are formed in the laminated structure body 20 including the second electrode 32 to be parallel to a virtual plane that is occupied by the active layer 23. Provided that, only two layers of the light absorption material layers 71 are illustrated in the drawing for simplification of the drawing.

In Example 12, the oscillation wavelength (desired oscillation wavelength emitted from the light-emitting element) $\lambda_0$ is 450 nm. Twenty layers of the light absorption material layers 71 is formed from a compound semiconductor material having a bandgap narrower than that of the compound semiconductor that constitutes the laminated structure body 20, specifically, n-$In_{0.2}Ga_{0.8}N$, and is formed inside the first compound semiconductor layer 21. The thickness of each of the light absorption material layers 71 is $\lambda_0/(4\cdot neq)$ or less, specifically, 3 nm. In addition, a light absorption coefficient of the light absorption material layer 71 is two or more times, specifically, $1\times10^3$ times a light absorption coefficient of the first compound semiconductor layer 21 formed from the n-GaN layer.

In addition, the light absorption material layers 71 are located at a portion with the minimum amplitude that occurs in a standing wave of light which is formed inside the laminated structure body, and the active layer 23 is located at a portion with the maximum amplitude that occurs in a standing wave of light which is formed inside the laminated structure body. A distance between the center of the active layer 23 in a thickness direction, and the center of the light absorption material layer 71 adjacent to the active layer 23 in a thickness direction is 46.5 nm. In addition, an equivalent refractive index of the entirety of two layers of the light absorption material layers 71, and a portion (specifically, in Example 12, the first compound semiconductor layer 21) of the laminated structure body which is located between the light absorption material layers 71 is set as $n_{eq}$, and a distance between the light absorption material layers 71 is set as $L_{Abs}$, a relationship of $0.9 \times \{(m \cdot \lambda_0)/(2 \cdot n_{eq})\} \leq L_{Abs} \leq 1.1 \times \{(m \cdot \lambda_0)/(2 \cdot n_{eq})\}$ is satisfied. Here, m is 1 or an arbitrary integer of 2 or greater (including 1). Provided that, in Example 12, m is set to 1. Accordingly, in all of a plurality of the light absorption material layers 71 (twenty layers of the light absorption material layers 71), a distance between the light absorption material layers 71 adjacent to each other satisfies a relationship of $0.9 \times \{\lambda_0/(2 \cdot n_{eq})\} \leq L_{Abs} \leq 1.1 \times \{\lambda_0/(2 \cdot n_{eq})\}$. Specifically, a value of the equivalent refractive index $n_{eq}$ is 2.42. When m is set to 1, specifically, $L_{Abs} = 1 \times 450/(2 \times 2.42) = 93.0$ nm. Provided that, in partial light absorption material layers 71 among the twenty layers of light absorption material layers 71, m may be set to an arbitrary integer of 2 or greater.

In manufacturing of the light-emitting element of Example 12, the laminated structure body 20 is formed in a process similar to [Process—100] of Example 1. However, at this time, the twenty layers of light absorption material layers 71 are formed in combination at the inside of the first compound semiconductor layer 21. The light-emitting element of Example 12 can be manufactured in a method similar to the method of manufacturing the light-emitting element of Example 1 except for the above-described configuration.

In a case where a plurality of vertical modes in a gain spectrum that is determined by the active layer 23, this case may be schematically illustrated in FIG. 24. Provided that, in FIG. 24, two vertical modes including a vertical mode A and a vertical mode B are illustrated in the drawing. In addition, in this case, when it is assumed that the light absorption material layer 71 is located at a lowest amplitude portion of the vertical mode A, and is not located at a lowest amplitude portion of the vertical mode B, a mode loss of the vertical mode A is minimized, but a mode loss of the vertical mode B is great. In FIG. 24, the mode loss of the vertical mode B is schematically illustrated by a solid-line. Accordingly, the vertical mode A is more likely to oscillate in comparison to the vertical mode B. Accordingly, a specific vertical mode can be stabilized by using the structure, that is, by controlling a position of the light absorption material layer 71 or a period, and oscillation can easily occur. On the other hand, it is possible to increase a mode loss with respect to the other vertical modes which are not desired, and thus it is possible to suppress oscillation of the other vertical modes which are not desired.

As described above, in the light-emitting element of Example 12, at least two layers of light absorption material layers are formed inside the laminated structure body, and thus it is possible to suppress oscillation of laser light of vertical modes which are not desired among a plurality of vertical modes of laser light that can be emitted from the surface light-emitting laser element. As a result, it is possible to accurately control the oscillation wavelength of the laser light that is emitted. Provided that, in the light-emitting element of Example 12, the concave mirror portion 43 is provided, and thus it is possible to reliably suppress occurrence of a diffraction loss.

Example 13

Example 13 is a modification of Example 12. In Example 12, the light absorption material layer 71 is constituted by a compound semiconductor material having a bandgap that is narrower than that of the compound semiconductor that constitutes the laminated structure body 20. On the other hand, in Example 13, ten layers of the light absorption material layers 71 are constituted by an impurity-doped compound semiconductor material, specifically, a compound semiconductor material having an impurity concentration (impurity: Si) of $1 \times 10^{19}/cm^3$ (specifically, n-GaN: Si). In addition, in Example 13, the oscillation wavelength $\lambda_0$ is set to 515 nm. Provided that, a composition of the active layer 23 is $In_{0.3}Ga_{0.7}N$. In Example 13, m is set to 1, a value of $L_{Abs}$ is 107 nm, a distance between the center of the active layer 23 in a thickness direction and the center of a light absorption material layer 71 adjacent to the active layer 23 in a thickness direction is 53.5 nm, and the thickness of each of the light absorption material layers 71 is 3 nm. A configuration and a structure of the light-emitting element of Example 13 are similar to the configuration and structure of the light-emitting element of Example 12 except for the above-described configuration, and detailed description thereof will be omitted. Provided that, in partial light absorption material layers 71 among the ten layers of light absorption material layers 71, m may be set to an arbitrary integer of 2 or greater.

Example 14

Example 14 is also a modification of Example 12. In Example 14, five layers of light absorption material layers (for convenience, referred to as "first light absorption material layers") are set to a configuration similar to the configuration of the light absorption material layers 71 of Example 12, that is, n-$In_{0.3}Ga_{0.7}N$. In addition, in Example 14, one layer of light absorption material layer (for convenience, referred to as "second light absorption material layer") is constituted by a transparent conductive material. Specifically, the second light absorption material layer also functions as the second electrode 32 formed from ITO. In Example 14, the oscillation wavelength $\lambda_0$ is set to 450 nm. In addition, m is set to 1 and 2. In a case where m is 1, a value of $L_{Abs}$ is 93.0 nm, a distance between the center of the active layer 23 in a thickness direction, and the center of a light absorption material layer 71 adjacent to the active layer 23 in a thickness direction is 46.5 nm, and the thickness of each of the five layers of first light absorption material layers is 3 nm. That is, in the five layers of first light absorption material layers, a relationship of $0.9 \times \{\lambda_0/(2 \cdot n_{eq})\} \leq L_{Abs} \leq 1.1 \times \{\lambda_0/(2 \cdot n_{eq})\}$ is satisfied. In addition, in a first light absorption material layer adjacent to the active layer 23, and the second light absorption material layer, m is set to 2. That is, a relationship of $0.9 \times \{(2 \cdot \lambda_0)/(2 \cdot n_{eq})\} \leq L_{Abs} \leq 1.1 \times \{(2 \cdot \lambda_0)/(2 \cdot n_{eq})\}$ is satisfied. A light absorption coefficient of the one layer of second light absorption material layer that also functions as the second electrode 32 is 2000 $cm^{-1}$, the thickness thereof is 30 nm, and a distance from the active layer 23 to the second light absorption material layer is 139.5 nm. A configuration and a structure of the light-emitting element of Example 14 are similar to the configuration and the structure of the light-emitting element of Example 12 except for the above-described configuration, and thus detailed description thereof will be omitted. Provided that, in partial first light absorption material layers among the five layers of first light absorption material layers, m may be set to an arbitrary integer of 2 or greater. Provided that, the number of the light absorption material layers 71 may be set to 1 differently from Example 12. Even in this case, it is necessary for a positional relationship between the second light absorption material layer that also functions as the second electrode 32, and the light absorption material layers 71 to satisfy the following Expression.

$$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

Example 15

Example 15 is a modification of Example 12 to Example 14. More specifically, a light-emitting element of Example 15 is constituted by a surface light-emitting laser element (vertical resonator laser, VCSEL) that emits laser light from a top surface of the first compound semiconductor layer 21 through the first light reflection layer 41.

In the light-emitting element of Example 15 of which a schematic partial cross-sectional view is illustrated in FIG. 25, the second light reflection layer 42 is fixed to the support substrate 49 constituted by a silicon semiconductor substrate through the joining layer 48 constituted by a gold (Au) layer or a solder layer including or tin (Sn) on the basis of a soldering method.

The light-emitting element of Example 15 can be manufactured by a method similar to the method of manufacturing the light-emitting element of Example 1 except that twenty layers of the light absorption material layers 71 are formed inside the first compound semiconductor layer 21 in combination, and the support substrate 49 is not removed.

The present disclosure has been described on the basis of desirable examples, but the present disclosure is not limited to the examples. The configurations and structures of the light-emitting elements described in the examples are illustrative only, and can be appropriately changed. In addition, the methods of manufacturing the light-emitting elements can also be appropriately changed. It is possible to employ a surface light-emitting laser element that emits light from a top surface of the second compound semiconductor layer through the second light reflection layer by appropriately selecting the joining layer or the support substrate.

Note that the present disclosure can employ the following configurations.

[A01]<<Light-Emitting Element>>

A light-emitting element including:

a laminated structure body which is formed from a GaN-based compound semiconductor and in which a first compound semiconductor layer including a first surface and a second surface that is opposed to the first surface, an active layer that faces the second surface of the first compound semiconductor layer, and a second compound semiconductor layer including a first surface that faces the active layer and a second surface that is opposed to the first surface are laminated;

a first light reflection layer that is provided on the first surface side of the first compound semiconductor layer; and a second light reflection layer that is provided on the second surface side of the second compound semiconductor layer, in which the first light reflection layer includes a concave mirror portion, and the second light reflection layer has a flat shape.

[A02] The light-emitting element according to [A01], in which when a resonator length is set as $L_{OR}$, a relationship of $1 \times 10^{-5}$ m $L_{OR}$ is satisfied.

[A03] The light-emitting element according to [A01] or [A02], in which when the first light reflection layer is cut out on a virtual plane including a lamination direction of the laminated structure body, a figure that is drawn by an interface, which faces the laminated structure body, of a part of the concave mirror portion of the first light reflection layer is a part of a circle or a part of a parabola.

[B01]<<Light-Emitting Element of Configuration 1>>

The light-emitting element according to any one of [A01] to [A03], in which a current injection region and a current non-injection region that surrounds the current injection region are provided in the second compound semiconductor layer, and a shortest distance $D_{CI}$ from an area central point of the current injection region to a boundary between the current injection region and the current non-injection region satisfies the following Expression, $$D_{CI} \geq \omega_0/2$$

provided that, $\omega_0^2 = (\lambda_0/\pi)\{L_{OR}(R_{DBR}-L_{OR})\}^{1/2}$ where $\lambda_0$ represents a wavelength of light that is mainly emitted from the light-emitting element, $L_{OR}$ represents a resonator length, and $R_{DBR}$ represents a radius of curvature of the concave mirror portion of the first light reflection layer.

[B02] The light-emitting element according to [B01], further including:

a mode loss operation portion that is provided on the second surface of the second compound semiconductor layer and constitutes a mode loss operation region that operates on an increase and a decrease of an oscillation mode loss;

a second electrode that is formed on the second surface of the second compound semiconductor layer and on the mode loss operation portion; and a first electrode that is electrically connected to the first compound semiconductor layer, in which the second light reflection layer is formed on the second electrode, a current injection region, a current non-injection/inner region that surrounds the current injection region, and a current non-injection/outer region that surrounds the current non-injection/inner region are formed in the laminated structure body, and an orthogonal projection image of the mode loss operation region and an orthogonal projection image of the current non-injection/outer region overlap each other.

[B03] The light-emitting element according to [B01] or [B02], in which a radius $r'_{DBR}$ of an effective region in the concave mirror portion of the first light reflection layer satisfies a relationship of $\omega_0 \leq r'_{DBR} \leq 20 \cdot \omega_0$.

[B04] The light-emitting element according to any one of [B01] to [B03], in which a relationship of $D_{CI} \geq \omega_0$ is satisfied.

[B05] The light-emitting element according to any one of [B01] to [B04], in which a relationship of $R_{DBR} \leq 1 \times 10^{-3}$ m is satisfied.

[C01] <<Light-Emitting Element of Configuration 2>>

The light-emitting element according to any one of [A01] to [A03], further including:

a mode loss operation portion that is provided on the second surface of the second compound semiconductor layer and constitutes a mode loss operation region that operates on an increase and a decrease of an oscillation mode loss;

a second electrode that is formed on the second surface of the second compound semiconductor layer and on the mode loss operation portion; and a first electrode that is electrically connected to the first compound semiconductor layer, in which the second light reflection layer is formed on the second electrode, a current injection region, a current non-injection/inner region that surrounds the current injection region, and a current non-injection/outer region that surrounds the current non-injection/inner region are formed in the laminated structure body, and an orthogonal projection image of the mode loss operation region and an orthogonal projection image of the current non-injection/outer region overlap each other.

[C02] The light-emitting element according to [C01], in which the current non-injection/outer region is located on a downward side of the mode loss operation region.

[C03] The light-emitting element according to [C01] or [C02], in which when an area of a projection image of the current injection region is set as Si, and an area of a projection image of the current non-injection/inner region is set as $S_2$, a relationship of $0.01 \leq S_1/(S_1+S_2) \leq 0.7$ is satisfied.

[C04] The light-emitting element according to any one of [C01] to [C03], in which the current non-injection/inner region and the current non-injection/outer region are formed by ion implantation into the laminated structure body.

[C05] The light-emitting element according to [C04], in which ion species include at least one kind of ion selected from the group consisting of boron, proton, phosphorus, arsenic, carbon, nitrogen, fluorine, oxygen, germanium, and silicon.

[C06] <<Light-Emitting Element of Configuration 2-B>>

The light-emitting element according to any one of [C01] to [C05], in which the current non-injection/inner region and the current non-injection/outer region are formed by plasma irradiation with respect to the second surface of the second compound semiconductor layer, an ashing treatment with respect to the second surface of the second compound semiconductor layer, or a reactive ion etching treatment with respect to the second surface of the second compound semiconductor layer.

[C07] <<Light-Emitting Element of Configuration 2-C>>

The light-emitting element according to any one of [C01] to [C06], in which the second light reflection layer includes a region that reflects or scatters light from the first light reflection layer toward an outer side of a resonator structure including the first light reflection layer and the second light reflection layer.

[C08] The light-emitting element according to any one of [C04] to [C07], in which when an optical distance from an active layer in the current injection region to the second surface of the second compound semiconductor layer is set as $L_2$, and an optical distance from an active layer in the mode loss operation region to a top surface of the mode loss operation portion is set as $L_0$, a relationship of $L_0 > L_2$ is satisfied.

[C09] The light-emitting element according to any one of [C04] to [C08], in which light having a higher-order mode that is generated is made to be dispersed toward the outer side of the resonator structure including the first light reflection layer and the second light reflection layer due to the mode loss operation region, and an oscillation mode loss increases.

[C10] The light-emitting element according to any one of [C04] to [C09], in which the mode loss operation portion is formed from a dielectric material, a metal material, or an alloy material.

[C11] The light-emitting element according to [C10], in which the mode loss operation portion is formed from the dielectric material, and an optical thickness of the mode loss operation portion is a value that deviates from an integral multiple of ¼ of a wavelength of light that is generated in the light-emitting element.

[C12] The light-emitting element according to [C10], in which the mode loss operation portion is formed from the dielectric material, and an optical thickness of the mode loss operation portion is an integral multiple of ¼ of a wavelength of light that is generated in the light-emitting element.

[C13] <<Light-Emitting Element of Configuration 2-D>>

The light-emitting element according to any one of [C01] to [C03], in which a convex portion is formed on the second surface side of the second compound semiconductor layer, and the mode loss operation portion is formed on a region of the second surface of the second compound semiconductor layer which surrounds a convex portion.

[C14] The light-emitting element according to [C13], in which when an optical distance from an active layer in the current injection region to the second surface of the second compound semiconductor layer is set as $L_2$, and an optical distance from an active layer in the mode loss operation region to a top surface of the mode loss operation portion is set as $L_0$, a relationship of $L_0 < L_2$ is satisfied.

[C15] The light-emitting element according to [C13] or [C14], in which light having a higher-order mode that is generated is trapped into the current injection region and the current non-injection/inner region by the mode loss operation region, and an oscillation mode loss decreases.

[C16] The light-emitting element according to any one of [C13] to [C15], in which the mode loss operation portion is formed from a dielectric material, a metal material, or an alloy material.

[C17] The light-emitting element according to any one of [C01] to [C16], in which the second electrode is formed from a transparent conductive material.

[D01]<<Light-Emitting Element of Configuration 3>>

The light-emitting element according to any one of [A01] to [A03], further including:

a second electrode that is formed on the second surface of the second compound semiconductor layer;

a second light reflection layer that is formed on the second electrode;

a mode loss operation portion that is provided on the first surface of the first compound semiconductor layer and constitutes a mode loss operation region that operates on an increase and a decrease of an oscillation mode loss; and a first electrode that is electrically connected to the first compound semiconductor layer, in which the first light reflection layer is formed on the first surface of the first compound semiconductor layer and on the mode loss operation portion, a current injection region, a current non-injection/inner region that surrounds the current injection region, and a current non-injection/outer region that surrounds the current non-injection/inner region are formed in the laminated structure body, and an orthogonal projection image of the mode loss operation region and an orthogonal projection image of the current non-injection/outer region overlap each other.

[D02] The light-emitting element according to [D01], in which when an area of a projection image of the current injection region is set as Si, and an area of a projection image of the current non-injection/inner region is set as $S_2$, a relationship of $0.01 \leq S_1'/(S_1'+S_2') \leq 0.7$ is satisfied.

[D03]<<Light-Emitting Element of Configuration 3-A>>

The light-emitting element according to [D01] or [D02], in which the current non-injection/inner region and the current non-injection/outer region are formed by ion implantation into the laminated structure body.

[D04] The light-emitting element according to [D03], in which ion species include at least one kind of ion selected from the group consisting of boron, proton, phosphorus, arsenic, carbon, nitrogen, fluorine, oxygen, germanium, and silicon.

[D05]<<Light-Emitting Element of Configuration 3-B>>

The light-emitting element according to any one of [D01] to [D04], in which the current non-injection/inner region and the current non-injection/outer region are formed by plasma irradiation with respect to the second surface of the second compound semiconductor layer, an ashing treatment with respect to the second surface of the second compound semiconductor layer, or a reactive ion etching treatment with respect to the second surface of the second compound semiconductor layer.

[D06]<<Light-Emitting Element of Configuration 3-C>>

The light-emitting element according to any one of [D01] to [D05], in which the second light reflection layer includes a region that reflects or scatters light from the first light reflection layer toward an outer side of a resonator structure including the first light reflection layer and the second light reflection layer.

[D07] The light-emitting element according to any one of [D03] to [D06], in which when an optical distance from an active layer in the current injection region to the first surface of the first compound semiconductor layer is set as $L_1'$, and an optical distance from an active layer in the mode loss operation region to a top surface of the mode loss operation portion is set as $L_0'$, a relationship of $L_0' > L_1'$ is satisfied.

[D08] The light-emitting element according to any one of [D03] to [D07], in which light having a higher-order mode that is generated is made to be dispersed toward the outer side of the resonator structure including the first light reflection layer and the second light reflection layer due to the mode loss operation region, and an oscillation mode loss increases.

[D09] The light-emitting element according to any one of [D03] to [D08], in which the mode loss operation portion is formed from a dielectric material, a metal material, or an alloy material.

[D10] The light-emitting element according to [D09], in which the mode loss operation portion is formed from the dielectric material, and an optical thickness of the mode loss operation portion is a value that deviates from an integral multiple of ¼ of a wavelength of light that is generated in the light-emitting element.

[D11] The light-emitting element according to [D09], in which the mode loss operation portion is formed from the dielectric material, and an optical thickness of the mode loss operation portion is an integral multiple of ¼ of a wavelength of a light that is generated in the light-emitting element.

[D12]<<Light-Emitting Element of Configuration 3-D>>

The light-emitting element according to [D01] or [D02], in which a convex portion is formed on the first surface side of the first compound semiconductor layer, the mode loss operation portion is formed on a region of the first surface of the first compound semiconductor layer which surrounds a convex portion.

[D13] The light-emitting element according to any one of [D12], in which when an optical distance from an active layer in the current injection region to the first surface of the first compound semiconductor layer is set as $L_1'$, and an optical distance from an active layer in the mode loss operation region to a top surface of the mode loss operation portion is set as $L_0'$, a relationship of $L_0' < L_1'$ is satisfied.

[D14] The light-emitting element according to any one of [D01] or [D02], in which a convex portion is formed on the first surface side of the first compound semiconductor layer, and the mode loss operation portion is constituted by a region of the first surface of the first compound semiconductor layer that surrounds the convex portion.

[D15] The light-emitting element according to any one of [D12] to [D14], in which light having a higher-order mode that is generated is trapped into the current injection region and the current non-injection/inner region by the mode loss operation region, and an oscillation mode loss decreases.

[D16] The light-emitting element according to any one of [D12] to [D15], in which the mode loss operation portion is formed from a dielectric material, a metal material, or an alloy material.

[D17] The light-emitting element according to any one of [D01] to [D16], in which
the second electrode is formed from a transparent conductive material.

[E01] <<Light-Emitting Element of Configuration 4>>
The light-emitting element according to any one of [A01] to [D17], in which
at least two layers of light absorption material layers are formed in the laminated structure body including a second electrode to be parallel to a virtual plane that is occupied by the active layer.

[E02] The light-emitting element according to [E01], in which
at least four layers of the light absorption material layers are formed.

[E03] The light-emitting element according to [E01] or [E02], in which
when an oscillation wavelength is set as $\lambda_0$, an equivalent refractive index of the entirety of two layers of the light absorption material layers, and a portion of the laminated structure body which is located between the light absorption material layers is set as $n_{eq}$, and a distance between the light absorption material layers is set as $L_{Abs}$, a relationship of $0.9 \times \{(m \cdot \lambda_0)/(2 \cdot n_{eq})\} \leq L_{Abs} \leq 1.1 \times (m \cdot \lambda_0)/(2 \cdot n_{eq})$ is satisfied,
provided that, m is 1 or an arbitrary integer of 2 or greater (including 1).

[E04] The light-emitting element according to any one of [E01] to [E03], in which
the thickness of the light absorption material layers is equal to or less than $\lambda_0/(4 \cdot n_{eq})$.

[E05] The light-emitting element according to any one of [E01] to [E04], in which
the light absorption material layers are located at a portion with the minimum amplitude that occurs in a standing wave of light which is formed inside the laminated structure body.

[E06] The light-emitting element according to any one of [E01] to [E05], in which
the active layer is located at a portion with the maximum amplitude that occurs in a standing wave of light which is formed inside the laminated structure body.

[E07] The light-emitting element according to any one of [E01] to [E06], in which
the light absorption material layers have a light absorption coefficient that is two or more times a light absorption coefficient of a compound semiconductor that constitutes the laminated structure body.

[E08] The light-emitting element according to any one of [E01] to [E07], in which
the light absorption material layers are constituted by at least one material selected from the group consisting of a compound semiconductor material having a bandgap narrower than a bandgap of a compound semiconductor that constitutes the laminated structure body, a compound semiconductor material doped with impurities, a transparent conductive material, and a light reflection layer constituent material having light absorption characteristics.

[F01] The light-emitting element according to any one of [A01] to [E08], in which
a compound semiconductor substrate is disposed between the first surface of the first compound semiconductor layer and the first light reflection layer.

[F02] The light-emitting element according to [F01], in which
the compound semiconductor substrate is constituted by a GaN substrate.

[F03] The light-emitting element according to [F01] or [F02], in which
the concave mirror portion of the first light reflection layer includes a base portion that is a protruding portion of the compound semiconductor substrate, and a multi-layer light reflection film that is formed on at least a partial surface of the base portion.

[F04] The light-emitting element according to [F01] or [F02], in which
the concave mirror portion of the first light reflection layer includes a base portion that is formed on the compound semiconductor substrate, and a multi-layer light reflection film that is formed on at least a partial surface of the base portion.

[F05] The light-emitting element according to any one of [A01] to [E08], in which
the first light reflection layer is formed on the first surface of the first compound semiconductor layer.

[F06] The light-emitting element according to any one of [A01] to [F05], in which
a value of heat conductivity of the laminated structure body is higher than a value of heat conductivity of the first light reflection layer.

[F07] The light-emitting element according to any one of [A01] to [F06], in which
when a radius of curvature of the concave mirror portion of the light-emitting element is set as $R_{DBR}$, a relationship of $R_{DBR} \leq 1 \times 10^{-3}$ m is satisfied.

[F08] The light-emitting element according to any one of [A01] to [F07], in which
a convex portion is formed at the periphery of the first light reflection layer, and the first light reflection layer does not protrude from the convex portion.

[G01] <<Method of Manufacturing Light-Emitting Element>>
A method of manufacturing a light-emitting element including the successive steps of:
forming a laminated structure body which is formed from a GaN-based compound semiconductor and in which a first compound semiconductor layer including a first surface and a second surface that is opposed to the first surface, an active layer that faces the second surface of the first compound semiconductor layer, and a second compound semiconductor layer including a first surface that faces the active layer and a second surface that is opposed to the first surface are laminated on a compound semiconductor substrate;
forming a second electrode and a second light reflection layer on the second compound semiconductor layer;
fixing the second light reflection layer to a support substrate;
thinning the compound semiconductor substrate;
forming a base portion that is a protruding portion in an exposed surface of the compound semiconductor substrate, or forming the base portion that is the protruding portion on the exposed surface of the compound semiconductor substrate; and
forming a first light reflection layer on at least a part of the base portion, and forming a first electrode that is electrically connected to the first compound semiconductor layer, in which
the base portion constitutes a concave mirror portion, and
the second light reflection layer has a flat shape.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST 11 compound semiconductor substrate (substrate for manufacturing light-emitting element)
11a first surface of compound semiconductor substrate (substrate for manufacturing light-emitting element) which faces first compound semiconductor layer
11a' protruding portion of first surface of compound semiconductor substrate
11a" recess
11b second surface of compound semiconductor substrate (substrate for manufacturing light-emitting element) which faces first compound semiconductor layer
11A convex portion
20 laminated structure body
21 first compound semiconductor layer
21a first surface of first compound semiconductor layer
21b second surface of first compound semiconductor layer
21d, 21e protruding portion of first surface of first compound semiconductor layer
22 second compound semiconductor layer
22a first surface of second compound semiconductor layer
22b second surface of second compound semiconductor layer
23 active layer (light-emitting layer)
31 first electrode
32 second electrode
33 pad electrode
34 insulating layer (current constriction layer)
34A opening provided in insulating layer (current constriction layer)
41 first light reflection layer
42 second light reflection layer
42A forward taper-shaped inclination portion formed in second light reflection layer
43 concave mirror portion
43A concave portion
43a interface that faces laminated structure body in effective region in concave mirror portion of first light reflection layer effective region in concave mirror portion of first light reflection layer
45A, 45B, 45D, 45E, 45F base portion
45c protruding portion
46 multi-layer light reflection film
47 planarization film
48 joining layer
49 support substrate
51, 61 current injection region
52, 62 current non-injection/inner region
53, 63 current non-injection/outer region
54, 64 mode loss operation portion (mode loss operation layer)
54A, 54B, 64A opening formed in mode loss operation portion
55, 65 mode loss operation region
71 light absorption material layer

The invention claimed is:

1. A light-emitting element, comprising:
a laminated structure body which is formed from a GaN-based compound semiconductor and in which a first compound semiconductor layer including a first surface and a second surface that is opposed to the first surface, an active layer that faces the second surface of the first compound semiconductor layer, and a second compound semiconductor layer including a first surface that faces the active layer and a second surface that is opposed to the first surface are laminated;
a first light reflection layer that is provided on the first surface side of the first compound semiconductor layer; and
a second light reflection layer that is provided on the second surface side of the second compound semiconductor layer, wherein
the first light reflection layer includes a concave mirror portion, and
the second light reflection layer has a flat shape,
a current injection region and a current non-injection region that surrounds the current injection region are provided in the second compound semiconductor layer, and
a shortest distance $D_{CI}$ from an area central point of the current injection region to a boundary between the current injection region and the current non-injection region satisfies the following Expression, $$D_{CI} \geq \omega_0/2$$

provided that, $$\omega_0^2 \equiv (\lambda_0/\pi)\{L_{OR}(R_{DBR}-L_{OR})\}^{1/2}$$

where $\lambda_0$ represents a wavelength of light that is mainly emitted from the light-emitting element, $L_{OR}$ represents a resonator length, and $R_{DBR}$ represents a radius of curvature of the concave mirror portion of the first light reflection layer.

2. The light-emitting element according to claim 1, wherein
when a resonator length is set as $L_{OR}$, a relationship of $1\times10^{-5}$ m $\leq L_{OR}$ is satisfied.

3. The light-emitting element according to claim 1, wherein
when the first light reflection layer is cut out on a virtual plane including a lamination direction of the laminated structure body, a figure that is drawn by an interface, which faces the laminated structure body, of a part of the concave mirror portion of the first light reflection layer is a part of a circle or a part of a parabola.

4. The light-emitting element according to claim 1, further comprising:
a mode loss operation portion that is provided on the second surface of the second compound semiconductor layer and constitutes a mode loss operation region that operates on an increase and a decrease of an oscillation mode loss;
a second electrode that is formed on the second surface of the second compound semiconductor layer and on the mode loss operation portion; and
a first electrode that is electrically connected to the first compound semiconductor layer, wherein
the second light reflection layer is formed on the second electrode,
a current injection region, a current non-injection/inner region that surrounds the current injection region, and a current non-injection/outer region that surrounds the current non-injection/inner region are formed in the laminated structure body, and
an orthogonal projection image of the mode loss operation region and an orthogonal projection image of the current non-injection/outer region overlap each other.

5. The light-emitting element according to claim 1, wherein
a radius r'DBR of an effective region in the concave mirror portion of the first light reflection layer satisfies a relationship of $\omega_0 \le r'_{DBR} \le 20 \cdot \omega_0$.

6. The light-emitting element according to claim 1, wherein
a relationship of $D_{CI} \ge \omega_0$ is satisfied.

7. The light-emitting element according to claim 1, wherein
a relationship of $R_{DBR} \le 1 \times 10^{-3}$ m is satisfied.

8. The light-emitting element according to claim 1, further comprising:
a mode loss operation portion that is provided on the second surface of the second compound semiconductor layer and constitutes a mode loss operation region that operates on an increase and a decrease of an oscillation mode loss;
a second electrode that is formed on the second surface of the second compound semiconductor layer and on the mode loss operation portion; and
a first electrode that is electrically connected to the first compound semiconductor layer, wherein
the second light reflection layer is formed on the second electrode,
a current injection region, a current non-injection/inner region that surrounds the current injection region, and a current non-injection/outer region that surrounds the current non-injection/inner region are formed in the laminated structure body, and
an orthogonal projection image of the mode loss operation region and an orthogonal projection image of the current non-injection/outer region overlap each other.

9. The light-emitting element according to claim 1, wherein
at least two layers of light absorption material layers are formed in the laminated structure body including a second electrode to be parallel to a virtual plane that is occupied by the active layer.

10. The light-emitting element according to claim 1, wherein
a compound semiconductor substrate is disposed between the first surface of the first compound semiconductor layer and the first light reflection layer.

11. The light-emitting element according to claim 10, wherein
the compound semiconductor substrate is constituted by a GaN substrate.

12. The light-emitting element according to claim 10, wherein
the concave mirror portion of the first light reflection layer includes a base portion that is a protruding portion of the compound semiconductor substrate, and a multi-layer light reflection film that is formed on at least a partial surface of the base portion.

13. The light-emitting element according to claim 10, wherein
the concave mirror portion of the first light reflection layer includes a base portion that is formed on the compound semiconductor substrate, and a multi-layer light reflection film that is formed on at least a partial surface of the base portion.

14. The light-emitting element according to claim 1, wherein
the first light reflection layer is formed on the first surface of the first compound semiconductor layer.

15. The light-emitting element according to claim 1, wherein
a value of heat conductivity of the laminated structure body is higher than a value of heat conductivity of the first light reflection layer.

16. The light-emitting element according to claim 1, wherein
when a radius of curvature of the concave mirror portion of the light-emitting element is set as $R_{DBR}$, a relationship of $R_{DBR} \le 1 \times 10^{-3}$ m is satisfied.

17. The light-emitting element according to claim 1, wherein
a convex portion is formed at the periphery of the first light reflection layer, and the first light reflection layer does not protrude from the convex portion.

18. A method of manufacturing a light-emitting element, comprising the successive steps of:
forming a laminated structure body which is formed from a GaN-based compound semiconductor and in which a first compound semiconductor layer including a first surface and a second surface that is opposed to the first surface, an active layer that faces the second surface of the first compound semiconductor layer, and a second compound semiconductor layer including a first surface that faces the active layer and a second surface that is opposed to the first surface are laminated on a compound semiconductor substrate;
forming a second electrode and a second light reflection layer on the second compound semiconductor layer;
fixing the second light reflection layer to a support substrate;
thinning the compound semiconductor substrate;
forming a base portion that is a protruding portion in an exposed surface of the compound semiconductor substrate, or forming the base portion that is the protruding portion on the exposed surface of the compound semiconductor substrate; and
forming a first light reflection layer on at least a part of the base portion, and forming a first electrode that is electrically connected to the first compound semiconductor layer, wherein
the base portion constitutes a concave mirror portion, and the second light reflection layer has a flat shape,
wherein a current injection region and a current non-injection region that surrounds the current injection region are provided in the second compound semiconductor layer, and
a shortest distance $D_{CI}$ from an area central point of the current injection region to a boundary between the current injection region and the current non-injection region satisfies the following Expression, $$D_{CI} \ge \omega_0/2$$

provided that, $$\omega_0^2 = (\lambda_0/\pi)\{L_{OR}(R_{DBR} - L_{OR})\}^{1/2}$$

where $\lambda_0$ represents a wavelength of light that is mainly emitted from the light-emitting element, $L_{OR}$ represents a resonator length, and $R_{DBR}$ represents a radius of curvature of the concave mirror portion.

* * * * *